(12) United States Patent
Masuda et al.

(10) Patent No.: US 11,031,429 B2
(45) Date of Patent: Jun. 8, 2021

(54) SEMICONDUCTOR DEVICE, SOLID-STATE IMAGE PICKUP ELEMENT, IMAGE PICKUP DEVICE, AND ELECTRONIC APPARATUS

(71) Applicant: SONY CORPORATION, Tokyo (JP)

(72) Inventors: Yoshiaki Masuda, Kanagawa (JP); Minoru Ishida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/854,565

(22) Filed: Apr. 21, 2020

(65) Prior Publication Data

US 2020/0251519 A1 Aug. 6, 2020

Related U.S. Application Data

(63) Continuation of application No. 16/085,962, filed as application No. PCT/JP2017/009874 on Mar. 13, 2017, now Pat. No. 10,680,026.

(30) Foreign Application Priority Data

Mar. 25, 2016 (JP) .................................. 2016-061634

(51) Int. Cl.
   *H01L 27/146* (2006.01)
   *H04N 5/369* (2011.01)
   (Continued)

(52) U.S. Cl.
   CPC .. *H01L 27/14634* (2013.01); *H01L 21/76898* (2013.01); *H01L 23/49816* (2013.01);
   (Continued)

(58) Field of Classification Search
   CPC ... H01L 2224/32225; H01L 2224/2919; H01L 2224/9211; H01L 2224/83;
   (Continued)

(56) References Cited

U.S. PATENT DOCUMENTS 5,019,201 A * 5/1991 Yabu ................... G02F 1/13452
                                                    156/273.9
5,065,006 A * 11/1991 Nakamura ........... G02B 6/4249
                                                    250/208.1
(Continued)

FOREIGN PATENT DOCUMENTS

CN    104051490    9/2014
JP    2004-063751  2/2004
(Continued)

OTHER PUBLICATIONS

Machine Translation of JP2004095269A (Matsuka), (Mar. 25, 2004). (Year: 2004).*

*Primary Examiner* — Caridad Everhart
(74) *Attorney, Agent, or Firm* — Sheridan Ross P.C.

(57) ABSTRACT

The present disclosure relates to a semiconductor device, a solid-state image pickup element, an image pickup device, and an electronic apparatus that are enabled to reduce restrictions on materials and restrictions on device configuration. A CSP imager and a mounting substrate are connected together with a connection portion other than a solder ball. With such a configuration, restrictions on materials and restrictions on device configuration are reduced, which has conventionally occurred because it is limited to a configuration in which solder balls are used for connection. The present disclosure can be applied to image pickup devices.

20 Claims, 58 Drawing Sheets

(51) Int. Cl.
*H04N 5/225* (2006.01)
*H01L 21/768* (2006.01)
*H01L 23/498* (2006.01)
*H01L 23/532* (2006.01)

(52) U.S. Cl.
CPC .. *H01L 23/53233* (2013.01); *H01L 23/53242* (2013.01); *H01L 23/53257* (2013.01); *H01L 27/1469* (2013.01); *H01L 27/14618* (2013.01); *H01L 27/14636* (2013.01); *H04N 5/2253* (2013.01); *H04N 5/369* (2013.01); *H01L 2224/48091* (2013.01); *H01L 2224/48464* (2013.01); *H01L 2224/73265* (2013.01)

(58) Field of Classification Search
CPC ... H01L 2224/1308; H01L 2224/93203; H01L 2224/91203; H01L 2224/83851; H01L 2924/0002; H01L 27/14634; H01L 27/14618; H01L 2224/48469; H01L 2224/73265; H04N 5/369; H04N 5/2253
See application file for complete search history.

(56) References Cited

U.S. PATENT DOCUMENTS

| | | | |
|---|---|---|---|
| 2001/0050721 A1 | 12/2001 | Miyake | |
| 2006/0046332 A1* | 3/2006 | Derderian | H01L 27/14618 438/28 |
| 2006/0086890 A1* | 4/2006 | Chao | H01L 27/14618 250/208.1 |
| 2008/0012084 A1* | 1/2008 | Kwon | H01L 27/14618 257/432 |
| 2008/0169349 A1 | 7/2008 | Suzuki et al. | |
| 2009/0020865 A1* | 1/2009 | Su | H01L 24/27 257/698 |
| 2010/0244172 A1 | 9/2010 | Borthakur et al. | |
| 2010/0246152 A1* | 9/2010 | Lin | H01L 24/92 361/783 |
| 2011/0063492 A1 | 3/2011 | Jung | |
| 2012/0223291 A1 | 9/2012 | Klem et al. | |
| 2012/0280374 A1* | 11/2012 | Choi | H01L 24/83 257/659 |
| 2013/0168791 A1 | 7/2013 | Oganesian | |
| 2013/0221470 A1* | 8/2013 | Kinsman | H01L 27/14618 257/434 |
| 2013/0294471 A1 | 11/2013 | Palaniswamy et al. | |
| 2013/0335940 A1* | 12/2013 | Matsui | H05K 1/111 361/783 |
| 2015/0305160 A1 | 10/2015 | Funahashi et al. | |
| 2016/0005781 A1 | 1/2016 | Lin et al. | |
| 2016/0260695 A1* | 9/2016 | Chung | H01L 25/18 |
| 2016/0343655 A1 | 11/2016 | Majeed et al. | |
| 2017/0092689 A1 | 3/2017 | Deng et al. | |
| 2017/0186798 A1 | 6/2017 | Yang et al. | |
| 2017/0301713 A1 | 10/2017 | Sekine | |

FOREIGN PATENT DOCUMENTS

| | | | |
|---|---|---|---|
| JP | 2004095269 A * | 3/2004 | H01B 1/00 |
| WO | WO 2012/165691 | 12/2012 | |

* cited by examiner

SEMICONDUCTOR DEVICE, SOLID-STATE IMAGE PICKUP ELEMENT, IMAGE PICKUP DEVICE, AND ELECTRONIC APPARATUS

CROSS REFERENCE TO RELATED APPLICATIONS

This application is a continuation of U.S. patent application Ser. No. 16/085,962 filed Sep. 17, 2018 which is a national stage application under 35 U.S.C. 371 and claims the benefit of PCT Application No. PCT/JP2017/009874 having an international filing date of Mar. 13, 2017, which designated the United States, which PCT application claimed the benefit of Japanese Patent Application No. 2016-061634 filed Mar. 25, 2016, the entire disclosures of each of which are incorporated herein by reference.

TECHNICAL FIELD

The present disclosure relates to a semiconductor device, a solid-state image pickup element, an image pickup device, and an electronic apparatus, and in particular, relates to a semiconductor device, a solid-state image pickup element, an image pickup device, and an electronic apparatus that are enabled to reduce restrictions on materials and restrictions on device configurations.

BACKGROUND ART

A solid-state image pickup device such as a complementary metal oxide semiconductor (CMOS) image sensor has been further downsized, for example, by a configuration devised in which a plurality of semiconductor substrates is layered (for example, see Patent Document 1).

CITATION LIST

Patent Document

Patent Document 1: Japanese Patent Application Laid-Open No. 2014-72294

SUMMARY OF THE INVENTION

Problems to be Solved by the Invention

As the solid-state image pickup device is further downsized, the area occupied by the terminal portion that takes out the output signal increases with respect to the plane size of the device, and downsizing becomes difficult.

The present disclosure has been made in view of such a situation, and is intended to enable further downsizing of the device size.

Solutions to Problems

An image pickup device of one aspect of present disclosure includes: a solid-state image pickup element that captures an image; and a mounting substrate on which the solid-state image pickup element is mounted, in which the solid-state image pickup element is mounted on the mounting substrate with a connection portion having a configuration that does not use a solder ball.

The connection portion can be a conductive pad, and the conductive pad can be provided on one or both of a bonding surface of the solid-state image pickup element to be bonded with the mounting substrate and a bonding surface of the mounting substrate to be bonded with the solid-state image pickup element.

The conductive pad can be heated and melted in a state of being provided on one or both of a bonding surface of the solid-state image pickup element to be bonded with the mounting substrate and a bonding surface of the mounting substrate to be bonded with the solid-state image pickup element, and then cooled to bond the solid-state image pickup element and the mounting substrate together.

The conductive pad can be one in which a single material film of any of Sn, Ag, Au, Sb, Cu, and Pb is formed in a plurality of layers, or one in which an alloy of at least two of the Sn, Ag, Au, Sb, Cu, and Pb is used.

The conductive pad can be formed by a sputtering method, a vapor deposition method, or a plating method.

The conductive pad can dissipate heat generated from the solid-state image pickup element and the mounting substrate depending on a bonding area of the bonding surfaces.

The connection portion can be a junction of a metal bump, and the metal bump can be provided on one or both of a bonding surface of the solid-state image pickup element to be bonded with the mounting substrate and a bonding surface of the mounting substrate to be bonded with the solid-state image pickup element.

The metal bump can be crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

The metal bump can be a single metal material of any of Au, Al, Cu, and Ag, or an alloy of at least two of the Au, Al, Cu, and Ag.

The connection portion can be a junction of a conductive resin, and the conductive resin can be provided on one or both of a bonding surface of the solid-state image pickup element to be bonded with the mounting substrate and a bonding surface of the mounting substrate to be bonded with the solid-state image pickup element.

The conductive resin can be crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

The conductive resin can be a mixture of a metal responsible for conductivity and a resin responsible for fixing.

The metal responsible for conductivity can be Ag, and the resin responsible for fixing can be an epoxy resin.

The connection portion can be a junction of an anisotropic conductive member, and the anisotropic conductive member can be provided on one or both of a bonding surface of the solid-state image pickup element to be bonded with the mounting substrate and a bonding surface of the mounting substrate to be bonded with the solid-state image pickup element.

The anisotropic conductive member can be crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

The anisotropic conductive member can be an anisotropic conductive film, or an anisotropic conductive paste.

The anisotropic conductive member can include a mixture of a conductive particle responsible for conductivity and an adhesive responsible for fixing.

The conductive particle can be a metal core including Ni simple substance and gold-plated Ni, or a gold-plated resin core including styrene, acrylic, and titanium oxide, and the adhesive can be a synthetic rubber, a thermoreversible resin, or a thermosetting resin including an epoxy resin.

The connection portion can be a wire bonding junction.

A wire bonding material in the wire bonding junction can be a single metal material of any of Au, Al, Cu, and Ag, or an alloy of the Au, Al, Cu, or Ag.

A part of the mounting substrate can be a transparent substrate, and in a state in which a light receiving surface of the solid-state image pickup element is in contact with the transparent substrate, the solid-state image pickup element can be mounted on the mounting substrate with the connection portion including the wire bonding junction.

A surface facing a light receiving direction of the mounting substrate and a light receiving surface of the solid-state image pickup element can be flat, and the solid-state image pickup element can be mounted on the mounting substrate with the connection portion including the wire bonding junction.

The solid-state image pickup element can be a CSP imager.

A solid-state image pickup device of one aspect of the present disclosure is a solid-state image pickup device that is mounted on a mounting substrate with a connection portion having a configuration that does not use a solder ball.

A semiconductor device of one aspect of the present disclosure is a semiconductor device that is mounted on a mounting substrate with a connection portion having a configuration that does not use a solder ball.

An electronic apparatus of one aspect of present disclosure includes: a solid-state image pickup element that captures an image; and a mounting substrate on which the solid-state image pickup element is mounted, in which the solid-state image pickup element is mounted on the mounting substrate with a connection portion having a configuration that does not use a solder ball.

According to one aspect of the present disclosure, the image is captured by the solid-state image pickup element, the solid-state image pickup element is mounted on the mounting substrate, and the solid-state image pickup element is mounted on the mounting substrate with the connection portion having a configuration that does not use the solder ball.

Effects of the Invention

According to one aspect of the present disclosure, it is possible to reduce restrictions on materials in the configuration of the image pickup device and restrictions in the device configuration.

MODE FOR CARRYING OUT THE INVENTION

Figure 1:
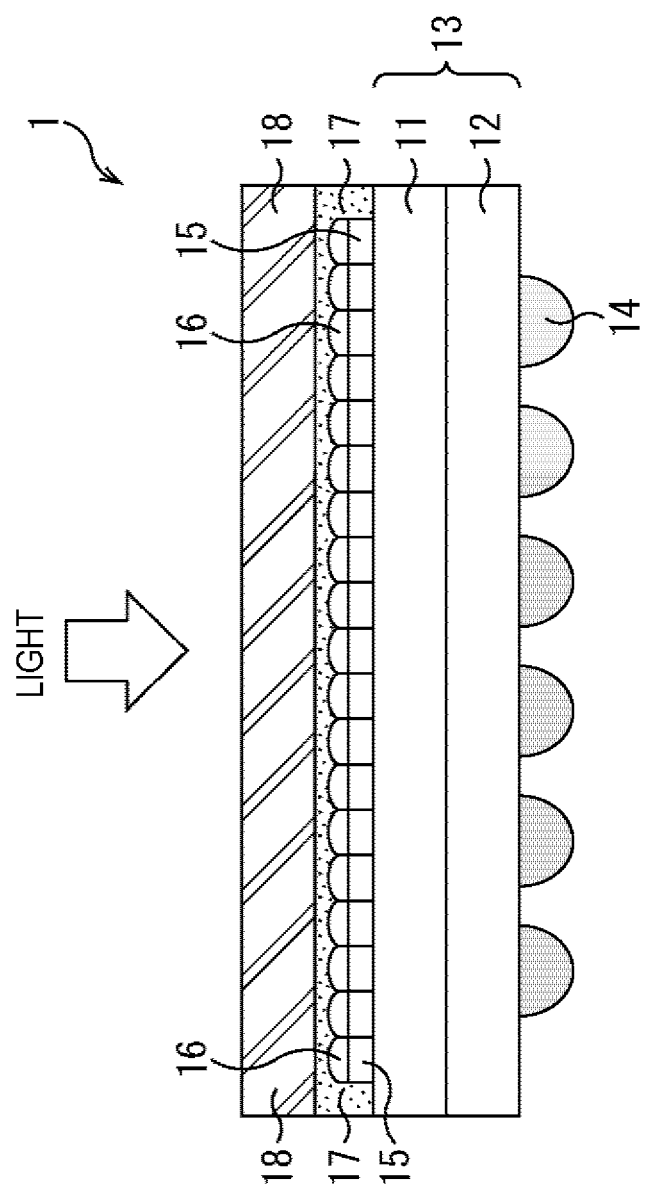
FIG. 1 is a diagram illustrating a schematic structure of a solid-state image pickup device adopting the present technology.

Preferred embodiments of the present disclosure will be described below in detail with reference to the accompanying drawings. Note that, in the present specification and the drawings, constituents having substantially the same functional configuration are denoted by the same reference signs, and redundant explanations are omitted.

Furthermore, description will be made in the following order.

1. Schematic structure of solid-state image pickup device
2. System configuration of solid-state image pickup device
3. Example circuit arrangement configuration of pixel
4. Example configuration of input circuit and output circuit
5. Example circuit arrangement configuration of solid-state image pickup device
6. Cross-sectional structure of solid-state image pickup device
7. Circuit arrangement of solid-state image pickup device in case where another upper and lower wiring lines connection structure is used
8. Comparative examples with other solid-state image pickup devices
9. Other example circuit arrangement configurations of solid-state image pickup device
10. Detailed structure of solid-state image pickup device
11. Manufacturing method
12. Further modifications
13. Application example to electronic apparatus
14. Usage examples of image sensor <1. Schematic Structure of Solid-State Image Pickup Device>

FIG. 1 illustrates a schematic structure of a solid-state image pickup device as a semiconductor device adopting the present technology.

A solid-state image pickup device 1 illustrated in FIG. 1 converts light or an electromagnetic wave incident on the device in an arrow direction in the figure into an electric signal. Hereinafter, in the present disclosure, for convenience, a device will be described that converts the light, as an object to be converted into the electric signal, into the electric signal, as an example.

The solid-state image pickup device 1 includes a layered structural body 13 in which a first structural body 11 and a second structural body 12 are layered, an external terminal 14, and a protective substrate 18 formed on the upper side of the first structural body 11. Note that, in the following, for convenience, in FIG. 1, a side of an incident surface where the light is incident on the device is set to the upper side, and a side of another surface facing the incident surface of the device is set to the lower side, and the first structural body 11 is referred to as an upper structural body 11, and the second structural body 12 is referred to as a lower structural body 12.

As described later, the solid-state image pickup device 1 is formed by pasting a semiconductor substrate (wafer) constituting a part of the upper structural body 11, a semiconductor substrate (wafer) constituting a part of the lower structural body 12, and the protective substrate 18 to each other at the wafer state, and then dividing them into solid pieces of a plurality of the solid-state image pickup devices 1.

The upper structural body 11 before being divided into the solid pieces is a semiconductor substrate (wafer) including a pixel for converting the incident light into the electric signal. The pixel includes, for example, a photodiode (PD) for photoelectric conversion and a plurality of pixel transistors that controls photoelectric conversion operation and reading operation of the photoelectrically converted electric signal. The upper structural body 11 included in the solid-state image pickup device 1 after being divided into the solid pieces may be referred to as an upper chip, an image sensor substrate, or an image sensor chip.

The pixel transistor included in the solid-state image pickup device 1 is desirably a MOS transistor, for example.

On the upper surface of the upper structural body 11, for example, a color filter 15 of red (R), green (G), or blue (B), and an on-chip lens 16 are formed. On the upper side of the on-chip lens 16, the protective substrate 18 is arranged for protecting structural objects of the solid-state image pickup device 1, particularly the on-chip lens 16 and the color filter 15. The protective substrate 18 is a transparent glass substrate, for example. If the hardness of the protective substrate 18 is higher than the hardness of the on-chip lens 16, the function of protecting the on-chip lens 16 is strengthened.

The lower structural body 12 before being divided into the solid pieces is a semiconductor substrate (wafer) that includes a semiconductor circuit including a transistor and a wiring line. The lower structural body 12 included in the solid-state image pickup device 1 after being divided into the solid pieces may be referred to as a lower chip, a signal processing substrate, or a signal processing chip. On the lower structural body 12, a plurality of the external terminals 14 is formed for electrically connecting to a wiring line (not illustrated) of the outside of the device. The external terminals 14 are solder balls, for example.

The solid-state image pickup device 1 has a cavity-less structure in which the protective substrate 18 is fixed to the upper side of the upper structural body 11 or the upper side of the on-chip lens 16 via the glass seal resin 17 arranged on the on-chip lens 16. Since the hardness of the glass seal resin 17 is lower than the hardness of the protective substrate 18, as compared with a case where no seal resin exists, the glass seal resin 17 can function to alleviate the stress applied to the protective substrate 18 from the outside of the solid-state image pickup device 1 to be transmitted to the inside of the device.

Note that, the solid-state image pickup device 1 may have a cavity structure, as a structure different from the cavity-less structure, in which a columnar or wall-like structure is formed on the upper surface of the upper structural body 11, and the protective substrate 18 is fixed to the columnar or wall-like structure to be supported with a gap above the on-chip lens 16.

<2. System Configuration of Solid-State Image Pickup Device>

Figure 2:
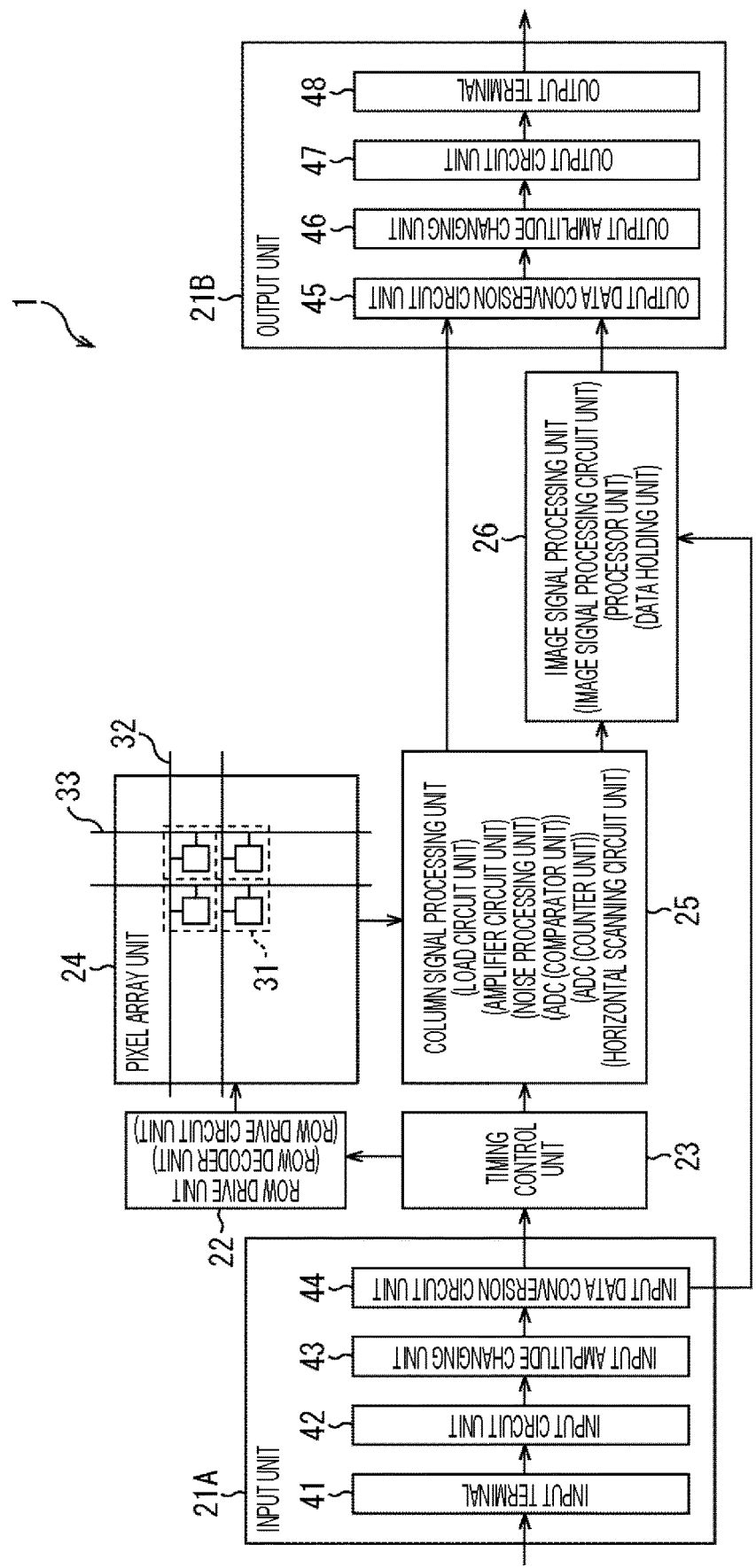
FIG. 2 is a block diagram illustrating an example system configuration of the solid-state image pickup device.

FIG. 2 is a block diagram illustrating an example system configuration of the solid-state image pickup device 1.

The solid-state image pickup device 1 of FIG. 2 includes a pixel array unit 24 in which a plurality of pixels 31 each having a photoelectric conversion unit (PD) is arranged in a row direction and a column direction.

The pixel array unit 24 includes a row drive signal line 32 for driving the pixels 31 for each row, and a vertical signal line (column reading line) 33 for reading signals generated as a result of photoelectric conversion from the plurality of pixels 31 driven for each row. As illustrated in FIG. 2, the plurality of pixels 31 arrayed in the row direction is connected to one row drive signal line 32. The plurality of pixels 31 arrayed in the column direction is connected to one vertical signal line 33.

The solid-state image pickup device 1 further includes a row drive unit 22 and a column signal processing unit 25.

The row drive unit 22 includes, for example, a row address control unit that determines a position of a row for driving pixels, in other words, a row decoder unit, and a row drive circuit unit that generates signals for driving the pixels 31.

The column signal processing unit 25 includes, for example, a load circuit unit connected to the vertical signal line 33 and forming a source follower circuit with each of the pixels 31. Furthermore, the column signal processing unit 25 may include an amplifier circuit unit that amplifies the signals read from the pixels 31 via the vertical signal line 33. Moreover, the column signal processing unit 25 may further include a noise processing unit for reducing a noise level of a system from the signals read from the pixels 31 as a result of photoelectric conversion.

The column signal processing unit 25 includes an analog-to-digital converter (ADC) for converting the signals read from the pixels 31 or analog signals subjected to the noise-processing into digital signals. The ADC includes a comparator unit for comparing an analog signal to be converted with a reference sweep signal to be compared with the analog signal, and a counter unit that measures time until a comparison result in the comparator unit is inverted. The column signal processing unit 25 may further include a horizontal scanning circuit unit that performs control of scanning a reading column.

The solid-state image pickup device 1 further includes a timing control unit 23. On the basis of a timing control signal or a reference clock signal input to the device, the timing control unit 23 supplies a signal for controlling timing to the row drive unit 22 and the column signal processing unit 25. Hereinafter, in the present disclosure, all or part of the row drive unit 22, the column signal processing unit 25, and the timing control unit 23 may be simply referred to as a pixel peripheral circuit unit, a peripheral circuit unit, or a control circuit unit.

The solid-state image pickup device 1 further includes an image signal processing unit 26. The image signal processing unit 26 is a circuit that performs various types of signal processing to the data obtained as a result of photoelectric conversion, in other words, data obtained as a result of image pickup operation in the solid-state image pickup device 1. The image signal processing unit 26 includes, for example, an image signal processing circuit unit, and a data holding unit. The image signal processing unit 26 may further include a processor unit.

An example of the signal processing executed in the image signal processing unit 26 is tone curve correction processing that gives more gradation in a case where image pickup data subjected to the AD conversion is data obtained by photographing a dark subject, and reduces the gradation in a case where the image pickup data is data obtained by photographing a bright subject. In this case, it is desirable to store characteristic data of a tone curve in advance in the data holding unit of the image signal processing unit 26, on what type of tone curve the gradation of the image pickup data is to be corrected.

The solid-state image pickup device 1 further includes an input unit 21A. The input unit 21A inputs, for example, the reference clock signal, the timing control signals such as a vertical synchronizing signal and a horizontal synchronizing signal, the characteristic data to be stored in the data holding unit of the image signal processing unit 26, and the like to the solid-state image pickup device 1 from the outside of the device. The input unit 21A includes an input terminal 41 that is the external terminal 14 for inputting the data to the solid-state image pickup device 1, and an input circuit unit 42 that takes a signal input to the input terminal 41 into the solid-state image pickup device 1.

The input unit 21A further includes an input amplitude changing unit 43 that changes the amplitude of the signal taken in by the input circuit unit 42 to an amplitude easy to use inside the solid-state image pickup device 1.

The input unit 21A further includes an input data conversion circuit unit 44 that changes arrangement of a data string of input data. The input data conversion circuit unit 44 is, for example, a serial-to-parallel conversion circuit that receives a serial signal as the input data and converts the signal into a parallel signal.

Note that, the input amplitude changing unit 43 and the input data conversion circuit unit 44 may be omitted.

In a case where the solid-state image pickup device 1 is connected to external memory devices such as a flash memory, SRAM, and DRAM, the input unit 21A can further include a memory interface circuit that receives data from these external memory devices.

The solid-state image pickup device 1 further includes an output unit 21B. The output unit 21B outputs image data photographed by the solid-state image pickup device 1, and image data subjected to the signal processing by the image signal processing unit 26, from the solid-state image pickup device 1 to the outside of the device. The output unit 21B includes an output terminal 48 that is the external terminal 14 for outputting the data from the solid-state image pickup device 1 to the outside of the device, and an output circuit unit 47 that is a circuit that outputs the data from the inside of the solid-state image pickup device 1 to the outside of the device, and is a circuit that drives an external wiring line connected to the output terminal 48 and is outside the solid-state image pickup device 1.

The output unit 21B further includes an output amplitude changing unit 46 that changes the amplitude of the signal used inside the solid-state image pickup device 1 to an amplitude that is easily used by an external device connected to the outside of the solid-state image pickup device 1.

The output unit 21B further includes an output data conversion circuit unit 45 that changes arrangement of a data string of output data. The output data conversion circuit unit 45 is, for example, a parallel-to-serial conversion circuit that converts a parallel signal used inside the solid-state image pickup device 1 into a serial signal.

The output data conversion circuit unit 45 and the output amplitude changing unit 46 may be omitted.

In a case where the solid-state image pickup device 1 is connected to external memory devices such as a flash memory, SRAM, and DRAM, the output unit 21B can further include a memory interface circuit that outputs data to these external memory devices.

Note that, in the present disclosure, for convenience, a circuit block including both or at least one of the input unit 21A and the output unit 21B may be referred to as an input/output unit 21. Furthermore, a circuit unit including both or at least one of the input circuit unit 42 and the output circuit unit 47 may be referred to as an input/output circuit unit 49.

<3. Example Circuit Arrangement Configuration of Pixel>

Figure 3:
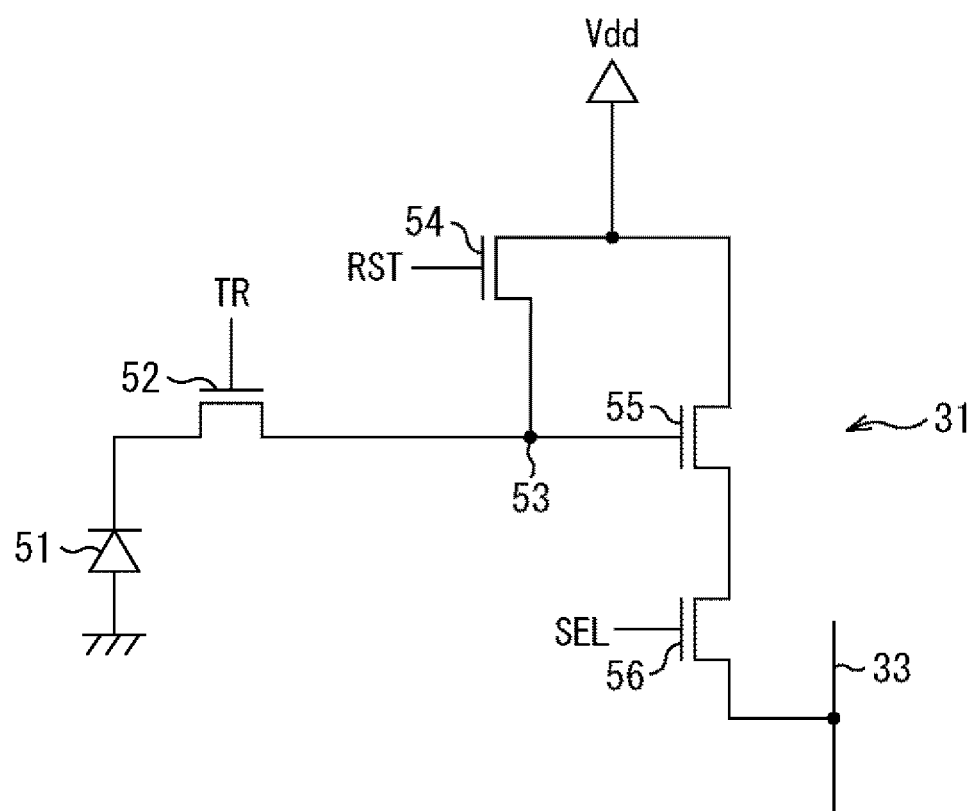
FIG. 3 is a diagram illustrating an example circuit arrangement configuration of a pixel.

FIG. 3 illustrates an example circuit arrangement configuration of a pixel 31 of the solid-state image pickup device 1 according to the present embodiment.

The pixel 31 includes a photodiode 51 as a photoelectric conversion element, a transfer transistor 52, a floating diffusion (FD) 53, a reset transistor 54, an amplifier transistor 55, and a selection transistor 56.

The photodiode 51 generates and accumulates a charge (signal charge) corresponding to the amount of light received. The anode terminal of the photodiode 51 is grounded, and the cathode terminal is connected to the FD 53 via the transfer transistor 52.

When turned on by a transfer signal TR, the transfer transistor 52 reads the charge generated by the photodiode 51 and transfers the charge to the FD 53.

The FD 53 holds the electric charge read from the photodiode 51. When turned on by a reset signal RST, the reset transistor 54 resets a potential of the FD 53 by discharging the charge accumulated in the FD 53 to the drain (constant voltage source Vdd).

The amplifier transistor 55 outputs a pixel signal corresponding to the potential of the FD 53. In other words, the amplifier transistor 55 constitutes a source follower circuit together with a load MOS (not illustrated) as a constant current source connected via the vertical signal line 33, and the pixel signal indicating a level corresponding to the charge accumulated in the FD 53 is output from the amplifier transistor 55 to the column signal processing unit 25 via the selection transistor 56 and the vertical signal line 33.

The selection transistor 56 is turned on when the pixel 31 is selected by a selection signal SEL, and outputs the pixel signal of the pixel 31 to the column signal processing unit 25 via the vertical signal line 33. Each of the signal lines through which the transfer signal TR, the selection signal SEL, and the reset signal RST are transmitted corresponds to the row drive signal line 32 of FIG. 2.

Although the pixel 31 can be configured as described above, it is not limited to this configuration, and other configurations can be adopted.

<4. Example Configuration of Input Circuit Unit and Output Circuit Unit>

Figure 4:
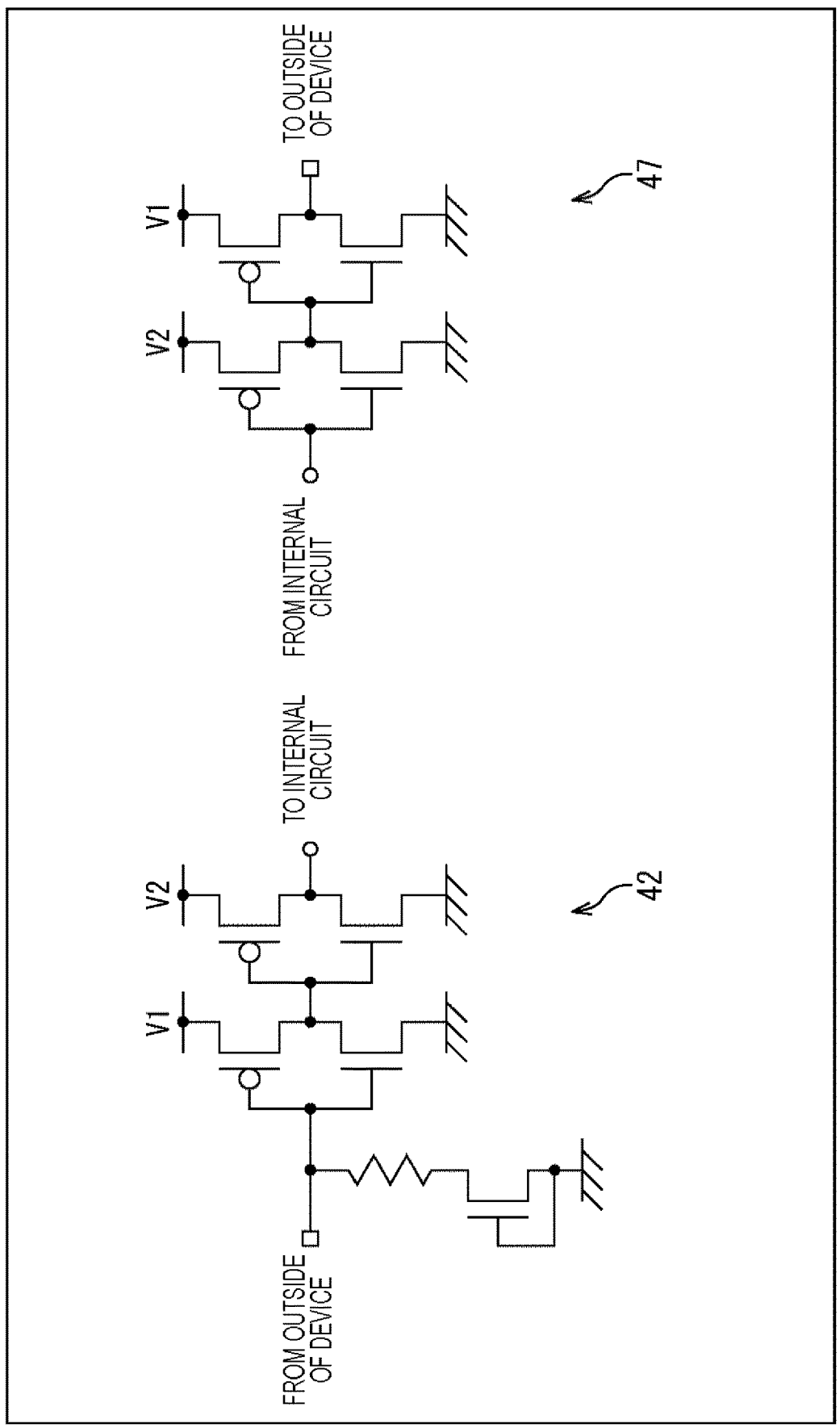
FIG. 4 is a diagram illustrating an example configuration of an input circuit unit and an output circuit unit.

FIG. 4 illustrates an example circuit arrangement configuration of the input circuit unit 42 included in the input unit 21A, and the output circuit unit 47 included in the output unit 21B of the solid-state image pickup device 1 according to the present embodiment.

Note that, for one external terminal 14, the input/output circuit unit 49 may include either the input circuit unit 42 or the output circuit unit 47, or may include a bidirectional input/output circuit including both the input circuit unit 42 and the output circuit unit 47 in parallel.

The input circuit unit 42 is a circuit having the following features.

(1) The input circuit unit 42 is a circuit in which logic is the same between the data input from the input terminal 41 of the solid-state image pickup device 1 to the input circuit unit 42 and the data output from the input circuit unit 42 to the internal circuit of the solid-state image pickup device 1, or the logic is only inverted, in other words, it is a circuit that does not change the arrangement of the data in the signal string, further in other words, it is a circuit that does not change a position at which "1" and "0" or "Hi" and "Low" of the logic are switched in the signal string.

(2) The input circuit unit 42 is a circuit that converts a voltage amplitude of a signal input to the input terminal 41 of the solid-state image pickup device 1 into a voltage amplitude suitable to be received by a circuit arranged at the subsequent stage of the input circuit unit 42, in other words, a circuit that is more internal in the solid-state image pickup device 1. This circuit may convert the data input to the circuit into the direction in which the voltage amplitude decreases.

(2)' Alternatively, the input circuit unit 42 is a circuit that converts a signal (for example, a small amplitude differential signal of LVDS) input to the input circuit unit 42 into a format or a voltage amplitude (for example, a single-end full swing digital signal) suitable to be received by the circuit arranged at the subsequent stage of the input circuit unit 42, in other words, the circuit that is more internal in the solid-state image pickup device 1, and outputs the converted signal. This circuit may convert the data input to the circuit into the direction in which the voltage amplitude increases.

(3) Moreover, in a case where excessive noise is input to the input circuit unit 42, a protective circuit may be included that blocks and does not propagate the noise to the circuit arranged at the subsequent stage of the input circuit unit 42, in other words, the circuit that is more internal in the solid-state image pickup device 1.

The output circuit unit 47 is a circuit having the following features.

(1) The output circuit unit 47 is a circuit in which logic is the same between the data input from the internal circuit of the solid-state image pickup device 1 to the output circuit unit 47 and the data output from the output circuit unit 47 to the outside of the solid-state image pickup device 1 via the output terminal 48 of the solid-state image pickup device 1, or the logic is only inverted, in other words, it is a circuit that does not change the arrangement of the data in the signal string, further in other words, it is a circuit that does not change a position at which "1" and "0" or "Hi" and "Low" of the logic are switched in the signal string.

(2) The output circuit unit 47 is a circuit that increases drive current capability of a signal line between the output terminal 48 of the solid-state image pickup device 1 and an external element connected to the solid-state image pickup device 1. Alternatively, it is a circuit for increasing the voltage amplitude of the signal line. This circuit may convert the data input to the circuit into the direction in which the voltage amplitude increases.

(2)' Alternatively, the output circuit unit 47 is a circuit that converts a signal (for example, a single-end full swing digital signal) input to the output circuit unit 47 from the internal circuit of the solid-state image pickup device 1 into a format or a voltage amplitude (for example, a small amplitude differential signal of LVDS) suitable to be received by the external element connected to the output terminal 48, and outputs the converted signal. This circuit may convert the data input to the circuit into the direction in which the voltage amplitude decreases.

As illustrated in FIG. 4, the input/output circuit unit 49 including at least either the input circuit unit 42 or the output circuit unit 47 includes one or more transistors. In the present disclosure, for convenience, a transistor included in the input/output circuit unit 49 may be referred to as an input/output transistor. The input/output circuit unit 49 may include an inverter circuit, a buffer circuit, or the like, or may further include an enable circuit that controls input operation or output operation.

The input circuit unit 42 or the output circuit unit 47 can also serve as the amplitude changing unit of the input signal or the output signal by appropriately setting the power supply voltage used in the circuit. For example, in a case where an amplitude of a signal in the image signal processing unit 26 and a part of the pixel peripheral circuit unit of the solid-state image pickup device 1 is V2, and an amplitude of a signal input from the outside of the solid-state image pickup device 1 to the input terminal 41 or an amplitude of a signal output from the output terminal 48 to the outside of the solid-state image pickup device 1 is V1 that is greater than V2, in the circuit of the input circuit unit 42 or the output circuit unit 47 illustrated in FIG. 4, for example, by setting the power supply voltage of the inverter positioned on the internal circuit side of the solid-state image pickup device 1 to V2 and the power supply voltage of the inverter positioned in the outside direction of the solid-state image pickup device 1 to V1, the input circuit unit 42 can receive the signal of the amplitude V1 from the outside, and reduce the amplitude to V2 to input the signal to the internal circuit of the solid-state image pickup device 1, and the output circuit unit 47 can receive the signal of the amplitude V2 from the internal circuit of the solid-state image pickup device 1, and increase the amplitude to V1 to output the signal to the outside. Note that, in a case where the voltages V1 and V2 illustrated in FIG. 4 are set to the same voltage, the configuration does not have the function of changing the signal amplitude.

Note that, including the above description, in the present disclosure, a voltage difference between a reference voltage (in the case of the circuit of FIG. 4, the ground voltage) in a transistor circuit and a voltage that is a voltage of the power supply supplied to the circuit and different from the reference voltage (in the case of the circuit of FIG. 4, for example, V1) may be simply referred to as a power supply voltage.

<5. Example Circuit Arrangement Configuration of Solid-State Image Pickup Device>

Next, description will be made for a circuit arrangement of the solid-state image pickup device 1 according to the present embodiment, in other words, how each block of the solid-state image pickup device 1 illustrated in FIG. 2 is divided and mounted into the upper structural body 11 and the lower structural body 12.

Figure 5:
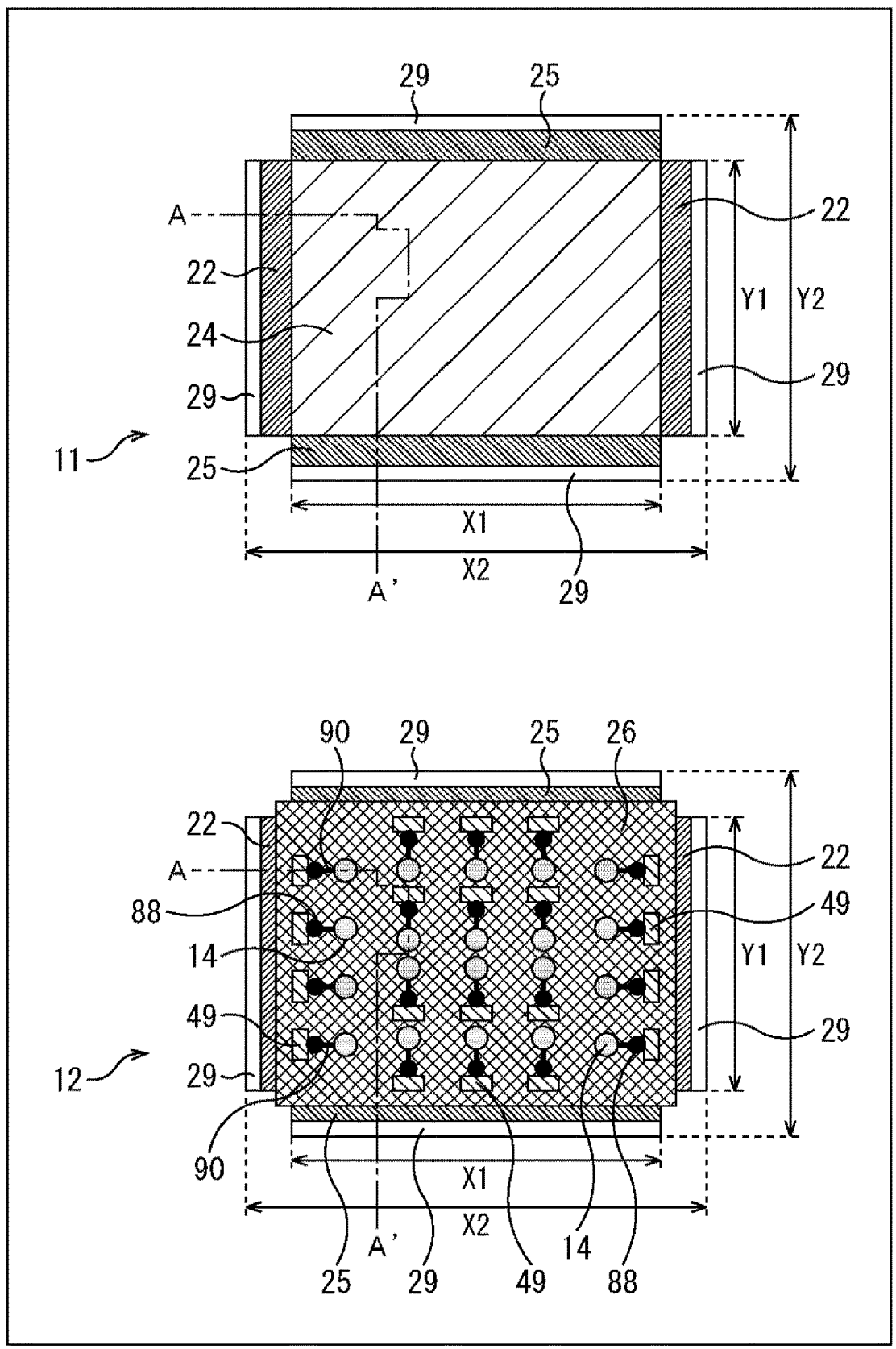
FIG. 5 is a diagram illustrating a first example circuit arrangement configuration of a circuit arrangement in the solid-state image pickup device.

FIG. 5 is a diagram illustrating a first example circuit arrangement configuration of the circuit arrangement in the solid-state image pickup device 1.

In the first example circuit arrangement configuration, the pixel array unit 24 is arranged in the upper structural body 11.

Among the pixel peripheral circuit units included in the solid-state image pickup device 1, a part of the row drive unit 22 is arranged in the upper structural body 11 and a part of the row drive unit 22 is arranged in the lower structural body 12. For example, in the row drive unit 22, the row drive circuit unit is arranged in the upper structural body 11, and the row decoder unit is arranged in the lower structural body 12.

The row drive unit 22 arranged in the upper structural body 11 is arranged outside the pixel array unit 24 in the row direction, and at least a part of the row drive unit 22 arranged in the lower structural body 12 is arranged on the lower side of the row drive unit 22 included in the upper structural body 11.

Among the pixel peripheral circuit units included in the solid-state image pickup device 1, a part of the column signal processing unit 25 is arranged in the upper structural body 11 and a part of the column signal processing unit 25 is arranged in the lower structural body 12. For example, in the column signal processing unit 25, the load circuit unit, the amplifier circuit unit, the noise processing unit, and the comparator unit of the ADC are arranged in the upper structural body 11, and the counter unit of the ADC is arranged in the lower structural body 12.

The column signal processing unit 25 arranged in the upper structural body 11 is arranged outside the pixel array unit 24 in the column direction, and at least a part of the column signal processing unit 25 arranged in the lower structural body 12 is arranged on the lower side of the column signal processing unit 25 included in the upper structural body 11.

Outside the row drive unit 22 arranged in the upper structural body 11, and outside the row drive unit 22 arranged in the lower structural body 12, a wiring connection unit 29 is arranged for connecting wiring lines of these two row drive units 22 together.

Also, outside the column signal processing unit 25 arranged in the upper structural body 11, and outside the column signal processing unit 25 arranged in the lower structural body 12, a wiring connection unit 29 is arranged for connecting wiring lines of these two column signal processing units 25 together. In these wiring connection units 29, a wiring connection structure is used that is described later with reference to FIG. 6.

The image signal processing unit 26 is arranged inside the row drive unit 22 and the column signal processing unit 25 arranged in the lower structural body 12.

In the lower structural body 12, the input/output circuit unit 49 is arranged in a region on the lower side of the pixel array unit 24 of the upper structural body 11.

The input/output circuit unit 49 is a circuit unit including both or at least one of the input circuit unit 42 and the output circuit unit 47. In a case where the input/output circuit unit 49 includes both the input circuit unit 42 and the output circuit unit 47, a plurality of the input/output circuit units 49 is divided for each one of the external terminals 14 and arranged in the lower structural body 12. In a case where the input/output circuit unit 49 includes only the input circuit unit 42, a plurality of the input circuit units 42 is divided for each one of the external terminals 14 (input terminals 41) and arranged in the lower structural body 12. In a case where the input/output circuit unit 49 includes only the output circuit unit 47, a plurality of the output circuit units 47 is divided for each one of the external terminals 14 (output terminal 48) and arranged in the lower structural body 12. The image signal processing unit 26 is arranged around each of the plurality of divided input/output circuit units 49. In other words, the input/output circuit unit 49 is arranged within a region where the image signal processing unit 26 is arranged.

Note that, in the lower structural body 12, the input/output circuit unit 49 may be arranged in a region on the lower side of the row drive unit 22 of the upper structural body 11 or a region on the lower side of the column signal processing unit 25.

In other words, the input/output circuit unit 49 can be arranged on the lower structural body 12 side where the external terminal 14 is formed and below a region of the pixel array unit 24 of the upper structural body 11, or in an arbitrary region below a pixel peripheral circuit unit of the upper structural body 11 (a circuit unit formed in the upper structural body 11 in a pixel peripheral circuit region 313 in FIG. 6).

Note that, including other example configurations described later, in the solid-state image pickup device 1 according to the present embodiment, in a region where the input terminal 41 and the input circuit unit 42 or the output circuit unit 47 and the output terminal 48 are arranged, a power supply terminal and a ground terminal may be arranged instead of these circuit units and terminals.

Among the transistor circuits arranged in the lower structural body 12, the power supply voltage of the transistor circuit constituting the input circuit unit 42 and the output circuit unit 47 may be higher than the power supply voltage of the transistor circuit constituting the image signal processing unit 26.

For example, the power supply voltage of the transistor circuit constituting the input circuit unit 42 and the output circuit unit 47 may be 1.8 V to 3.3 V, and the power supply voltage of the transistor circuit constituting the image signal processing unit 26 may be 1.2 V to 1.5 V. Since the power supply voltages of the former (transistor circuit constituting the input circuit unit 42 and the output circuit unit 47) and the latter (transistor circuit constituting the image signal processing unit 26) are different from each other, a distance for separately arranging a well region to which the power supply voltage is applied in the input circuit unit 42 and the output circuit unit 47, and a well region to which the power supply voltage is applied in the image signal processing unit 26 arranged around the input circuit unit 42 and the output circuit unit 47, that is, a so-called well separation region width is desirably greater than a distance provided between a plurality of the well regions to which the power supply voltage is applied in the image signal processing unit 26.

Furthermore, the depth of an element isolation region included in the input circuit unit 42 and the output circuit unit 47 may be deeper than the depth of an element isolation region included in the image signal processing unit 26. Furthermore, the gate length of the transistor included in the input circuit unit 42 and the output circuit unit 47 is desirably greater than the gate length of the transistor included in the image signal processing unit 26.

Among the pixel peripheral circuit units included in the solid-state image pickup device 1, the power supply voltage of the transistor circuit constituting a part of the pixel peripheral circuit unit arranged in the upper structural body 11, for example, any of the load circuit unit, the amplifier circuit unit, the noise processing unit, and the comparator unit of the ADC included in the column signal processing unit 25 may be higher than the power supply voltage of the transistor circuit constituting a part of the pixel peripheral circuit unit arranged in the lower structural body 12, for example, the counter unit of the ADC included in the column signal processing unit 25. As an example, the power supply voltage of the transistor circuit of the former (the pixel peripheral circuit unit arranged in the upper structural body 11, for example, any of the load circuit unit, the amplifier circuit unit, the noise processing unit, or the comparator unit of the ADC included in the column signal processing unit 25) may be 1.8 V to 3.3 V, and the power supply voltage of the transistor circuit of the latter (the pixel peripheral circuit unit arranged in the lower structural body 12, for example, the counter unit of the ADC) is 1.2 V to 1.5 V. The power supply voltage of the latter transistor circuit may be the same as the power supply voltage of the transistor circuit constituting the image signal processing unit 26 arranged in the lower structural body 12. Since the power supply voltage of the former transistor circuit is higher than the power supply voltage of the latter transistor circuit, the distance provided between the plurality of well regions to which the power supply voltage is applied in the former transistor circuit is desirably greater than the distance provided between the plurality of well regions to which the power supply voltage is applied in the latter transistor circuit. Furthermore, the depth of the element isolation region included in the former transistor circuit is desirably deeper than the depth of the element isolation region included in the latter transistor circuit. Furthermore, the gate length of the transistor included in the former transistor circuit is desirably greater than the gate length of the transistor included in the latter transistor circuit.

Moreover, the power supply voltage of the pixel transistor circuit constituting the pixel 31 arranged in the upper structural body 11 may be the same as the power supply voltage of the transistor circuit constituting the pixel peripheral circuit unit (for example, any of the load circuit unit, the amplifier circuit unit, the noise processing unit, or the comparator unit of the ADC included in the column signal processing unit 25) arranged in the upper structural body 11.

The power supply voltage of the pixel transistor circuit constituting the pixel 31 arranged in the upper structural body 11 may be higher than the power supply voltage of the transistor circuit constituting the image signal processing unit 26 or the pixel peripheral circuit unit (for example, the counter unit of the ADC) arranged in the lower structural body 12. Therefore, in a case where an element isolation region is used having a structure of digging the semiconductor substrate as the element isolation region, the depth of a part of the element isolation region included around the pixel transistor arranged in the upper structural body 11 may be deeper than the depth of the element isolation region included around the transistor of the image signal processing unit 26 or the pixel peripheral circuit unit arranged in the lower structural body 12. Alternatively, as the element isolation region around the pixel transistor, not the element isolation region digging the semiconductor substrate, but an element isolation region may be used forming an impurity region having a conductivity type opposite to that of the diffusion layer region of the pixel transistor, in a part around the pixel transistor.

Furthermore, the gate length of the pixel transistor arranged in the upper structural body 11 may be greater than the gate length of the transistor of the image signal processing unit 26 or the pixel peripheral circuit unit arranged in the lower structural body 12. On the other hand, in order to suppress occurrence of a noise charge in the vicinity of the element isolation region where there is a possibility of increase due to deepening of the element isolation region, the depth of the element isolation region included around the pixel transistor arranged in the upper structural body 11 may be shallower than the depth of the element isolation region included around the transistor constituting the pixel peripheral circuit unit arranged in the upper structural body 11. Alternatively, as the element isolation region around the pixel transistor, not the element isolation region digging the semiconductor substrate, but an element isolation region may be used forming an impurity region having a conductivity type opposite to that of the diffusion layer region of the pixel transistor, in a part around the pixel transistor.

<6. Cross-Sectional Structure of Solid-State Image Pickup Device>

The cross-sectional structure and circuit arrangement of the solid-state image pickup device 1 according to the present embodiment will be further described with reference to FIG. 6.

Figure 6:
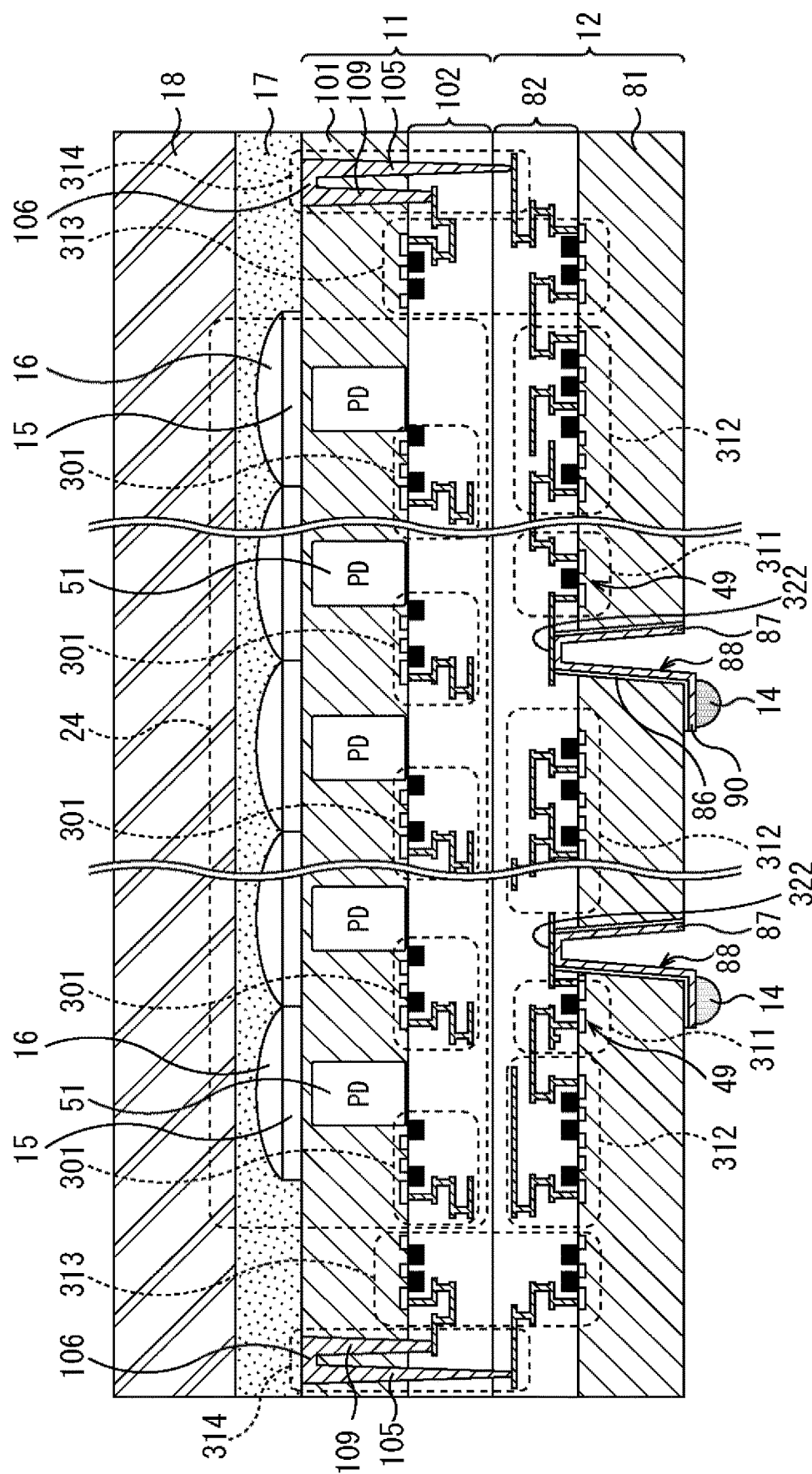
FIG. 6 is a diagram illustrating a cross-sectional structure taken along a line A-A' of FIG. 5.

FIG. 6 is a diagram illustrating a cross-sectional structure of the solid-state image pickup device 1 taken along a line A-A' of FIG. 5. Note that, for convenience, a part of FIG. 6 is illustrated by being changed to a cross-sectional structure in another example configuration of the present technology described later.

In a portion including the upper structural body 11 included in the solid-state image pickup device 1 and the above portion of the upper structural body 11, a pixel array unit 24 is arranged in which the plurality of pixels 31 is arrayed in an array, the pixels 31 each including the on-chip lens 16, the color filter 15, the pixel transistor, and the photodiode 51. In the region (pixel array region) of the pixel array unit 24, a pixel transistor region 301 is also arranged. The pixel transistor region 301 is a region where at least one of the transfer transistor 52, the amplifier transistor 55, and the reset transistor 54 is formed.

The plurality of external terminals 14 is arranged in a region positioned on the lower surface of a semiconductor substrate 81 included in the lower structural body 12 and below the pixel array unit 24 included in the upper structural body 11.

Note that, in the description of FIG. 6, the "region positioned on the lower surface of the semiconductor substrate 81 included in the lower structural body 12 and below the pixel array unit 24 included in the upper structural body 11" is referred to as a first specific region, and a "region positioned on the upper surface of the semiconductor substrate 81 included in the lower structural body 12 and below the pixel array unit 24 included in the upper structural body 11" is referred to as a second specific region.

At least a part of the plurality of external terminals 14 arranged in the first specific region is a signal input terminal 14A for inputting a signal from the outside to the solid-state image pickup device 1, or a signal output terminal 14B for outputting a signal from the solid-state image pickup device 1 to the outside. In other words, the signal input terminal 14A and the signal output terminal 14B are external terminals 14 excluding the power supply terminal and the ground terminal from the external terminals 14. In the present disclosure, the signal input terminal 14A or the signal output terminal 14B is referred to as a signal input/output terminal 14C.

A through-via 88 penetrating through the semiconductor substrate 81 is arranged in a region that is in the first specific region and in the vicinity of the signal input/output terminal 14C. Note that, in the present disclosure, a via hole penetrating through the semiconductor substrate 81 and a via wiring line formed inside the via hole may be collectively referred to simply as the through-via 88.

The through-via hole desirably has a structure formed by digging from the lower surface of the semiconductor substrate 81 to a conductive pad 322 that is a part of a multilayer wiring layer 82 arranged above the upper surface of the semiconductor substrate 81 and becomes an end (bottom) of the via hole (hereinafter referred to as a via pad 322).

The signal input/output terminal 14C arranged in the first specific region is electrically connected to the through-via 88 (more specifically, to the via wiring line formed in the through-via hole) also arranged in the first specific region.

In a region that is in the second specific region and in the vicinity of the signal input/output terminal 14C and the through-via, the input/output circuit unit 49 is arranged including the input circuit unit 42 or the output circuit unit 47.

The signal input/output terminal 14C arranged in the first specific region is electrically connected to the input/output circuit unit 49 via the through-via 88 and the via pad 322, or a part of the multilayer wiring layer 82.

A region where the input/output circuit unit 49 is arranged is referred to as an input/output circuit region 311. On the upper surface of the semiconductor substrate 81 included in the lower structural body 12, a signal processing circuit region 312 is formed adjacent to the input/output circuit region 311. The signal processing circuit region 312 is a region where the image signal processing unit 26 is formed described with reference to FIG. 2.

A region where the pixel peripheral circuit unit is arranged including all or part of the column signal processing unit 25 and the row drive unit 22 described with reference to FIG. 2, is referred to as the pixel peripheral circuit region 313. In the lower surface of a semiconductor substrate 101 included in the upper structural body 11 and the upper surface of the semiconductor substrate 81 included in the lower structural body 12, in a region on the outside of the pixel array unit 24, the pixel peripheral circuit region 313 is arranged.

The signal input/output terminal 14C may be arranged in a region on the lower side of the input/output circuit region 311 arranged in the lower structural body 12, or may be arranged in a region on the lower side of the signal processing circuit region 312. Alternatively, the signal input/output terminal 14C may be arranged on the lower side of the pixel peripheral circuit unit such as the row drive unit 22 or the column signal processing unit 25 arranged in the lower structural body 12.

In the present disclosure, a wiring connection structure that connects a wiring line included in a multilayer wiring layer 102 of the upper structural body 11 and a wiring line included in the multilayer wiring layer 82 of the lower structural body 12 together may be referred to as an upper and lower wiring lines connection structure, and a region where the structure is arranged is referred to as an upper and lower wiring lines connection region 314.

The upper and lower wiring lines connection structure includes a first through-electrode (through-silicon-electrode) 109 penetrating through the semiconductor substrate 101 from the upper surface of the upper structural body 11 to the multilayer wiring layer 102, a second through-electrode (through-chip-electrode) 105 penetrating through the semiconductor substrate 101 and the multilayer wiring layer 102 from the upper surface of the upper structural body 11 to the multilayer wiring layer 82 of the lower structural body 12, and a through-electrode connection wiring line 106 for connecting these two through-electrodes (through silicon via, TSV) together. In the present disclosure, such an upper and lower wiring lines connection structure may be referred to as a twin contact structure.

The upper and lower wiring lines connection region 314 is arranged outside the pixel peripheral circuit region 313.

In the present embodiment, the pixel peripheral circuit region 313 is formed in both the upper structural body 11 and the lower structural body 12, but the pixel peripheral circuit region 313 may be formed only in one of the upper structural body 11 and the lower structural body 12.

Furthermore, in the present embodiment, the upper and lower wiring lines connection region 314 is arranged in a region that is outside the pixel array unit 24 and outside the pixel peripheral circuit region 313, but the upper and lower wiring lines connection region 314 may be arranged in a region that is outside the pixel array unit 24 and inside the pixel peripheral circuit region 313.

Moreover, in the present embodiment, as the structure that electrically connects the multilayer wiring layer 102 of the upper structural body 11 and the multilayer wiring layer 82 of the lower structural body 12 together, the twin contact structure is adopted that performs connection using two through-electrodes of the through-silicon-electrode 109 and the through-chip-electrodes 105.

As the structure that electrically connects the multilayer wiring layer 102 of the upper structural body 11 and the multilayer wiring layer 82 of the lower structural body 12 together, for example, a share contact structure may be used in which a wiring layer 103 of the upper structural body 11 and a wiring layer 83 of the lower structural body 12 are each commonly connected to one through-electrode.

<7. Circuit Arrangement of Solid-State Image Pickup Device in Case where Another Upper and Lower Wiring Lines Connection Structure is Used>

A circuit arrangement and a cross-sectional structure of the solid-state image pickup device 1 will be described in a case where another upper and lower wiring lines connection structure is used, with reference to FIGS. 7 and 8.

Figure 7:
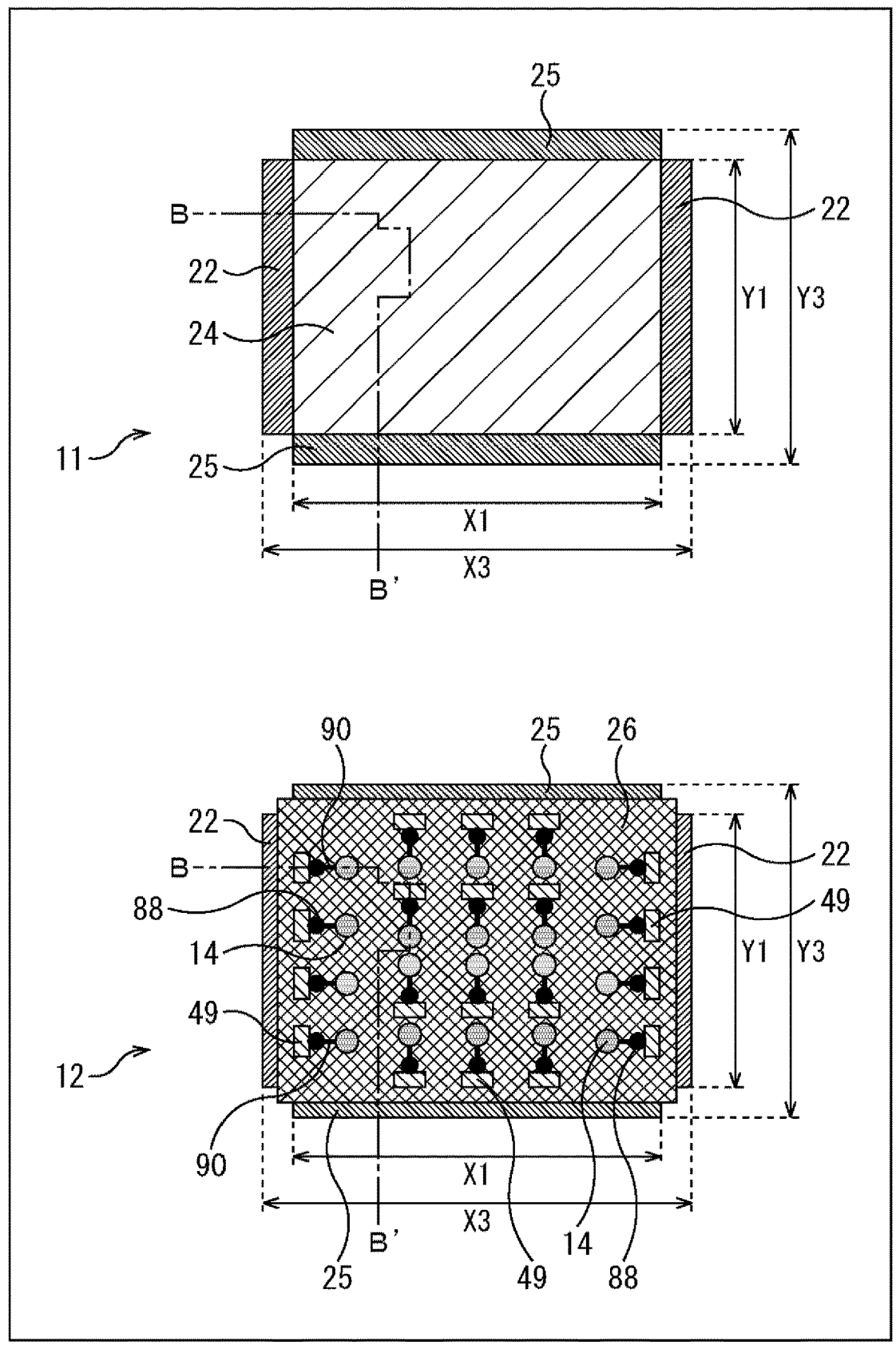
FIG. 7 is a diagram illustrating a second example circuit arrangement configuration of the circuit arrangement in the solid-state image pickup device.
Figure 8:
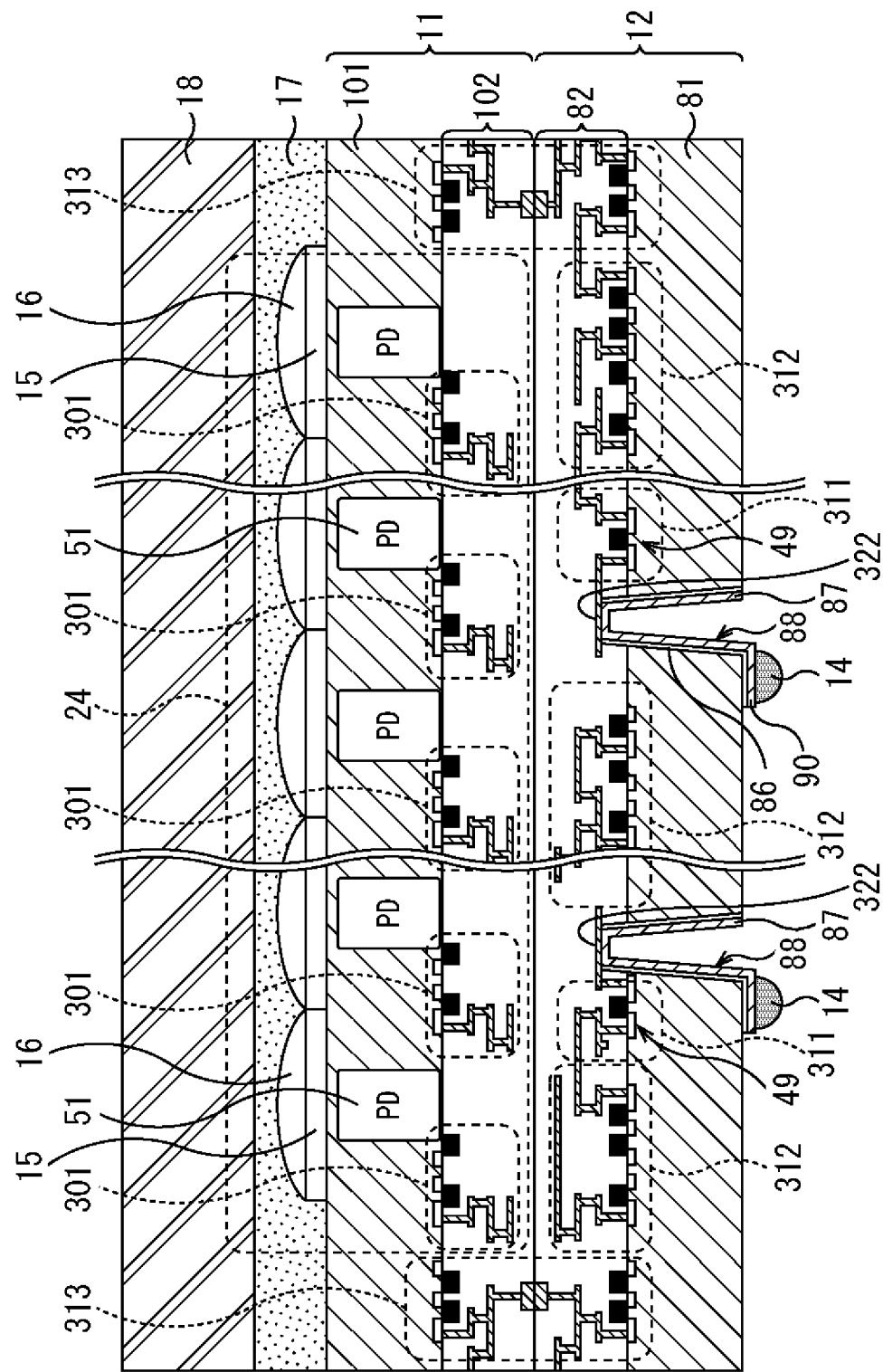
FIG. 8 is a diagram illustrating a cross-sectional structure taken along a line B-B' of FIG. 7.

FIG. 8 is a diagram illustrating a cross-sectional structure of the solid-state image pickup device 1 taken along a line B-B' of FIG. 7 in a case where a structure is used different from the upper and lower wiring lines connection structure illustrated in FIG. 6. Note that, for convenience, a part of FIG. 8 is illustrated by being changed to a cross-sectional structure in another example configuration of the present technology described later.

In the pixel peripheral circuit region 313 of FIG. 8, some of wiring lines of the multilayer wiring layer 102 of the upper structural body 11 are arranged on the lowermost surface of the multilayer wiring layer 102, in other words, on a bonding surface between the upper structural body 11 and the lower structural body 12. Furthermore, also some of wiring lines of the multilayer wiring layer 82 of the lower structural body 12 are arranged on the uppermost surface of the multilayer wiring layer 82, in other words, on the bonding surface between the upper structural body 11 and the lower structural body 12. Then, the some of wiring lines of the multilayer wiring layer 102 and the some of wiring lines of the multilayer wiring layer 82 are arranged at substantially the same position on the bonding surface, and the wiring lines are electrically connected to each other. As a form of electrically connecting the wiring lines, a form may be used in which two wiring lines are directly brought into contact with each other, or a form may be used in which a thin insulating film or a high resistance film is formed between two wiring lines, and a part of the formed film is electrically conducting partially. Alternatively, a form may be used in which a thin insulating film or a high resistance film is formed between two wiring lines, and the two wiring lines propagate an electric signal by capacitive coupling.

In the present disclosure, as a generic name of the structure in which the some of wiring lines of the multilayer wiring layer 102 of the upper structural body 11 and the some of wiring lines of the multilayer wiring layer 82 of the lower structural body 12 are formed at substantially the same position on the bonding surface and the two wiring lines are electrically connected together, the structure may be referred to as an upper and lower wiring lines direct connection structure or simply as a wiring lines direct connection structure.

As a specific example of substantially the same position, for example, a position may be used where the two wiring lines to be electrically connected together overlap each other at least in a part thereof in a case where the solid-state image pickup device 1 is viewed from the upper side to the lower side in a plan view. In a case where, for example, copper (Cu) is used as a material of the two wiring lines to be connected together, the connection structure may be referred to as a Cu—Cu direct bonding structure or simply as a Cu—Cu bonding structure.

In a case where the upper and lower wiring lines direct connection structure is used, the connection structure can be arranged outside the pixel array unit 24. Alternatively, the connection structure can be arranged inside the pixel peripheral circuit region 313 included in the upper structural body 11, and inside the pixel peripheral circuit region 313 included in the lower structural body 12. More specifically, among the wiring lines constituting the upper and lower wiring lines direct connection structure, the wiring line to be arranged on the side of the upper structural body 11 of the bonding surface can be arranged on the lower side of the circuit included in the pixel peripheral circuit region 313 of the upper structural body 11. Furthermore, among the wiring lines constituting the upper and lower wiring lines direct connection structure, the wiring line to be arranged on the side of the lower structural body 12 of the bonding surface can be arranged on the upper side of the circuit included in the pixel peripheral circuit region 313 of the lower structural body 12. Alternatively, by using the wiring line arranged in the pixel array unit 24 (pixel transistor region 301) as the wiring line of the upper structural body 11, the upper and lower wiring lines direct connection structure by the wiring line arranged in the pixel array unit 24 and the wiring line of the lower structural body 12 can be arranged below the pixel array unit 24 (pixel transistor region 301).

<Second Example Circuit Arrangement Configuration>

FIG. 7 is a diagram illustrating a second example circuit arrangement configuration of the solid-state image pickup device 1.

In the second example circuit arrangement configuration, the upper and lower wiring lines direct connection structure is used as the upper and lower wiring lines connection structure.

As illustrated in FIG. 7, the arrangement of the pixel array unit 24 in the second example circuit arrangement configuration is similar to the first example circuit arrangement configuration illustrated in FIG. 5. In other words, the pixel array unit 24 is arranged in the upper structural body 11.

Furthermore, as illustrated in FIG. 7, the arrangement of the row drive unit 22 and the column signal processing unit 25 of the solid-state image pickup device 1 in the second example circuit arrangement configuration is also similar to the arrangement of the first example circuit arrangement configuration illustrated in FIG. 5.

On the other hand, the arrangement of an upper and lower wiring lines connection portion in the second example circuit arrangement configuration is different from the arrangement of the first example circuit arrangement configuration illustrated in FIG. 5.

The connection between the wiring line of the row drive unit 22 arranged in the upper structural body 11 and the wiring line of the row drive unit 22 arranged in the lower structural body 12 is formed in a region where the row drive unit 22 arranged in the upper structural body 11 and the row drive unit 22 arranged in the lower structural body 12 overlap each other, by using the upper and lower wiring lines direct connection structure.

The connection between the wiring line of the column signal processing unit 25 arranged in the upper structural body 11 and the wiring line of the column signal processing unit 25 arranged in the lower structural body 12 is formed in a region where the column signal processing unit 25 arranged in the upper structural body 11 and the column signal processing unit 25 arranged in the lower structural body 12 overlap each other, by using the upper and lower wiring lines direct connection structure.

In the first example circuit arrangement configuration illustrated in FIG. 5, the upper and lower wiring lines connection structure for connection of the wiring lines of the row drive unit 22 and the upper and lower wiring lines connection structure for connection of the wiring lines of the column signal processing unit 25 are arranged in the wiring connection units 29 outside the row drive unit 22 and outside the column signal processing unit 25, respectively. On the other hand, in the second example circuit arrangement configuration illustrated in FIG. 7, the upper and lower wiring lines connection structure for connection of the wiring lines of the row drive unit 22 and the upper and lower wiring lines connection structure for connection of the wiring lines of the column signal processing unit 25 are formed within the region of the row drive unit 22 and within the region of the column signal processing unit 25, respectively. Therefore, in the solid-state image pickup device 1 described in the second example circuit arrangement configuration, the wiring connection unit 29 is omitted in the upper structural body 11 and the lower structural body 12, and a device can be implemented having a smaller external size than the solid-state image pickup device 1 described in the first example circuit arrangement configuration.

<8. Comparative Examples with Other Solid-State Image Pickup Devices>

Comparative Example 1

Features of the structure of the solid-state image pickup device 1 will be described as compared with the structure of another solid-state image pickup device.

Figure 9:
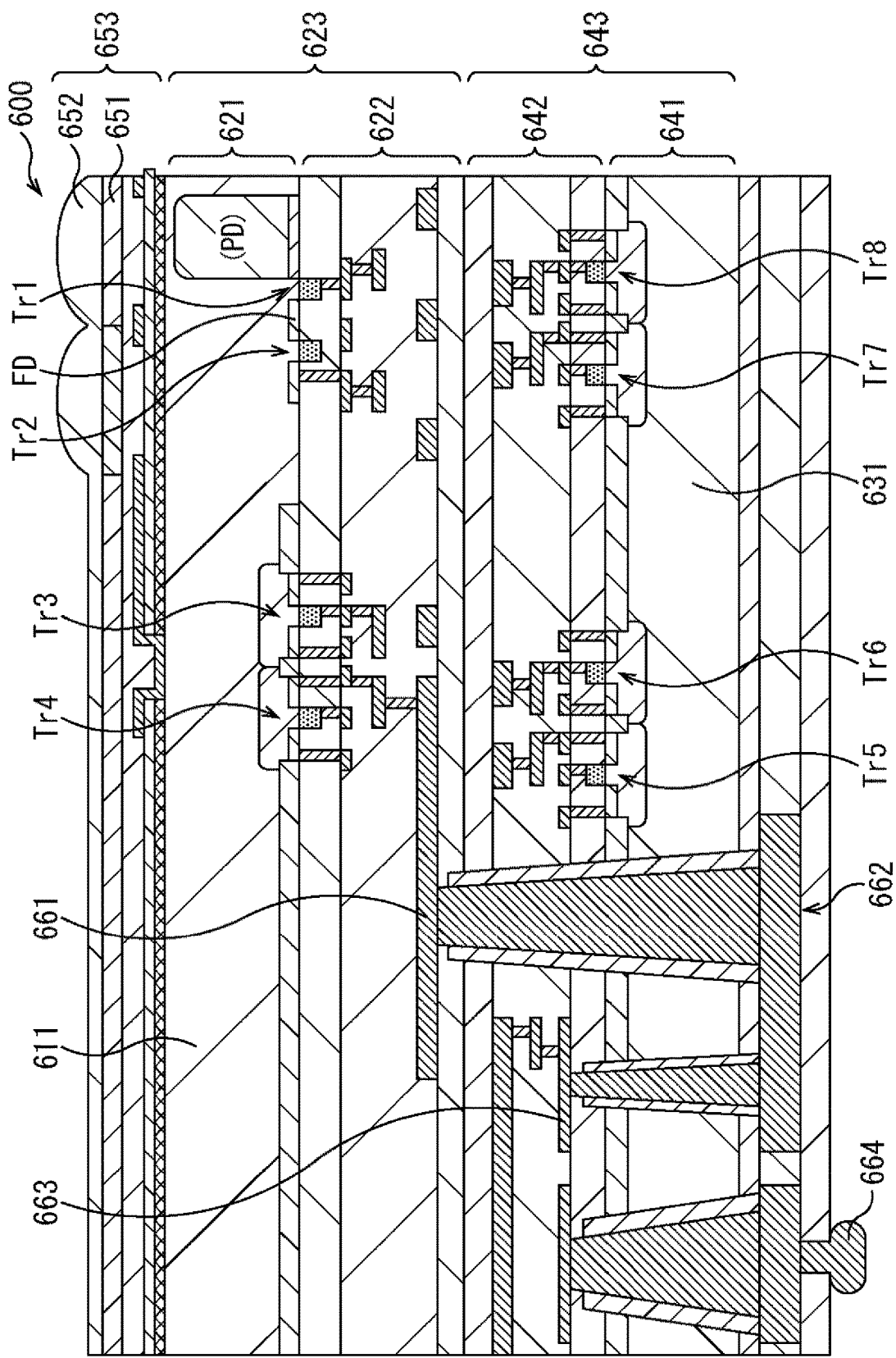
FIG. 9 is a diagram illustrating a cross section in a final shape of a solid-state image pickup device as Comparative Example 1.

FIG. 9 is a diagram illustrating a cross section in a final shape of a solid-state image pickup device disclosed in Japanese Patent Application Laid-open No. 2014-72294 (hereinafter referred to as Comparative Structure Disclosure Document 1) as Comparative Example 1.

A solid-state image pickup device 600 of FIG. 9 has a structure in which a first portion 623 and a second portion 643 are layered, the first portion 623 including a first wiring portion 622 and a first element portion 621 including a first semiconductor layer 611, the second portion 643 including a second wiring portion 642 and a second element portion 641 including a second semiconductor layer 631. On the back surface side of the first portion 623, an optical member 653 is arranged including a color filter 651, an on-chip lens 652, and the like.

The solid-state image pickup device 600 has a structure that connects a first wiring line 661 and a second wiring line 663 together via a conductive member 662, outside transistors Tr 3 and Tr 4 constituting a control unit, and outside a region where transistors Tr 5 to Tr 8 constituting a signal processing unit are arranged, and an external terminal 664 is arranged outside this connection structure. Note that, there is no description of where the input/output circuit is arranged.

On the other hand, the present technology has a structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller than the solid-state image pickup device 600 of FIG. 9.

The solid-state image pickup device 600 of FIG. 9 does not include a protective substrate for protecting the on-chip lens 652 on the upper side of the on-chip lens 652 in its final shape. Then, in Comparative Structure Disclosure Document 1, as a method of manufacturing the solid-state image pickup device 600 of FIG. 9, it is described that the first portion 623 and the second portion 643 are bonded, the color filter 651 and the on-chip lens 652 are formed, and thereafter the substrate is inverted, and then an opening exposing an electrode unit and the external terminal 664 are formed. When forming the external terminal 664, it is necessary to crimp the external terminal 664 onto a metal wiring line by applying a stress of greater than or equal to a specific value. In the solid-state image pickup device 600 including no protective substrate on the on-chip lens 652, if the external terminal 664 is formed by the above manufacturing method, when the external terminal 664 is crimped, the on-chip lens 652 is pressed against the manufacturing apparatus, and the on-chip lens 652 may be scratched.

Moreover, in the solid-state image pickup device 600 of FIG. 9, the external terminal 664 is formed in a region outside a pixel array unit, and is not formed immediately below the on-chip lens 652. In this case, force applied to the on-chip lens 652 when the external terminal 664 is crimped becomes force obtained by diagonally dispersing force applied to crimp the external terminal 664.

Provisionally, in a case where the external terminal 664 is formed immediately below a pixel region, that is, immediately below the on-chip lens 652 in order to implement a solid-state image pickup device having a small external size, the on-chip lens 652 exists on an extended line of a direction of the force applied to crimp the external terminal 664, so that the force applied to the on-chip lens 652 becomes greater, and the occurrence of scratches on the on-chip lens 652 may become more serious.

Furthermore, in Comparative Structure Disclosure Document 1, a manufacturing method is also disclosed of forming the color filter 651 and the on-chip lens 652 after forming the external terminal 664.

However, in the case of the manufacturing method, in a state in which a number of protrusions by the external terminals 664 are included on the surface of the solid-state image pickup device, when the color filter 651 and the on-chip lens 652 are formed, it may be difficult to fix the solid-state image pickup device to the manufacturing apparatus with a general method such as a vacuum suction method.

On the other hand, the solid-state image pickup device 1 of FIG. 1 includes the protective substrate 18 above the on-chip lens 16. Therefore, it is possible to form the external terminal 14 without pressing the on-chip lens 16 against the manufacturing apparatus of the external terminal 14. The solid-state image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the solid-state image pickup device 600 of FIG. 9.

Comparative Example 2

Figure 10:
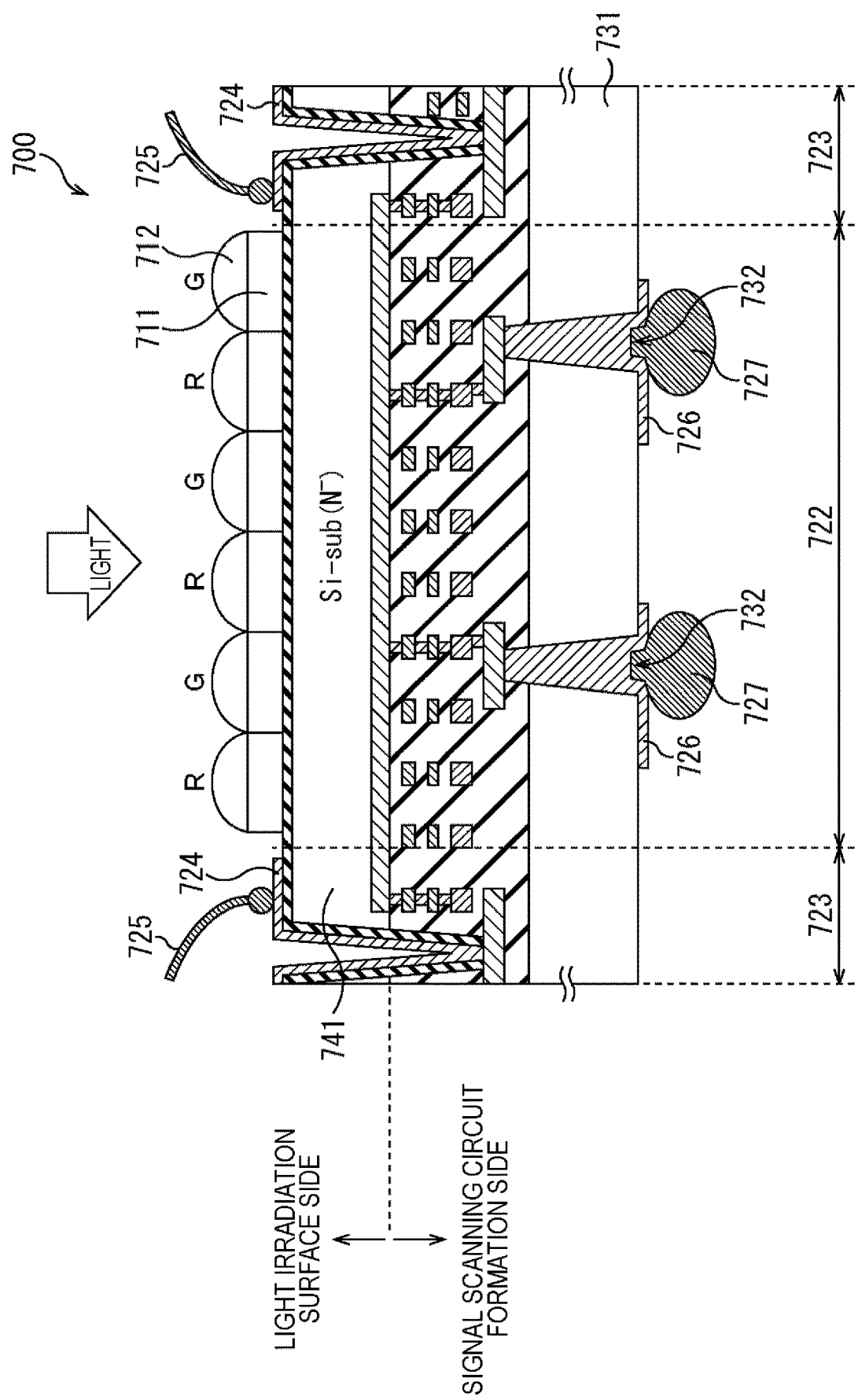
FIG. 10 is a diagram illustrating a cross section in a final shape of a solid-state image pickup device as Comparative Example 2.

FIG. 10 is a diagram illustrating a cross section in a final shape of a solid-state image pickup device disclosed in Japanese Patent Application Laid-Open No. 2010-50149 (Comparative Structure Disclosure Document 2) as Comparative Example 2.

A solid-state image pickup device 700 of FIG. 10 is divided into an image pickup region 722 where a photodiode (not illustrated), a color filter 151, an on-chip lens 712, and the like are formed, and a peripheral region 723 formed around the image pickup region 722.

In the peripheral region 723, a first pad 724 is arranged for a drive pulse and signal input/output. A bonding wire 725 is connected to the first pad 724. Then, a second pad 726 is arranged for giving a reference potential Vss, in the image pickup region 722. An external terminal (solder ball) 727 is provided on the second pad 726.

As described above, the solid-state image pickup device 700 includes the external terminal 727 on the lower side of a pixel array.

The solid-state image pickup device 1 has the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller than the solid-state image pickup device 700 of FIG. 10.

The solid-state image pickup device 700 of FIG. 10 is a solid-state semiconductor device that does not include a layered structure like the upper structural body 11 and the lower structural body 12 of the solid-state image pickup element 1, in other words, that includes only one layer of a semiconductor substrate including a transistor circuit.

In the solid-state image pickup device 700 disclosed in FIG. 10, a via 732 penetrating through a support substrate 731, and the external terminal 727 are formed on the lower side of the pixel array in the image pickup region 722 in its final shape.

However, the external terminal 727 formed in FIG. 10 is a terminal for the reference potential Vss (ground potential). The terminal of the reference potential Vss does not require an input circuit including a transistor circuit when the reference potential Vss is supplied to the inside of the solid-state image pickup device. Therefore, in the solid-state image pickup device 700 disclosed in FIG. 10, the external terminal 737 for the reference potential Vss can be arranged on the lower side of the image pickup region 722.

On the other hand, in the image pickup region 722, pixels each including a photodiode and a pixel transistor are arranged side by side. Therefore, in the case of a structure that includes only one layer of the semiconductor substrate 741 including a transistor circuit, it is difficult to form an input circuit together within a pixel region in the semiconductor substrate 741 including pixels. Therefore, in the solid-state image pickup device 700 including only one layer of the semiconductor substrate 741 disclosed in FIG. 10, it is possible to arrange a power supply terminal that does not require an input/output circuit on the lower side of the pixel region, but it is not possible to arrange an external terminal that requires an input circuit or an output circuit, in other words, an external terminal for signal input or signal output.

Moreover, the solid-state image pickup device 700 of FIG. 10 does not include a protective substrate on the on-chip lens 712, similarly to the solid-state image pickup device 600 illustrated in FIG. 9. Therefore, a problem occurs that the on-chip lens 712 is scratched when the external terminal is crimped.

On the other hand, the solid-state image pickup device 1 has a structure in which a plurality of semiconductor substrates including a transistor circuit is layered. As a result, it is possible to arrange the external terminal 14 that requires an input circuit or an output circuit, in other words, the signal input/output terminal 14C for signal input or signal output, on the lower side of the pixel region. Furthermore, the solid-state image pickup device 1 includes the protective substrate 18 on the on-chip lens 16. Therefore, it is possible to form the external terminal 14 without pressing the on-chip lens 16 against the manufacturing apparatus of the external terminal 14. As a result, the solid-state image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the solid-state image pickup device 700 of FIG. 10.

Comparative Example 3

Figure 11:
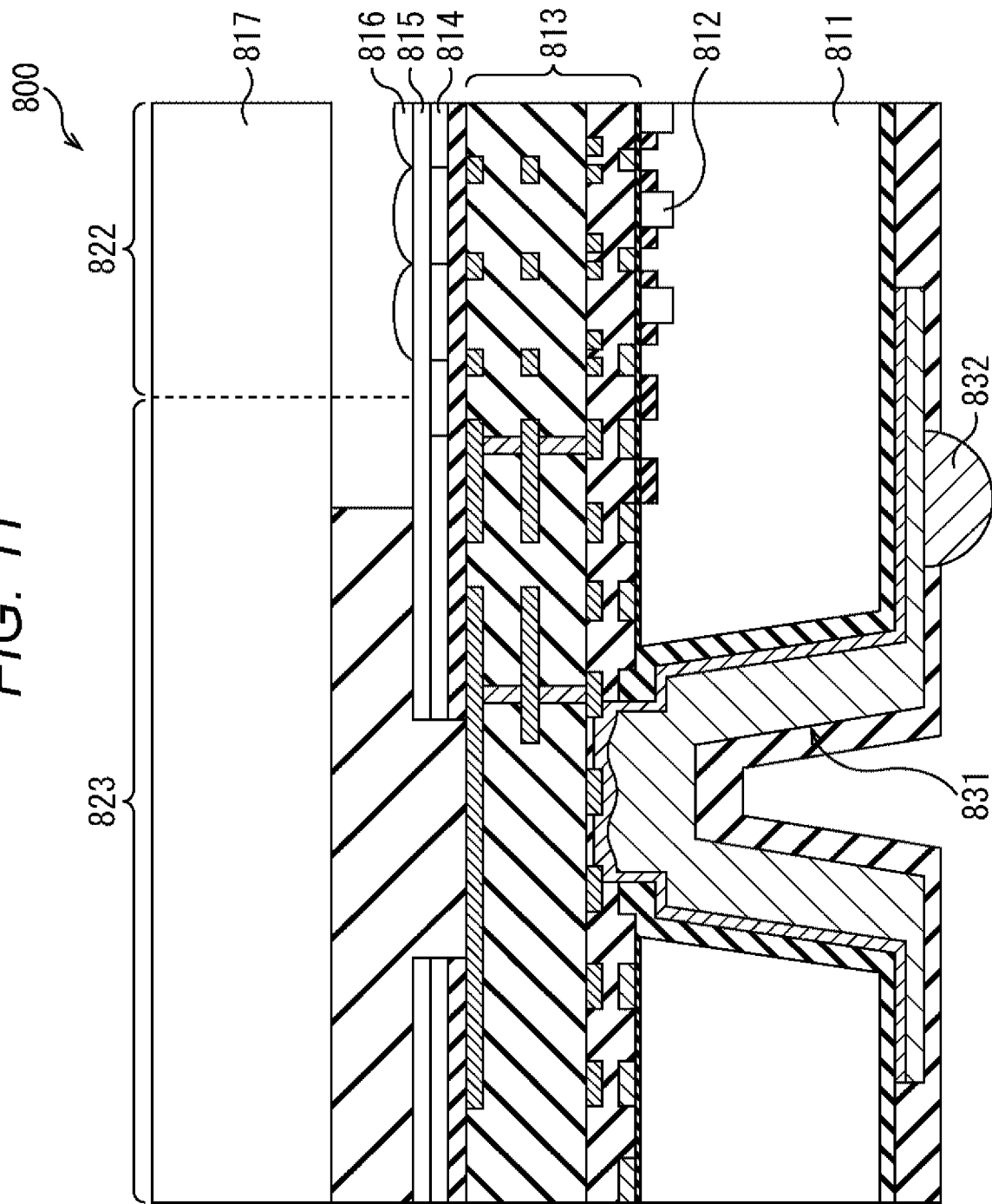
FIG. 11 is a diagram illustrating a cross section in a final shape of a solid-state image pickup device as Comparative Example 3.

FIG. 11 is a diagram illustrating a cross section in a final shape of a solid-state image pickup device disclosed in Japanese Patent Application Laid-Open No. 2011-9645 (Comparative Structure Disclosure Document 3) as Comparative Example 3.

A solid-state image pickup device 800 of FIG. 11 includes an image pickup element 812 including a photodiode and a transistor on a first principal surface (upper surface) of a semiconductor substrate 811. On the upper side of the image pickup element 812, a multilayer wiring layer 813, a color filter 814, an overcoat 815, and an on-chip lens 816 are formed. Furthermore, the solid-state image pickup device 800 includes a protective substrate 817 on the upper side of the on-chip lens 816.

Outside the image pickup pixel unit 822 including the image pickup element 812, the color filter 814, and the on-chip lens 816, a peripheral circuit unit 823 is arranged including a through-silicon-electrode 831 penetrating through the semiconductor substrate 811, an external terminal (solder ball) 832 to be connected to the outside, and the like.

Similarly to the solid-state image pickup device 700 of Comparative Example 2, the solid-state image pickup device 800 of FIG. 11 is a solid-state semiconductor device that does not include a layered structure in which an upper structural body and a lower structural body are layered, in other words, that includes only one layer of a semiconductor substrate including a transistor circuit. Therefore, it is not possible to arrange an external terminal that requires an input circuit or an output circuit, in other words, an external input terminal for signal input or signal output, on the lower side of a pixel region.

On the other hand, the solid-state image pickup device 1 has a structure in which a plurality of semiconductor substrates including a transistor circuit is layered. As a result, it is possible to arrange the external terminal 14 that requires an input circuit or an output circuit, in other words, the external terminal 14 for signal input or signal output, on the lower side of the pixel region. As a result, the solid-state image pickup device 1 enables the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, and the external size can be made smaller than the solid-state image pickup device 800 of FIG. 11.

Furthermore, in a case where the through-silicon-electrode 831 is formed only in the outer peripheral portion (the peripheral circuit unit 823) of the device as in the solid-state image pickup device 800 of FIG. 11, similarly, a power supply terminal and a ground terminal are arranged only in the outer peripheral portion of the device. In this case, it has been necessary to arrange a large number of power supply terminals and ground terminals for countermeasures against IR drop and wiring delay. On the other hand, in the solid-state image pickup device 1, since a plurality of the through-vias 88 can be arranged in an arbitrary region of the lower structural body 12 inside from the upper and lower substrates connection region 314, some of the through-vias 88 can be used for the power supply terminal and the ground terminal. In other words, the power supply terminal and the ground terminal can also be arranged in the arbitrary region. As a result, the number of power supply terminals and ground terminals can be reduced as compared with a case where the power supply terminal and the ground terminal are arranged only in the outer peripheral portion. As a result, a circuit area of the entire solid-state image pickup device 1 can be reduced.

<Difference Between Solid-State Image Pickup Device of FIG. 1 and Comparative Example>

The solid-state image pickup device 1 has the structure in which (1) the external terminal 14, (2) the semiconductor region where the input circuit unit 42 or the output circuit unit 47 connected to the external terminal 14 is formed, (3) the semiconductor region where the photodiode 51 that performs image pickup and the pixel transistor are formed, (4) the color filter 15 and the on-chip lens 16, and (5) the protective substrate 18 are layered in substantially the same region, whereby the external size can be made smaller.

In the case of the solid-state image pickup device having the semiconductor layered structure without the protective substrate given in Comparative Example 1 and Comparative Example 2, the on-chip lens may be scratched. In other words, there is an inhibitory factor to obtain a solid-state image pickup device having an external size equivalent to that of the present technology by adopting a structure in which the above (1) to (4) are layered in substantially the same region. That is, a function and effect of "implementing a compact solid-state image pickup device by layering the above (1) to (4) in substantially the same region" is a function and effect that cannot be obtained by the solid-state image pickup device having the semiconductor layered structure without the protective substrate given in Comparative Example 1 and Comparative Example 2.

In the case of the solid-state semiconductor device including only one layer of the semiconductor substrate including the transistor circuit given in Comparative Example 3, it is not possible to obtain a solid-state image pickup device having an external size equivalent to that of the present technology by adopting the structure in which the above (1) to (5) are layered in substantially the same region. In other words, there is an inhibitory factor. That is, a function and effect of "implementing a compact solid-state image pickup device by layering the above (1) to (5) in substantially the same region" is a function and effect that cannot be obtained by the solid-state image pickup device that includes only one layer of the semiconductor substrate including the transistor circuit given in Comparative Example 3.

As described above, in the present technology, a function and effect of "implementing a solid-state image pickup device having a smaller external size than the solid-state image pickup device not including a structure by the structure in which the above-described (1) to (5) are layered in substantially the same region" is a function and effect that cannot be obtained by the configuration alone of the "solid-state image pickup device having the semiconductor layered structure without the protective substrate" described in Comparative Example 1 and Comparative Example 2, and also is a function and effect that cannot be obtained by the configuration alone of the "solid-state image pickup device that includes only one layer of the semiconductor substrate including the transistor circuit" described in Comparative Example 3.

<9. Other Example Circuit Arrangement Configurations of Solid-State Image Pickup Device>

<Third Example Circuit Arrangement Configuration>

Figure 12:
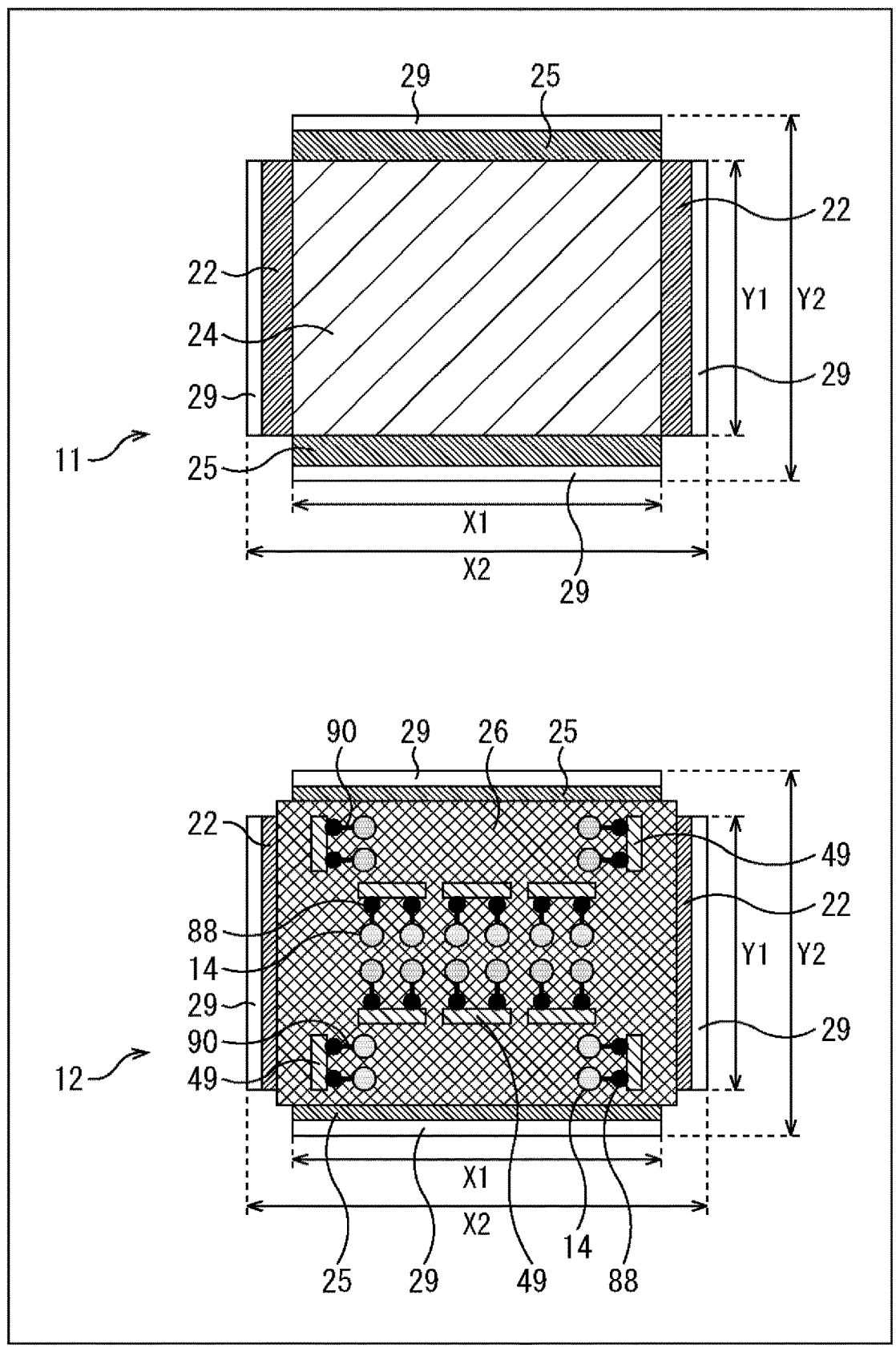
FIG. 12 is a diagram illustrating a third example circuit arrangement configuration of the circuit arrangement in the solid-state image pickup device.

FIG. 12 is a diagram illustrating a third example circuit arrangement configuration that is another example circuit arrangement configuration of the solid-state image pickup device 1 and is a modification of the first example circuit arrangement configuration.

In the first example circuit arrangement configuration illustrated in FIG. 5, the input/output circuit units 49 are arranged separately for each one of the external terminals 14. Then, the image signal processing unit 26 surrounds the periphery of each of the input/output circuit units 49.

On the other hand, in the third example circuit arrangement configuration illustrated in FIG. 12, the input/output circuit units 49 are collectively arranged for each of the plurality of external terminals 14. In the inside of a region of one of the input/output circuit units 49, for example, the input/output circuit unit 49 of a certain external terminal 14 and the input/output circuit unit 49 of another external terminal 14 are arranged in contact with each other, and the image signal processing unit 26 is not arranged between these input/output circuit units 49. As compared with the first example circuit arrangement configuration in which the input/output circuit unit 49 and the image signal processing unit 26 respectively having different power supply voltages are alternately arranged adjacent to each other, in the third example circuit arrangement configuration in which the input/output circuit units 49 having the same power supply voltage are collectively arranged as one block of an input/output circuit unit region, the number of places is reduced where the wells having different power supply voltages are arranged separately, so that there is a possibility that more circuits can be mounted to, for example, the image signal processing unit 26, in the lower structural body 12, even if the external sizes of the solid-state image pickup devices 1 are the same as each other.

Moreover, in the third example circuit arrangement configuration illustrated in FIG. 12, some of the input/output circuit units 49 may be arranged on the lower side of the pixel peripheral circuit unit included in the upper structural body 11, for example, the lower side of the row drive unit 22 included in the upper structural body 11, or outside a region where the image signal processing unit 26 included in the lower structural body 12 is arranged, instead of being arranged on the lower side of the pixel array unit 24 included in the upper structural body 11. As a result, there is a possibility that even more circuits can be mounted to, for example, the image signal processing unit 26, in the lower structural body 12, even if the external sizes of the solid-state image pickup devices 1 are the same as each other.

<Fourth Example Circuit Arrangement Configuration>

Figure 13:
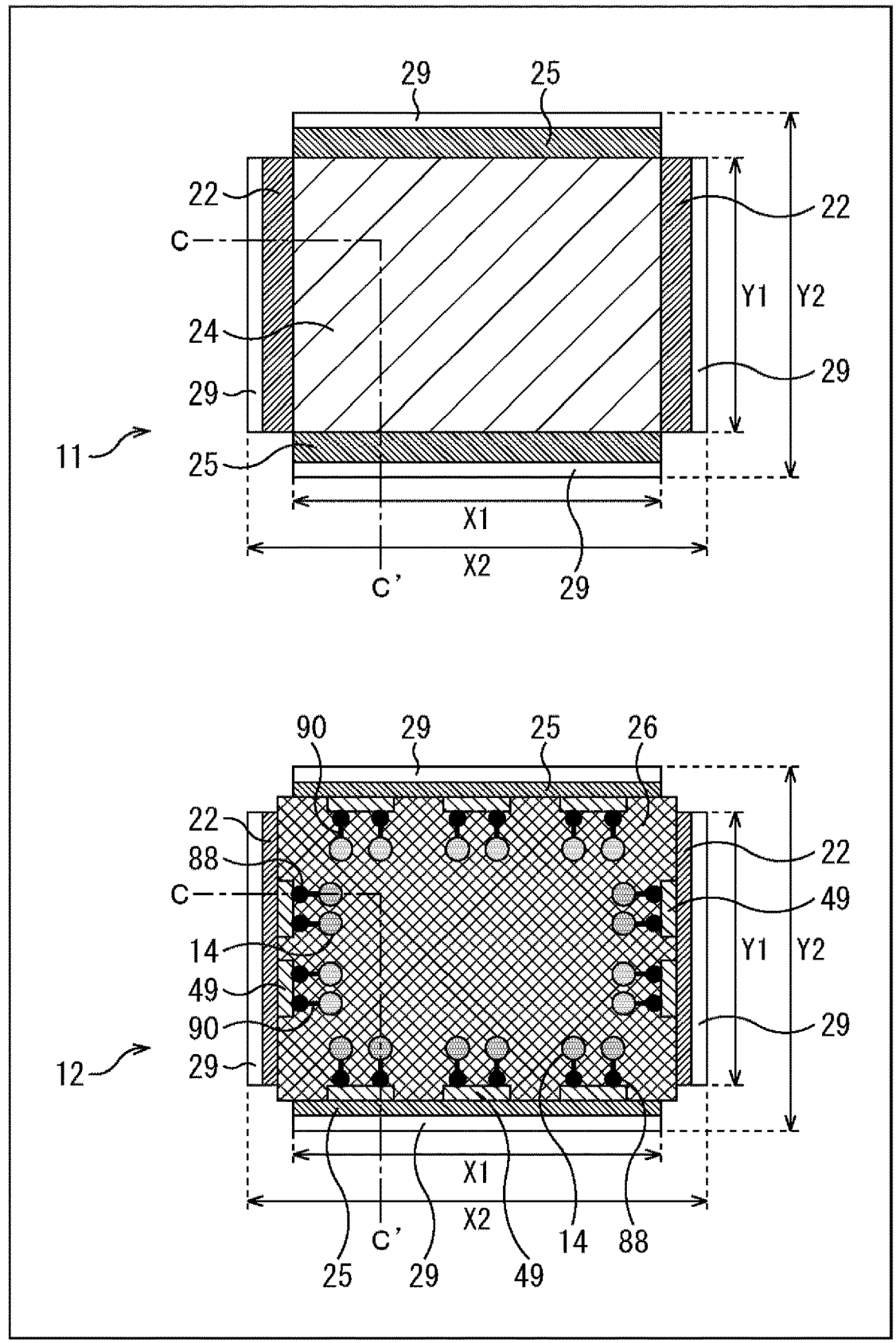
FIG. 13 is a diagram illustrating a fourth example circuit arrangement configuration of the circuit arrangement in the solid-state image pickup device.

FIG. 13 is a diagram illustrating a fourth example circuit arrangement configuration that is another example circuit arrangement configuration of the solid-state image pickup device 1 and is a modification of the first and third example circuit arrangement configurations.

Figure 14:
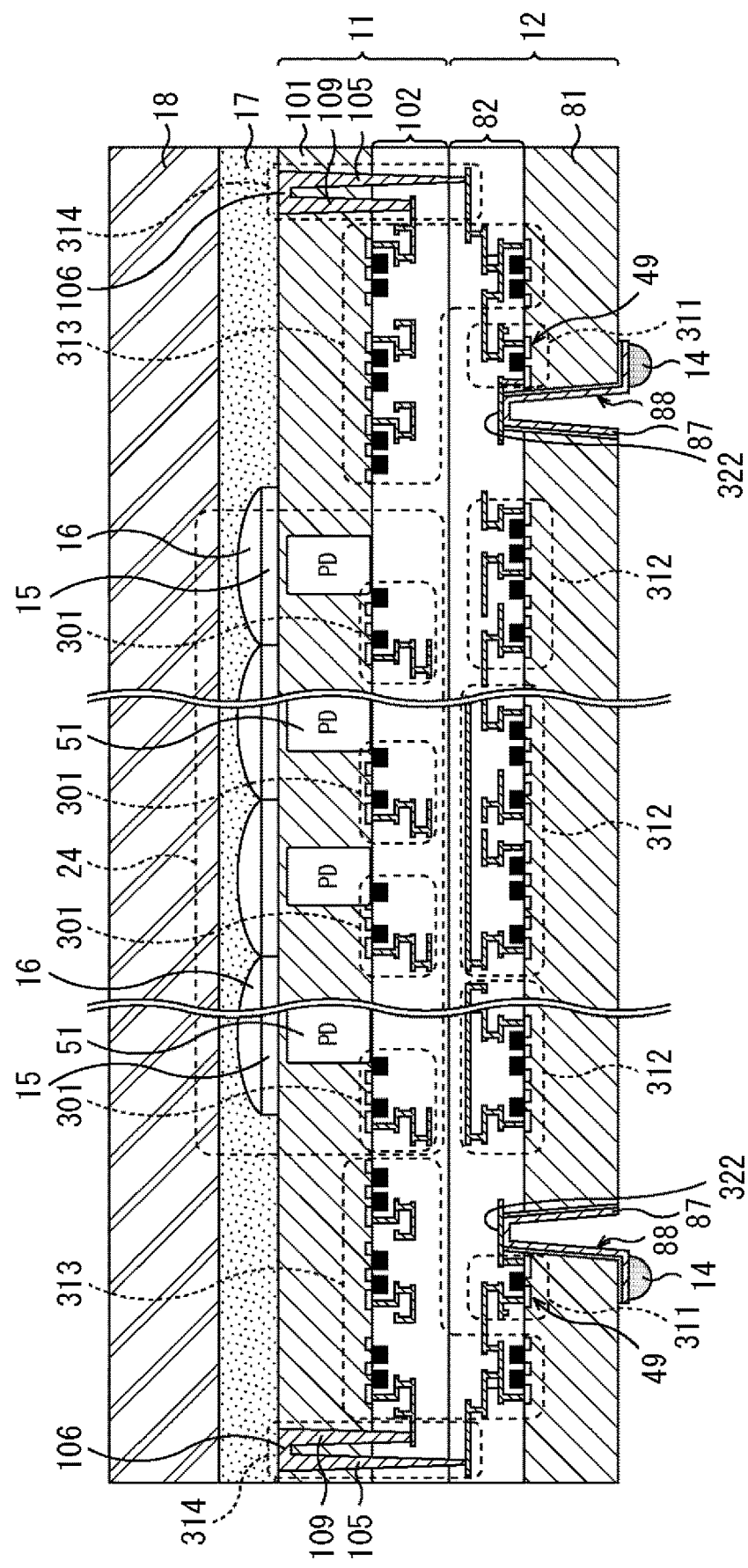
FIG. 14 is a diagram illustrating a cross-sectional structure taken along a line C-C' of FIG. 13.

FIG. 14 is a diagram illustrating a cross-sectional structure of the solid-state image pickup device 1 taken along a line C-C' of FIG. 13. Note that, for convenience, a part of FIG. 14 is illustrated by being changed to a cross-sectional structure in another example configuration of the present technology described later.

In the fourth example circuit arrangement configuration illustrated in FIGS. 13 and 14, all of the input/output circuit units 49, in other words, the input circuit units 42 and the output circuit units 47, are arranged in the outer peripheral portion of a region where the image signal processing unit 26 included in the lower structural body 12 is arranged. A region where the input/output circuit units 49 are arranged may be on the lower side of the row drive unit 22 and the column signal processing unit 25 (the pixel peripheral circuit region 313) included in the upper structural body 11, or may be on the outer peripheral portion lower side of the pixel array unit 24 included in the upper structural body 11.

Note that, the region where the input/output circuit units 49 are arranged need not be arranged without any discontinuity over the entire row direction of the column signal processing unit 25, for example, and there may be a region where the input/output circuit units 49 are not arranged between the column signal processing unit 25 and the image signal processing unit 26.

Furthermore, the region where the input/output circuit units 49 are arranged need not be arranged without any discontinuity over the entire column direction of the row drive unit 22, and there may be a region where the input/output circuit units 49 are not arranged between the row drive unit 22 and the image signal processing unit 26.

With the fourth example circuit arrangement configuration, the number of places where the wells having different power supply voltages are arranged separately is reduced as compared with the third example circuit arrangement configuration, so that there is a possibility that more circuits can be mounted to, for example, the image signal processing unit 26, in the lower structural body 12, even if the external sizes of the solid-state image pickup devices 1 are the same as each other.

<Fifth Example Circuit Arrangement Configuration>

Figure 15:
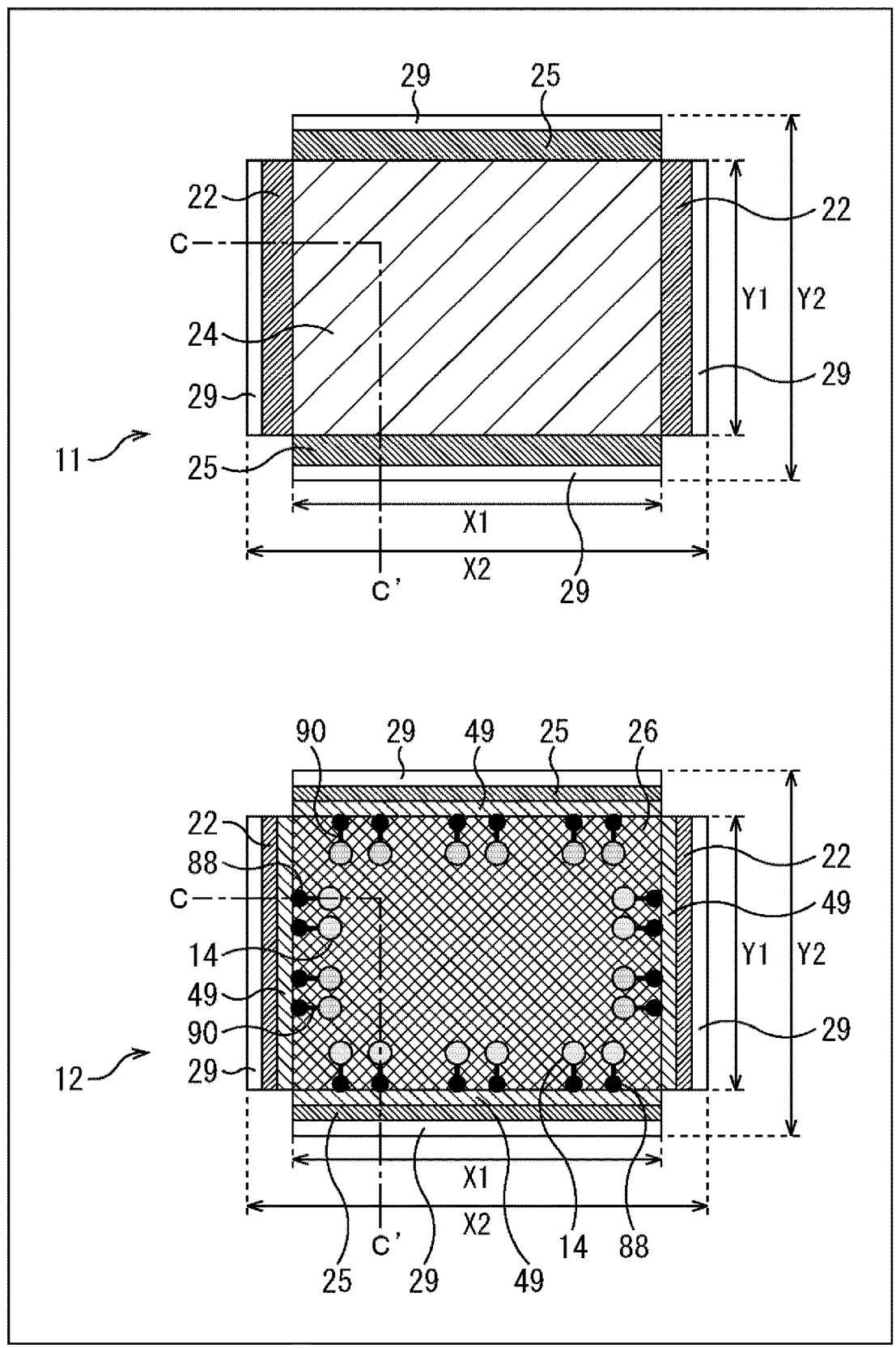
FIG. 15 is a diagram illustrating a fifth example circuit arrangement configuration of the circuit arrangement in the solid-state image pickup device.

FIG. 15 is a diagram illustrating a fifth example circuit arrangement configuration that is another example circuit arrangement configuration of the solid-state image pickup device 1 and is a modification of the first, third, and fourth example circuit arrangement configurations.

In the fourth example circuit arrangement configuration illustrated in FIG. 13, there is a region where the input/output circuit units 49 are not arranged between the column signal processing unit 25 and the image signal processing unit 26, and between the row drive unit 22 and the image signal processing unit 26.

On the other hand, in the fifth example circuit arrangement configuration illustrated in FIG. 15, the input/output circuit units 49 are arranged in rows extending over the entire row direction of the column signal processing unit 25, and furthermore, over the entire column direction of the row drive unit 22. As a result, there is a possibility that the area of the input/output circuit units 49 can be increased.

Furthermore, in the fifth example circuit arrangement configuration, there is a possibility that more circuits can be mounted to, for example, the image signal processing unit 26, in the lower structural body 12, even if the external size of the solid-state image pickup device 1 is the same as that of the first and third example circuit arrangement configurations.

<Sixth Example Circuit Arrangement Configuration>

Figure 16:
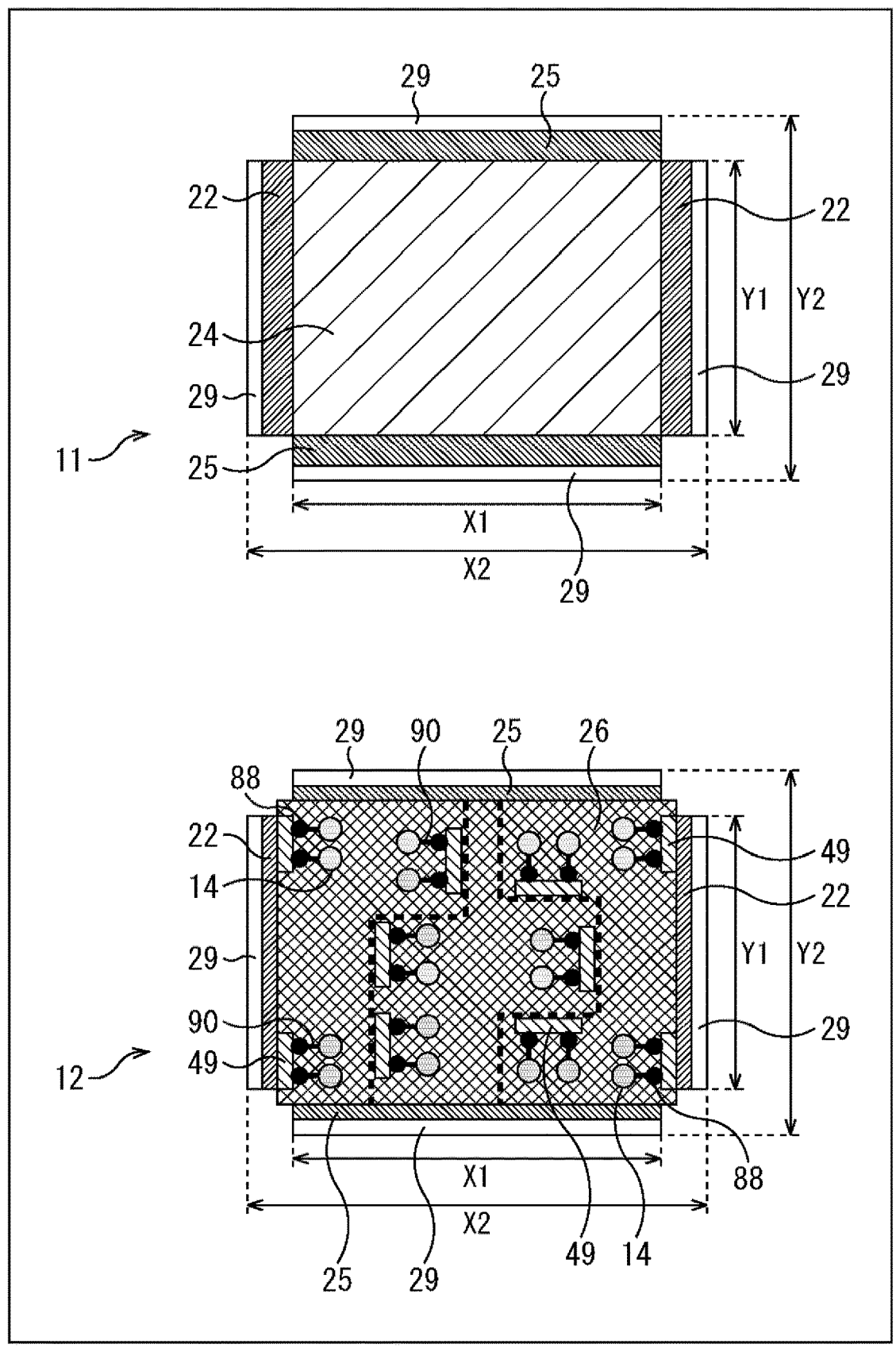
FIG. 16 is a diagram illustrating a sixth example circuit arrangement configuration of the circuit arrangement in the solid-state image pickup device.

FIG. 16 is a diagram illustrating a sixth example circuit arrangement configuration that is another example circuit arrangement configuration of the solid-state image pickup device 1 and is a modification of the first and third example circuit arrangement configurations.

In the first and third example circuit arrangement configurations, the input/output circuit units 49 are arranged in a region on the lower side of the pixel array unit 24 of the upper structural body 11, in the lower structural body 12, and the image signal processing unit 26 is arranged around the input/output circuit units 49.

In the sixth example circuit arrangement configuration of FIG. 16, the image signal processing unit 26 of the lower structural body 12 is arranged having a configuration including a plurality of (three in FIG. 16) circuit blocks divided by a broken line. Then, in the sixth example circuit arrangement configuration, the input/output circuit units 49 are arranged in a portion on a block boundary of a circuit block included in the image signal processing unit 26, or on a boundary with the row drive unit 22.

In a case where the image signal processing unit 26 is arranged to be divided into a plurality of circuit blocks, a ground line and a power supply line to the circuit included in each circuit block are sometimes arranged in the block boundary portion. Therefore, there are cases where the circuits are arranged so that a distance between the circuits in the block boundary portion is greater than a distance between the circuits inside the circuit block. By arranging the input/output circuit units 49 in the boundary portion of the circuit block in which the circuit density is relatively low as described above, there is a possibility that the layout design of the circuit can be facilitated and the input/output circuit units 49 can be arranged without lowering the degree of integration of the circuits, as compared with a case where the input/output circuit units 49 are arranged inside the circuit block. As a result, there is a possibility that more circuits can be mounted to, for example, the image signal processing unit 26, in the lower structural body 12, by using the sixth example circuit arrangement configuration, even if the external sizes of the solid-state image pickup devices 1 are the same as each other.

<Seventh Example Circuit Arrangement Configuration>

Figure 17:
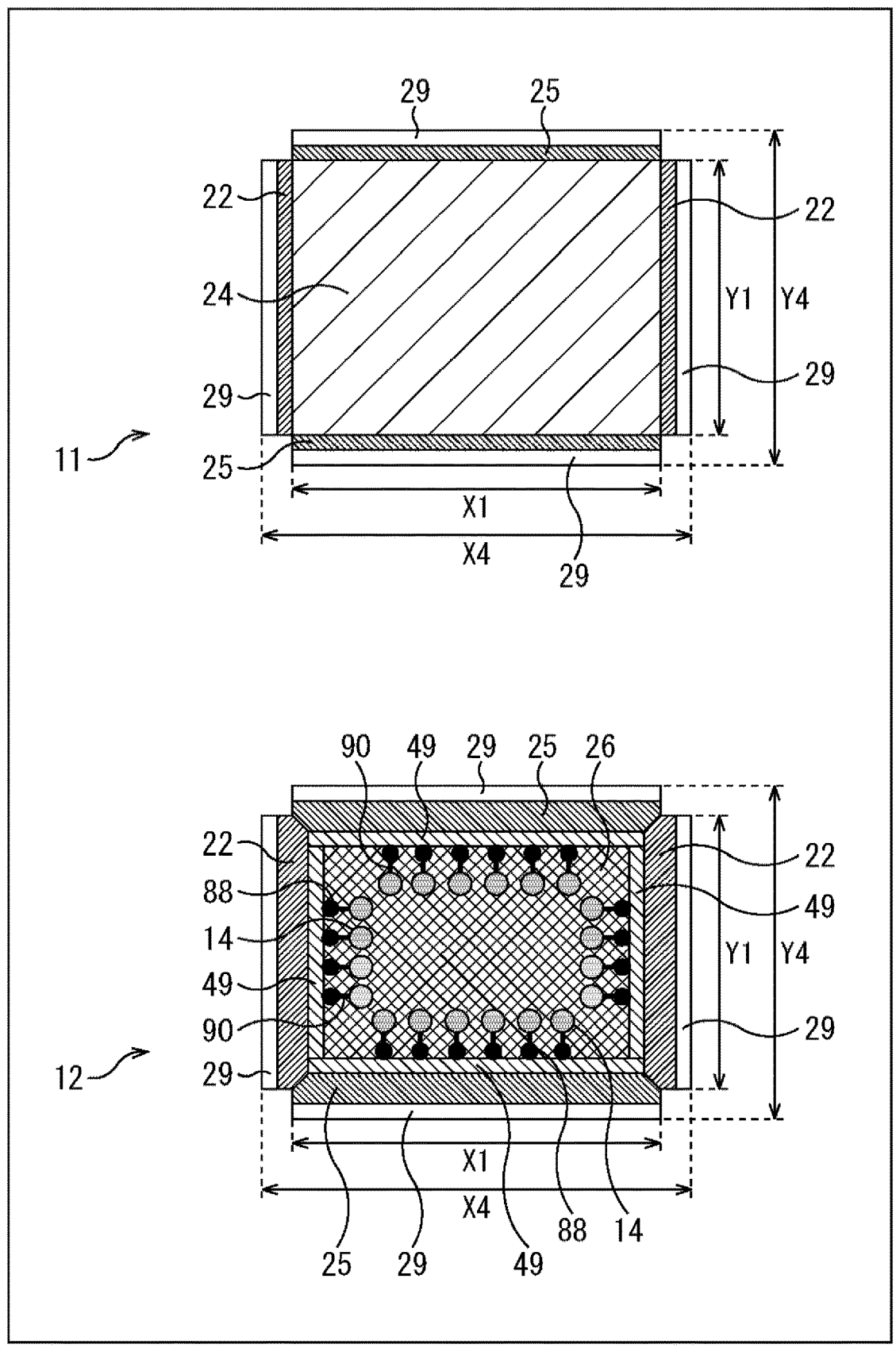
FIG. 17 is a diagram illustrating a seventh example circuit arrangement configuration of the circuit arrangement in the solid-state image pickup device.

FIG. 17 is a diagram illustrating a seventh example circuit arrangement configuration that is another example circuit arrangement configuration of the solid-state image pickup device 1 and is a modification of the fifth example circuit arrangement configuration.

In the seventh example circuit arrangement configuration of FIG. 17, the area of the row drive unit 22 arranged in the lower structural body 12 is greater than the area of the row drive unit 22 arranged in the upper structural body 11. Furthermore, the row drive unit 22 arranged in the lower structural body 12 is arranged to be extended toward the inside of the device as compared with the row drive unit 22 arranged in the upper structural body 11.

Similarly, the area of the column signal processing unit 25 arranged in the lower structural body 12 is greater than the area of the column signal processing unit 25 arranged in the upper structural body 11. Furthermore, the column signal processing unit 25 arranged in the lower structural body 12 is arranged to be extended toward the inside of the device as compared with the column signal processing unit 25 arranged in the upper structural body 11.

As a result, in the seventh example circuit arrangement configuration, as compared with the fifth example circuit arrangement configuration illustrated in FIG. 15, there is a possibility that the external size of the solid-state image pickup device 1 can be reduced even if the sizes of the pixel array units 24 of the solid-state image pickup devices 1 are the same as each other.

Note that, the example arrangement of the row drive unit 22 and the column signal processing unit 25 given in the seventh example circuit arrangement configuration can also be adapted to other example configurations of the present technology.

<Eighth Example Circuit Arrangement Configuration>

Figure 18:
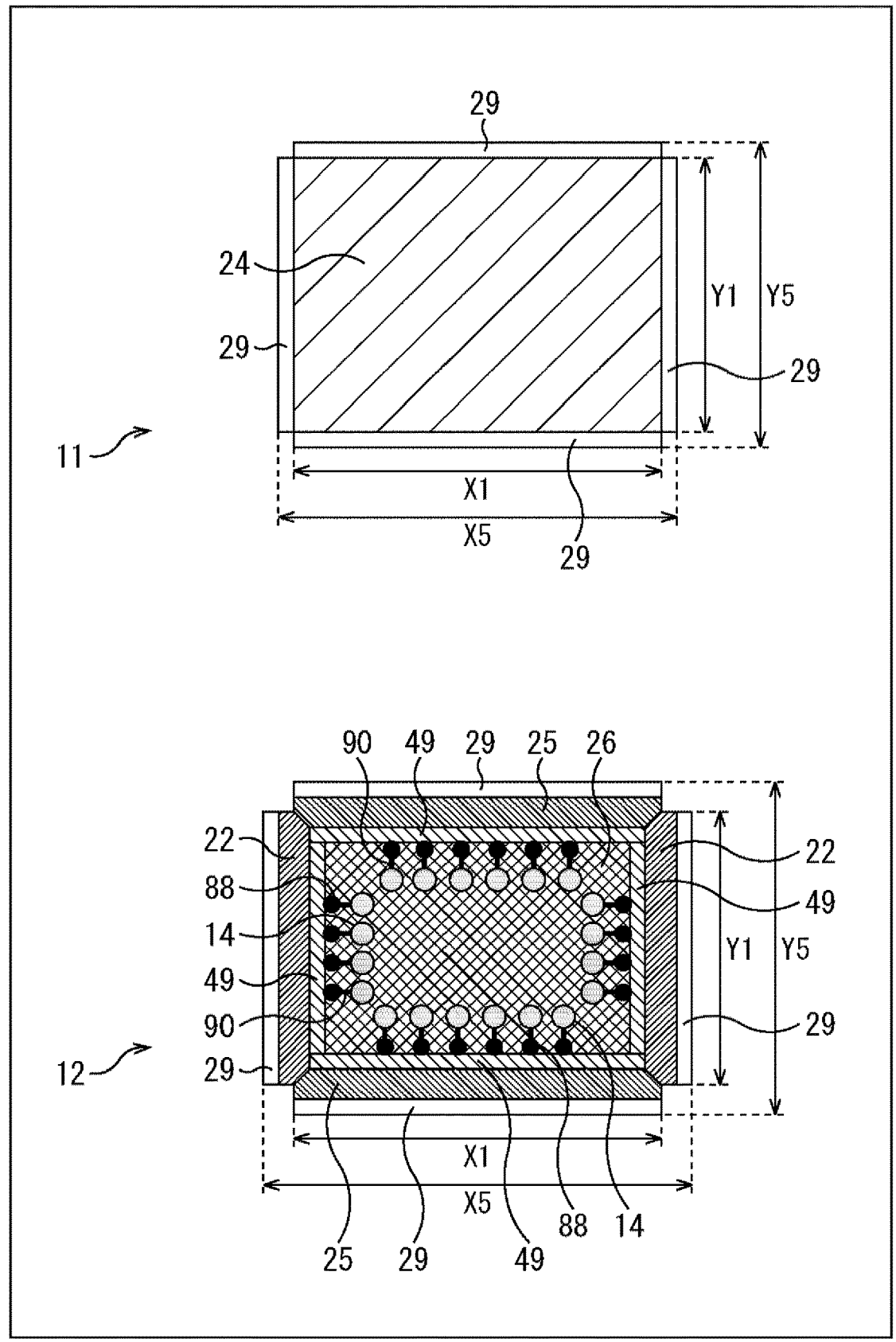
FIG. 18 is a diagram illustrating an eighth example circuit arrangement configuration of the circuit arrangement in the solid-state image pickup device.

FIG. 18 is a diagram illustrating an eighth example circuit arrangement configuration that is another example circuit arrangement configuration of the solid-state image pickup device 1 and is a modification of the seventh example circuit arrangement configuration.

In the seventh example circuit arrangement configuration illustrated in FIG. 17, the row drive unit 22 is arranged also in the upper structural body 11, although the area is smaller than that of the row drive unit 22 arranged in the lower structural body 12. Similarly, the column signal processing unit 25 is arranged also in the upper structural body 11, although the area is smaller than that of the column signal processing unit 25 arranged in the lower structural body 12.

On the other hand, in the eighth example circuit arrangement configuration of FIG. 18, the row drive unit 22 and the column signal processing unit 25 are arranged only in the lower structural body 12. A signal output from the row drive unit 22 to the pixel array unit 24 is transmitted from the row drive unit 22 arranged in the lower structural body 12 to the pixel array unit 24 arranged in the upper structural body 11 via the wiring connection unit 29 including the upper and lower wiring lines connection structure of the pixel peripheral circuit region 313 illustrated in FIG. 8. Similarly, a signal input from the pixel array unit 24 to the column signal processing unit 25 is transmitted from the pixel array unit 24 arranged in the upper structural body 11 to the column signal processing unit 25 arranged in the lower structural body 12 via the wiring connection unit 29 including the upper and lower wiring lines connection structure of the pixel peripheral circuit region 313 illustrated in FIG. 8. As a result, in the eighth example circuit arrangement configuration, as compared with the seventh example circuit arrangement configuration illustrated in FIG. 17, there is a possibility that the external size of the solid-state image pickup device 1 can be reduced even if the sizes of the pixel array units 24 of the solid-state image pickup devices 1 are the same as each other.

Note that, the example arrangement of the row drive unit 22 and the column signal processing unit 25 given in the eighth example circuit arrangement configuration can also be adapted to other example configurations of the present technology.

<Ninth Example Circuit Arrangement Configuration>

Figure 19:
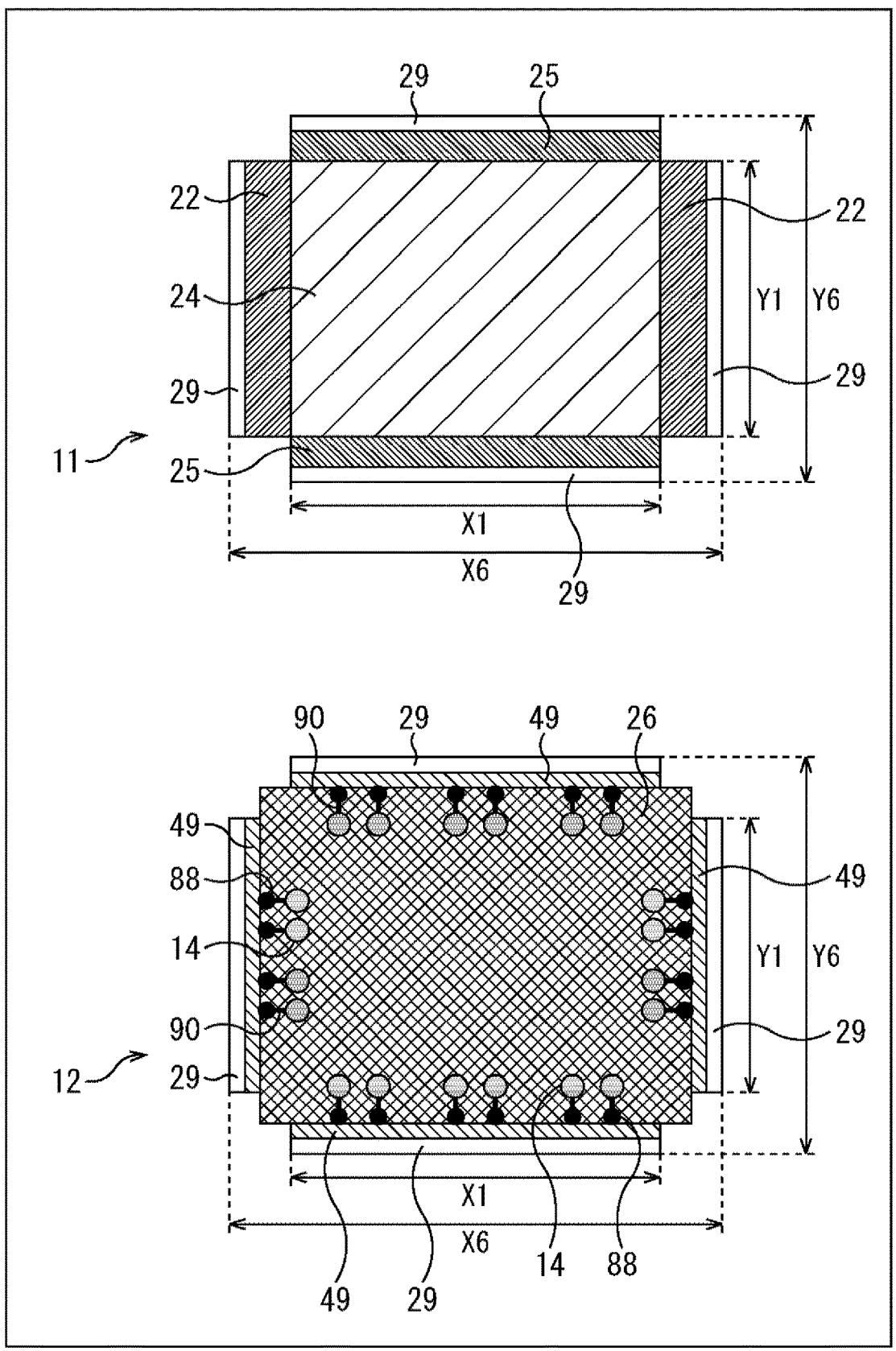
FIG. 19 is a diagram illustrating a ninth example circuit arrangement configuration of the circuit arrangement in the solid-state image pickup device.

FIG. 19 is a diagram illustrating a ninth example circuit arrangement configuration that is another example circuit arrangement configuration of the solid-state image pickup device 1 and is a modification of the fifth example circuit arrangement configuration.

In the ninth example circuit arrangement configuration illustrated in FIG. 19, the row drive unit 22 and the column signal processing unit 25 are all arranged in the upper structural body 11. Then, in the lower structural body 12, in a region positioned on the lower side of the row drive unit 22 and the column signal processing unit 25 arranged in the upper structural body 11, the image signal processing unit 26 is arranged to be extended in an outer peripheral direction, as compared with the fifth example circuit arrangement configuration illustrated in FIG. 15. Furthermore, the input/output circuit units 49 may be arranged in a region positioned on the lower side of the row drive unit 22 and the column signal processing unit 25 arranged in the upper structural body 11. As a result, as compared with the fifth example circuit arrangement configuration illustrated in FIG. 15, in the ninth example circuit arrangement configuration, there is a possibility that the area of the image signal processing unit 26 can be increased and more circuits can be mounted to the image signal processing unit 26 even if the sizes of the pixel array units 24 of the solid-state image pickup devices 1 are the same as each other.

Note that, the example arrangement of the row drive unit 22 and the column signal processing unit 25 given in the ninth example circuit arrangement configuration can also be adapted to other example configurations of the present technology.

<Tenth Example Circuit Arrangement Configuration>

Figure 20:
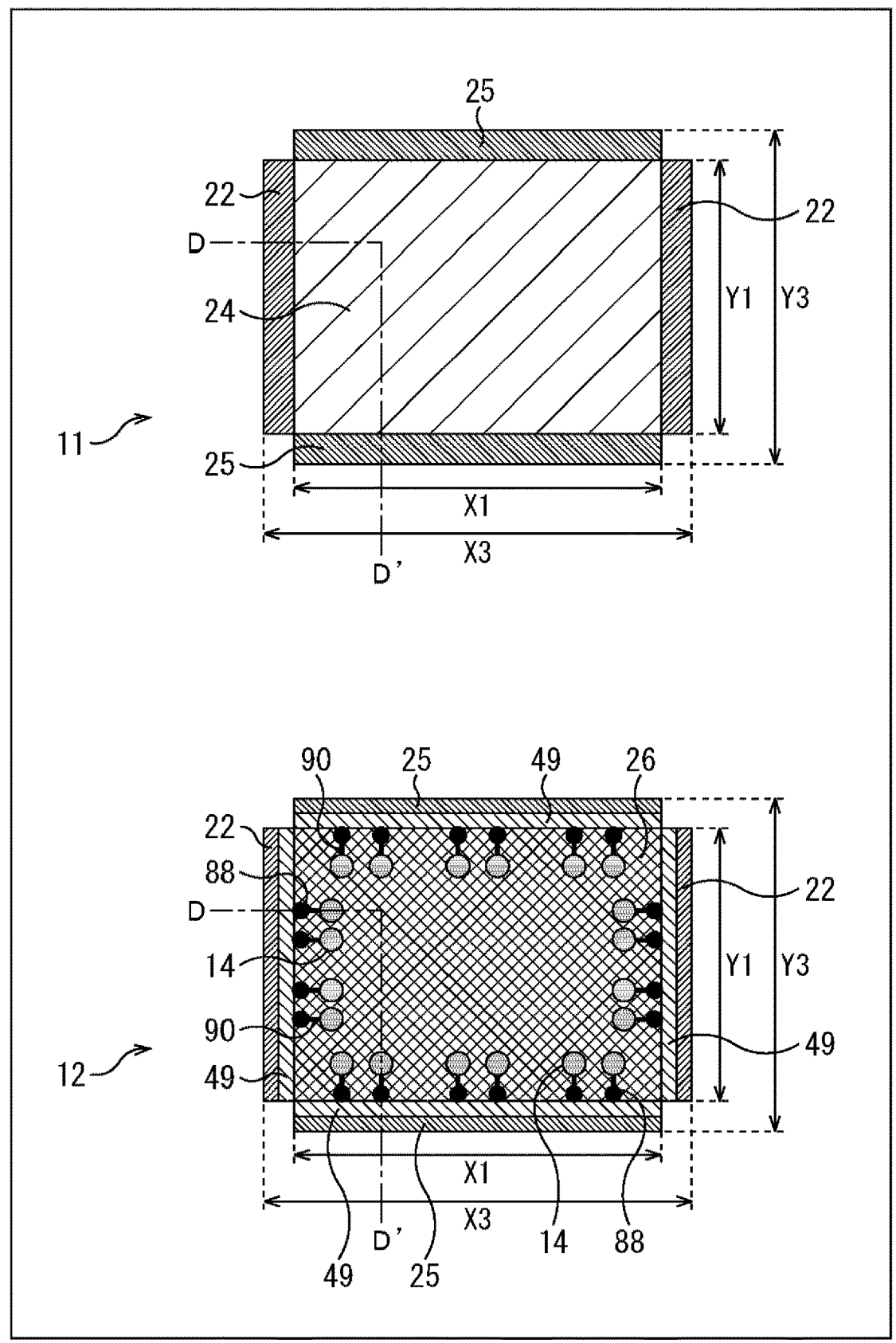
FIG. 20 is a diagram illustrating a tenth example circuit arrangement configuration of the circuit arrangement in the solid-state image pickup device.

FIG. 20 is a diagram illustrating a tenth example circuit arrangement configuration that is another example circuit arrangement configuration of the solid-state image pickup device 1 and is a modification of the second example circuit arrangement configuration.

Figure 21:
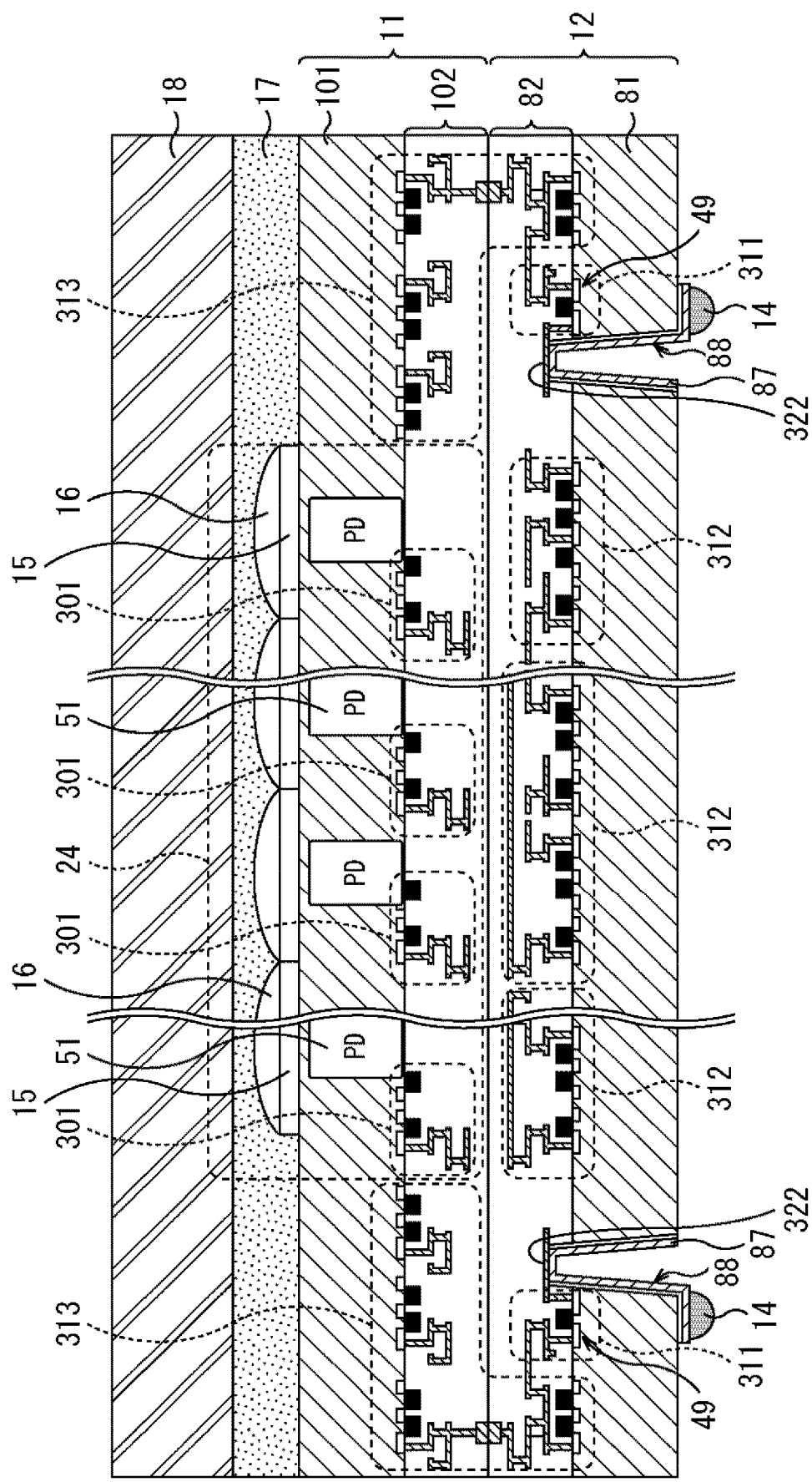
FIG. 21 is a diagram illustrating a cross-sectional structure taken along a line D-D' of FIG. 20.

FIG. 21 is a diagram illustrating a cross-sectional structure of the solid-state image pickup device 1 taken along a line D-D' of FIG. 20. Note that, for convenience, a part of FIG. 21 is illustrated by being changed to a cross-sectional structure in another example configuration of the present technology described later.

In the tenth circuit arrangement example illustrated in FIGS. 20 and 21, similarly to the second example circuit arrangement configuration illustrated in FIGS. 7 and 8, the upper and lower wiring lines direct connection structure can be arranged inside the peripheral circuit region 313 included in the upper structural body 11, and inside the pixel peripheral circuit region 313 included in the lower structural body 12.

Furthermore, in the tenth example circuit arrangement configuration illustrated in FIGS. 20 and 21, all of the input/output circuit units 49, in other words, the input circuit units 42 and the output circuit units 47 are arranged outside a region where the image signal processing unit 26 of the lower structural body 12 is arranged. A region where the input/output circuit units 49 are arranged may be on the lower side of the row drive unit 22 and the column signal processing unit 25 included in the upper structural body 11, or may be on the lower side of the pixel array unit 24 included in the upper structural body 11.

Note that, the region where the Input/output circuit units 49 are arranged need not be arranged without any discontinuity over the entire row direction of the column signal processing unit 25, for example, and, there may be a region where the input/output circuit units 49 are not arranged between the column signal processing unit 25 and the image signal processing unit 26.

Furthermore, the region where the input/output circuit units 49 are arranged need not be arranged without any discontinuity over the entire column direction of the row drive unit 22, and there may be a region where the input/output circuit units 49 are not arranged between the row drive unit 22 and the image signal processing unit 26. With the tenth example circuit arrangement configuration, there is a possibility that more circuits can be mounted to, for example, the image signal processing unit 26, in the lower structural body 12, even if the external size of the solid-state image pickup device 1 is the same as that of the second example circuit arrangement configuration illustrated in FIG. 7.

Note that, the example arrangement of the circuit given in the tenth example circuit arrangement configuration can also be adapted to other example configurations of the present technology.

<Eleventh Example Circuit Arrangement Configuration>

Figure 22:
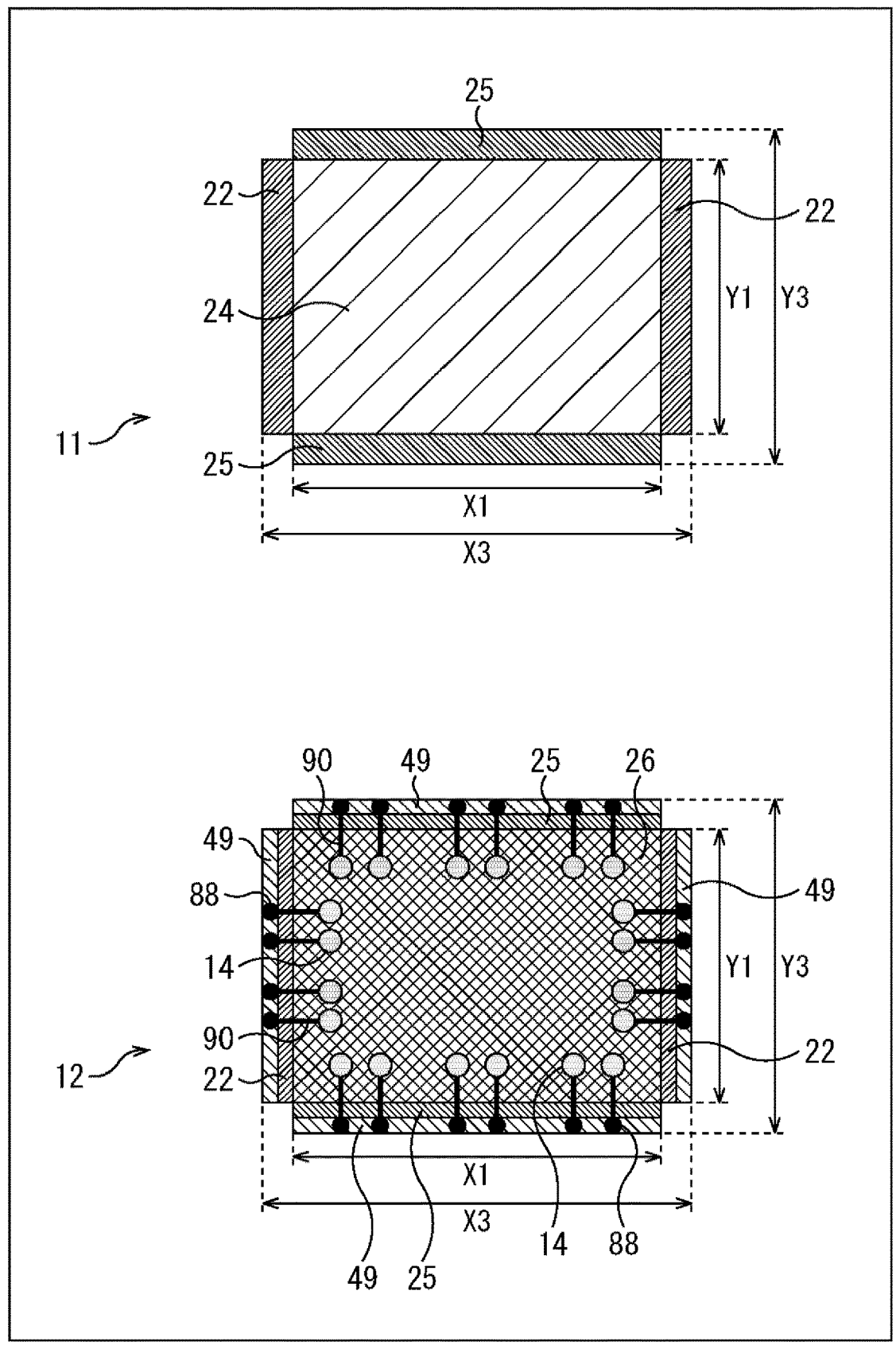
FIG. 22 is a diagram illustrating an eleventh example circuit arrangement configuration of the circuit arrangement in the solid-state image pickup device.

FIG. 22 is a diagram illustrating an eleventh example circuit arrangement configuration that is another example circuit arrangement configuration of the solid-state image pickup device 1 and is a modification of the tenth example circuit arrangement configuration.

In the tenth example circuit arrangement configuration illustrated in FIG. 20, a part of the row drive unit 22 and a part of the column signal processing unit 25 are arranged in both the upper structural body 11 and the lower structural body 12. Then, in the lower structural body 12, the input/output circuit units 49 are arranged in a region that is on the lower side of the row drive unit 22 arranged in the upper structural body 11 and on the inside from the row drive unit 22 arranged in the lower structural body 12 of the device. Similarly, in the lower structural body 12, the input/output circuit units 49 are arranged in a region that is on the lower side of the column signal processing unit 25 arranged in the upper structural body 11 and on the inside from the column signal processing unit 25 arranged in the lower structural body 12 of the device.

In the eleventh example circuit arrangement configuration illustrated in FIG. 22, a part of the row drive unit 22 and a part of the column signal processing unit 25 are arranged in both the upper structural body 11 and the lower structural body 12. Then, in the lower structural body 12, the input/output circuit units 49 are arranged in a region that is on the lower side of the row drive unit 22 arranged in the upper structural body 11 and on the outside from the row drive unit 22 arranged in the lower structural body 12 of the device. Similarly, in the lower structural body 12, the input/output circuit units 49 are arranged in a region that is on the lower side of the column signal processing unit 25 arranged in the upper structural body 11 and on the outside from the column signal processing unit 25 arranged in the lower structural body 12 of the device.

As a result, as compared with the tenth example circuit arrangement configuration illustrated in FIG. 20, there is a possibility that, for example, in the lower structural body 12, arrangement can be facilitated of a signal line between the image signal processing unit 26 and the row drive unit 22 arranged in the lower structural body 12 and a signal line between the image signal processing unit 26 and the column signal processing unit 25, or these signal lines can be arranged with high density.

Note that, the example arrangement of the circuit given in the eleventh example circuit arrangement configuration can also be adapted to other example configurations of the present technology.

<10. Detailed Structure of Solid-State Image Pickup Device>

Figure 23:
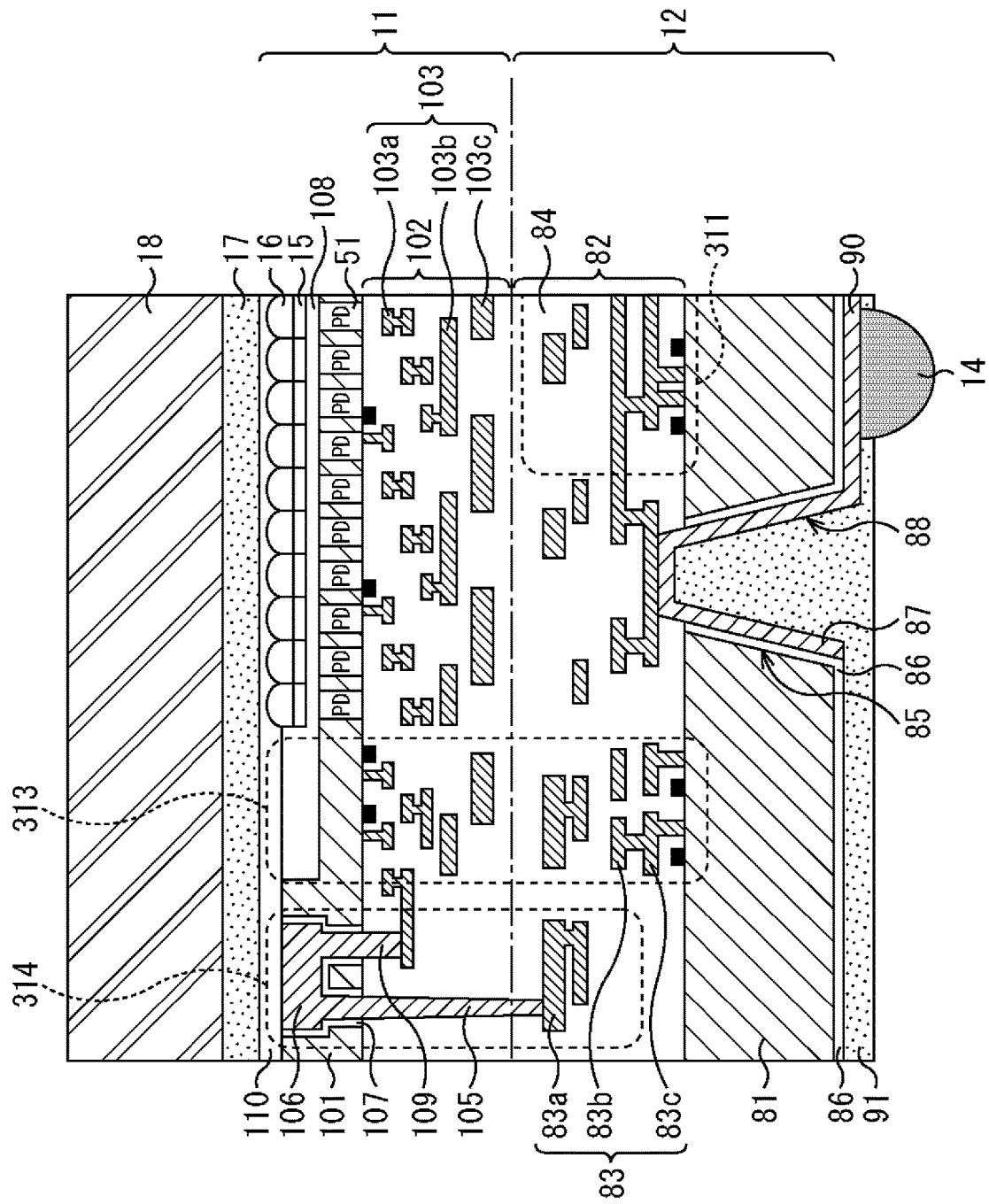
FIG. 23 is an enlarged cross-sectional view near an outer periphery of a solid-state image pickup device 1.

Next, with reference to FIG. 23, a detailed structure of the solid-state image pickup device 1 will be described. FIG. 23 is an enlarged cross-sectional view illustrating near the outer periphery of the solid-state image pickup device 1 having the twin contact structure.

On the lower structural body 12, the multilayer wiring layer 82 is formed on the upper side (upper structural body 11 side) of the semiconductor substrate 81 including silicon (Si), for example. The multilayer wiring layer 82 forms the input/output circuit region 311, the signal processing circuit region 312 (not illustrated in FIG. 23), the pixel peripheral circuit region 313, and the like illustrated in FIG. 6.

The multilayer wiring layer 82 includes a plurality of the wiring layers 83 including an uppermost wiring layer 83a closest to the upper structural body 11, an intermediate wiring layer 83b, a lowermost wiring layer 83c closest to the semiconductor substrate 81, and the like, and an interlayer insulating film 84 formed between the wiring layers 83.

The plurality of wiring layers 83 is formed by using, for example, copper (Cu), aluminum (Al), tungsten (W), or the like, and the interlayer insulating film 84 includes, for example, a silicon oxide film, a silicon nitride film, or the like. For each of the plurality of wiring layers 83 and the interlayer insulating film 84, all layers may include the same material, or two or more materials may be used depending on the layer.

A silicon through hole 85 penetrating through the semiconductor substrate 81 is formed at a predetermined position of the semiconductor substrate 81, and a connection conductor 87 is embedded in the inner wall of the silicon through hole 85 via an insulating film 86, whereby the through-via (through silicon via (TSV)) 88 is formed. The insulating film 86 can include, for example, SiO2 film, SiN film, or the like. In the present embodiment, the through via 88 has an inverted tapered shape in which a plane area of the wiring layer 83 side is smaller than that of the external terminal 14 side, but on the contrary, the through-via 88 may have a forward tapered shape in which a plane area of the external terminal 14 side is smaller, or may have a non-tapered shape in which the areas of the external terminal 14 side and the wiring layer 83 side are substantially the same as each other.

The connection conductor 87 of the through-via 88 is connected to a rewiring line 90 formed on the lower surface side of the semiconductor substrate 81, and the rewiring line 90 is connected to the external terminal 14. The connection conductor 87 and the rewiring line 90 can include, for example, copper (Cu), tungsten (W), titanium (Ti), tantalum (Ta), titanium tungsten alloy (TiW), polysilicon, or the like.

Furthermore, a solder mask (solder resist) 91 is formed on the lower surface side of the semiconductor substrate 81 to cover the rewiring line 90 and the insulating film 86 except for a region where the external terminal 14 is formed.

On the other hand, in the upper structural body 11, the multilayer wiring layer 102 is formed on the lower side (lower structural body 12 side) of the semiconductor substrate 101 including silicon (Si), for example. The multilayer wiring layer 102 forms the circuit of the pixel 31 illustrated in FIG. 3.

The multilayer wiring layer 102 includes a plurality of the wiring layers 103 including an uppermost wiring layer 103a closest to the semiconductor substrate 101, an intermediate wiring layer 103b, a lowermost wiring layer 103c closest to the lower structural body 12, and the like, and an interlayer insulating film 104 formed between the wiring layers 103.

As a material to be used as the plurality of wiring layers 103 and the interlayer insulating film 104, a material can be used of the same type as the material of the wiring layer 83 and the interlayer insulating film 84 described above. Furthermore, similarly to the wiring layer 83 and the interlayer insulating film 84 described above, the plurality of wiring layer 103 and the interlayer insulating film 104 may be formed by using one material, or two or more materials.

Note that, in the example of FIG. 23, the multilayer wiring layer 102 of the upper structural body 11 includes five-layer wiring layer 103, and the multilayer wiring layer 82 of the lower structural body 12 includes four-layer wiring layer 83; however, the total number of wiring layers is not limited thereto, and the multilayer wiring layer can be formed with an arbitrary number of layers.

In the semiconductor substrate 101, the photodiode 51 formed by a PN junction is formed for each pixel 31.

Furthermore, although detailed illustration is omitted, the plurality of pixel transistors such as the transfer transistor 52 and the amplifier transistor 55, the FD 53, and the like are also formed in the multilayer wiring layer 102 and the semiconductor substrate 101.

At a predetermined position of the semiconductor substrate 101 on which the color filter 15 and the on-chip lens 16 are not formed, the through-silicon-electrode 109 connected to a predetermined wiring layer 103 of the upper structural body 11, and the through-chip-electrode 105 connected to the predetermined wiring layer 83 of the lower structural body 12 are formed.

The through-chip-electrode 105 and the through-silicon-electrode 109 are connected together by the connection wiring line 106 formed on the upper surface of the semiconductor substrate 101. Furthermore, an insulating film 107 is formed between the semiconductor substrate 101 and each of the through-silicon-electrode 109 and the through-chip-electrode 105.

A flattening film 108 is formed between the photodiode 51 of the semiconductor substrate 101 and the color filter 15, and a flattening film 110 is also formed between the on-chip lens 16 and the glass seal resin 17.

As described above, the layered structural body 13 of the solid-state image pickup device 1 illustrated in FIG. 1 has a layered structure in which the multilayer wiring layer 82 side of the lower structural body 12 and the multilayer wiring layer 102 side of the upper structural body 11 are pasted together. In FIG. 23, a pasting surface between the multilayer wiring layer 82 of the lower structural body 12 and the multilayer wiring layer 102 of the upper structural body 11 is indicated by a one-dot chain line.

Furthermore, in the layered structural body 13 of the solid-state image pickup device 1, the wiring layer 103 of the upper structural body 11 and the wiring layer 83 of the lower structural body 12 are connected together by the two through-electrodes of the through-silicon-electrode 109 and the through-chip-electrode 105, and the wiring layer 83 of the lower structural body 12 and the external terminal (back surface electrode) 14 are connected together by the through-via 88 and the rewiring line 90. As a result, the pixel signal generated by the pixel 31 of the upper structural body 11 is transmitted to the lower structural body 12, subjected to signal processing in the lower structural body 12, and output from the external terminal 14 to the outside of the device.

<11. Manufacturing Method>

<Manufacturing Method in Case of Twin Contact Structure>

Next, with reference to FIGS. 24 to 38, a method will be described of manufacturing the solid-state image pickup device 1 having a twin contact structure.

Initially, the lower structural body 12 and the upper structural body 11 each in the wafer state are separately manufactured.

As the lower structural body 12, the input/output circuit unit 49, and a multilayer wiring layer 82 to be a part of the row drive unit 22 or the column signal processing unit 25 are formed in a region to be each chip portion of the silicon substrate (silicon wafer) 81. The semiconductor substrate 81 at this point is in a state before being thinned, and has a thickness of about 600 μm, for example.

On the other hand, as the upper structural body 11, the photodiode 51 of each pixel 31 and the source/drain region of the pixel transistor are formed in a region to be a chip portion of the silicon substrate (silicon wafer) 101. Furthermore, a multilayer wiring layer 102 constituting the row drive signal line 32, the vertical signal line 33, and the like is formed on one surface of the semiconductor substrate 101. The semiconductor substrate 101 at this point is also in a state before being thinned, and has a thickness of about 600 μm, for example.

Figure 24:
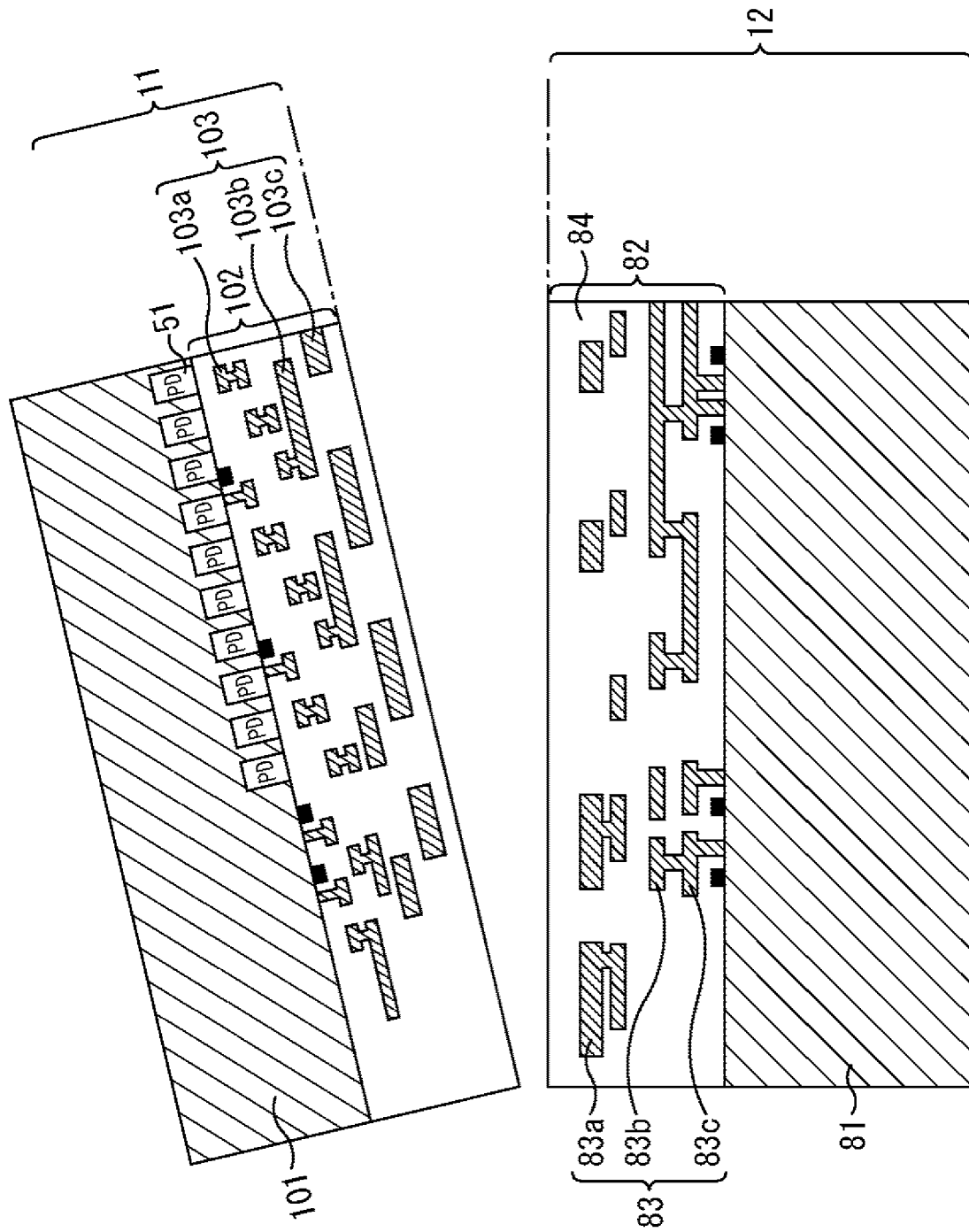
FIG. 24 is a diagram for explaining a method of manufacturing the solid-state image pickup device with a twin contact structure.
Figure 25:
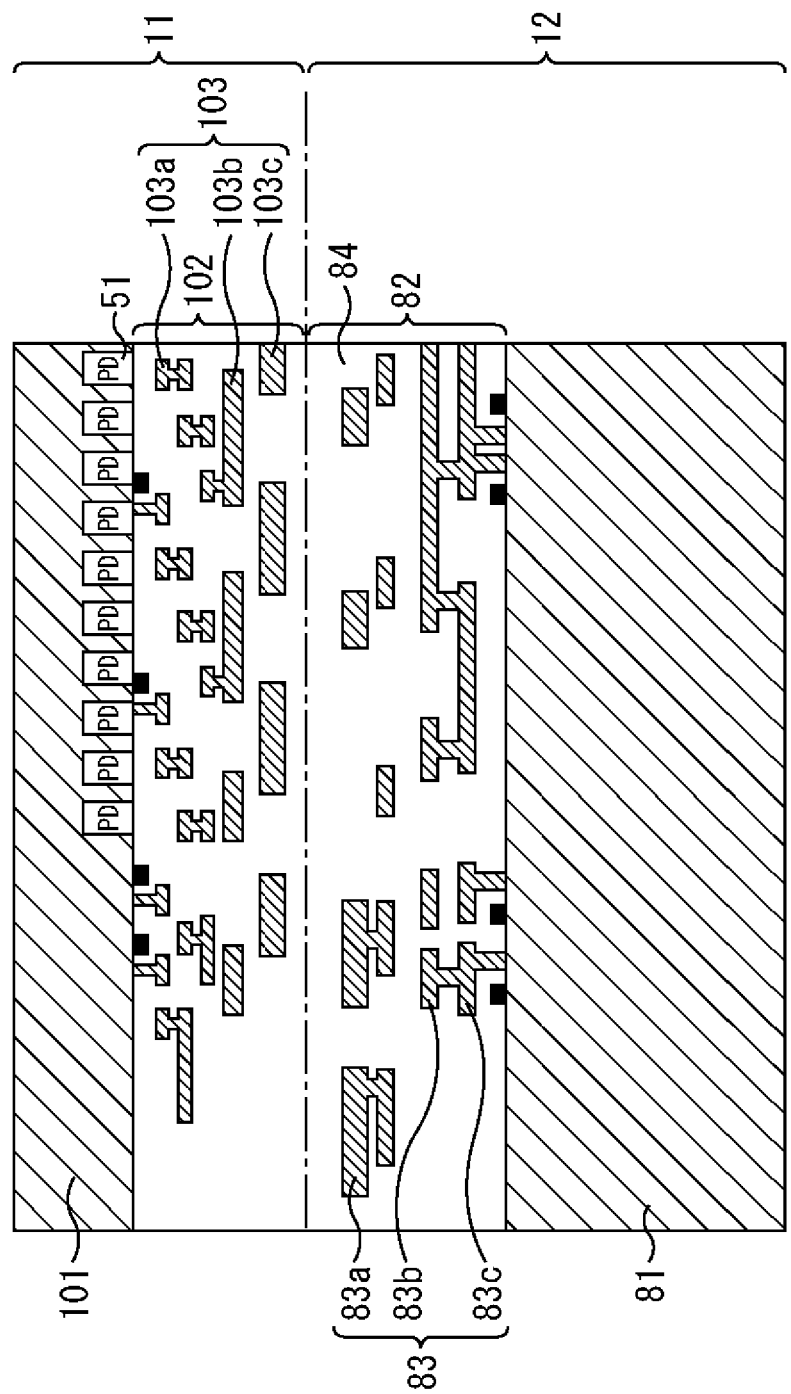
FIG. 25 is a diagram for explaining the method of manufacturing the solid-state image pickup device with the twin contact structure.

Then, as illustrated in FIG. 24, after the multilayer wiring layer 82 side of the lower structural body 12 and the multilayer wiring layer 102 side of the upper structural body 11 each in the manufactured wafer state are pasted together to face each other, as illustrated in FIG. 25, the semiconductor substrate 101 of the upper structural body 11 is thinned. For pasting, for example, there are plasma bonding and bonding with an adhesive, but in the present embodiment, the pasting is assumed to be performed by the plasma bonding. In the case of the plasma bonding, a film such as a plasma TEOS film, a plasma SiN film, a SiON film (block film), or a SiC film is formed on each of the bonding surfaces of the upper structural body 11 and the lower structural body 12, and the bonding surfaces are subjected to plasma treatment and superposed on each other, and then annealing treatment is performed to bond the both structural bodies together.

Figure 26:
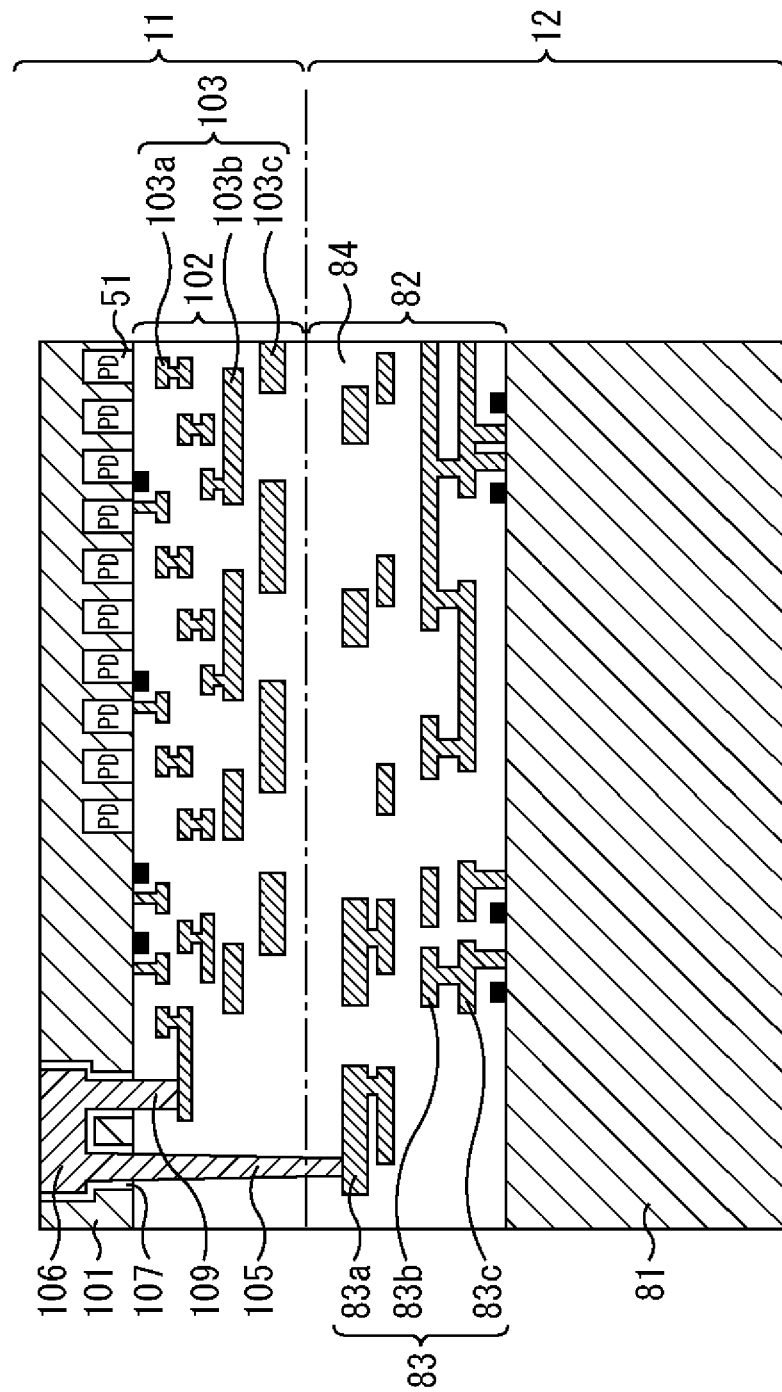
FIG. 26 is a diagram for explaining the method of manufacturing the solid-state image pickup device with the twin contact structure.

After the semiconductor substrate 101 of the upper structural body 11 is thinned, as illustrated in FIG. 26, the through-silicon-electrode 109 and the through-chip-electrode 105, and the connection wiring line 106 for connecting the electrodes are formed by using a damascene method or the like, in a region to be the upper and lower wiring lines connection region 314.

Figure 27:
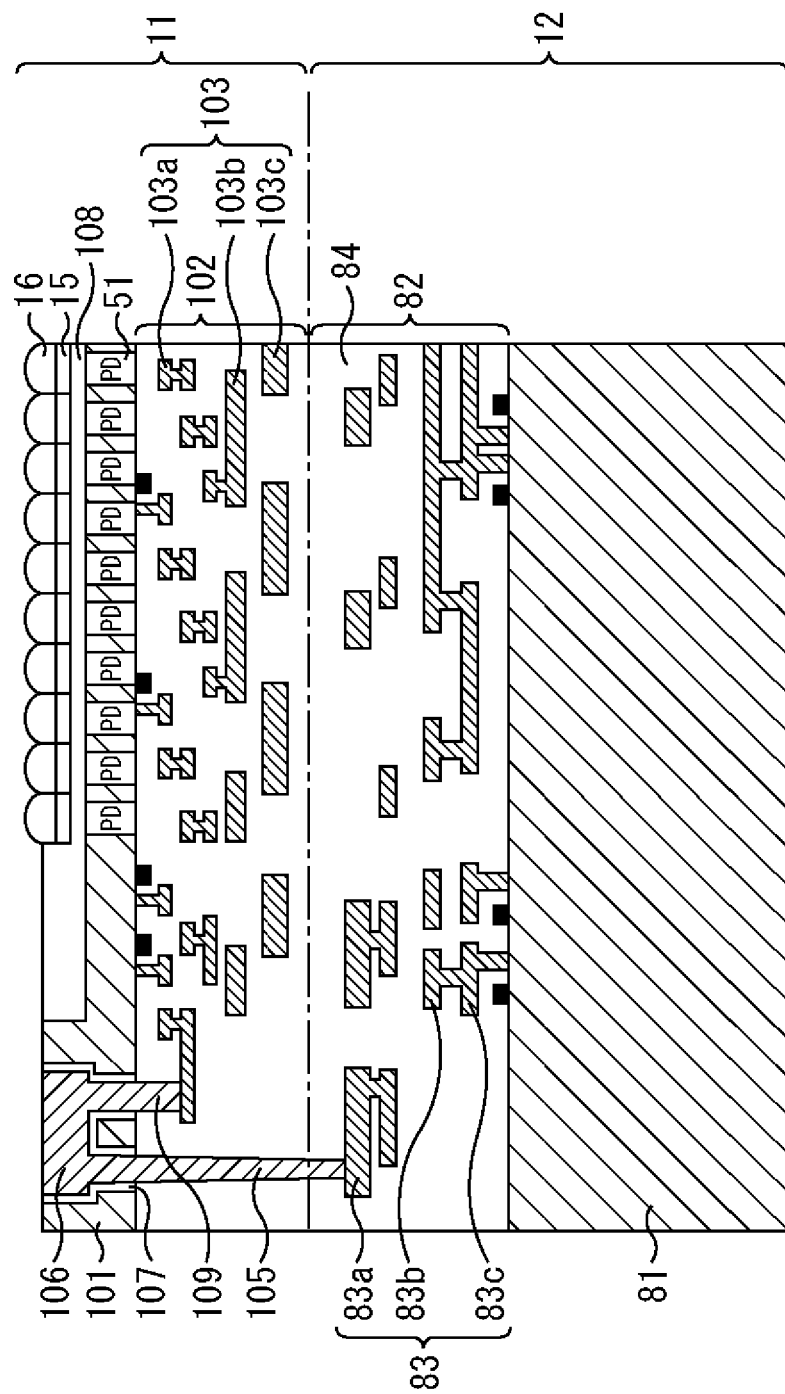
FIG. 27 is a diagram for explaining the method of manufacturing the solid-state image pickup device with the twin contact structure.

Next, as illustrated in FIG. 27, the color filter 15 and the on-chip lens 16 are formed above the photodiode 51 of each pixel 31 via the flattening film 108.

Figure 28:
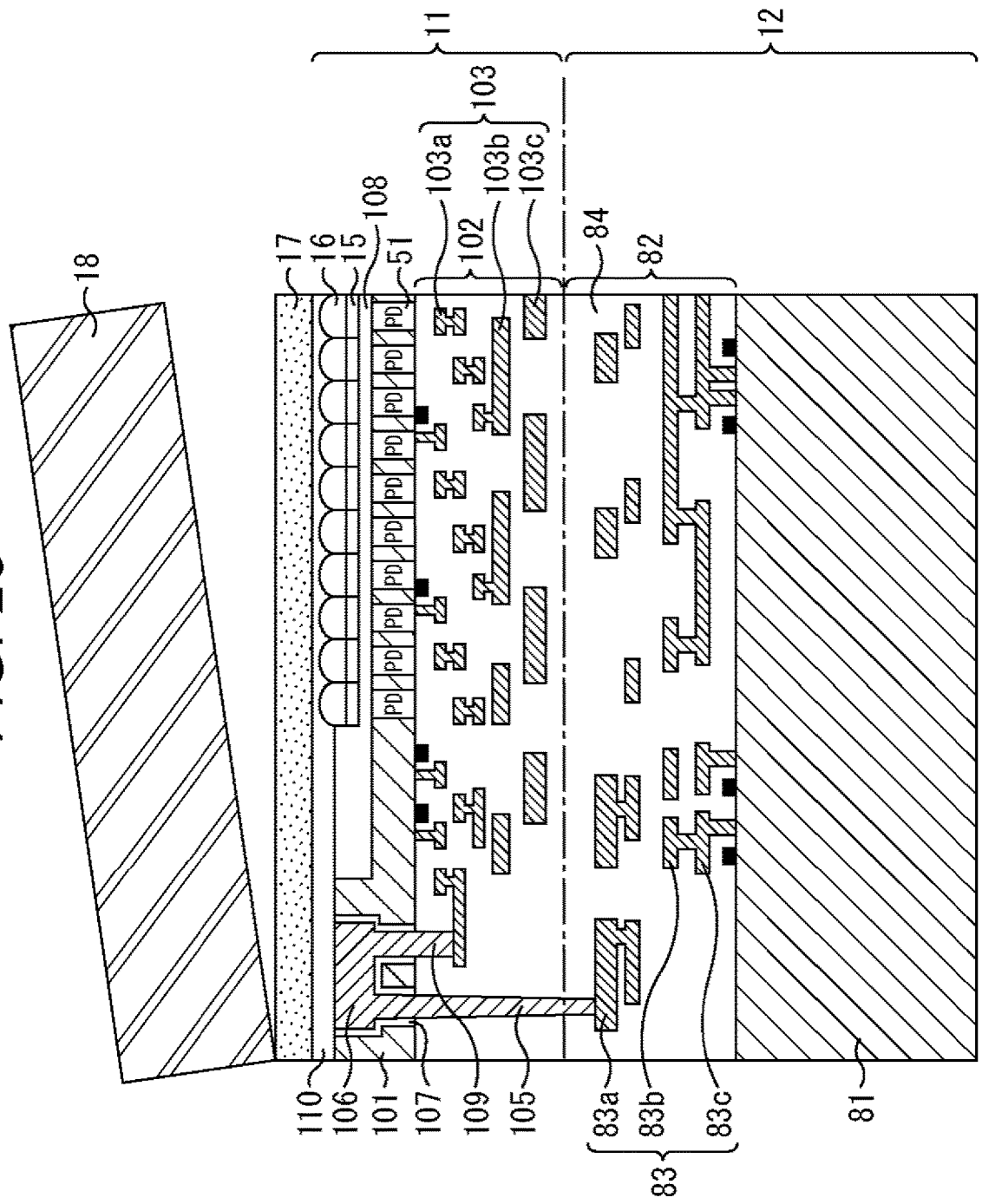
FIG. 28 is a diagram for explaining the method of manufacturing the solid-state image pickup device with the twin contact structure.
Figure 29:
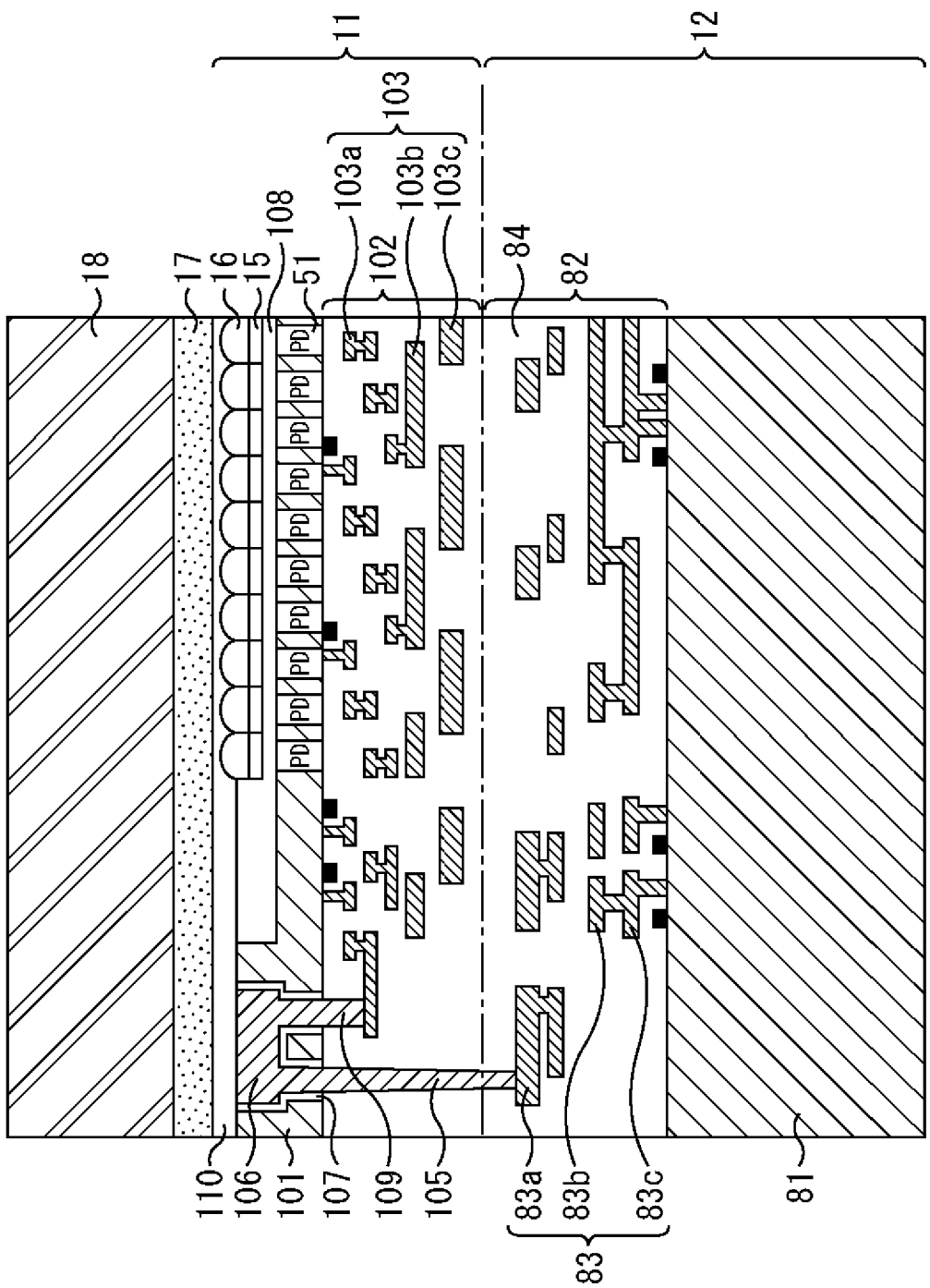
FIG. 29 is a diagram for explaining the method of manufacturing the solid-state image pickup device with the twin contact structure.

Then, as illustrated in FIG. 28, on the entire surface on which the on-chip lens 16 includes the layered structural body 13 in which the upper structural body 11 and the lower structural body 12 are pasted together, the glass seal resin 17 is applied via the flattening film 110, and as illustrated in FIG. 29, the glass protective substrate 18 is connected thereto, with a cavity-less structure.

Figure 30:
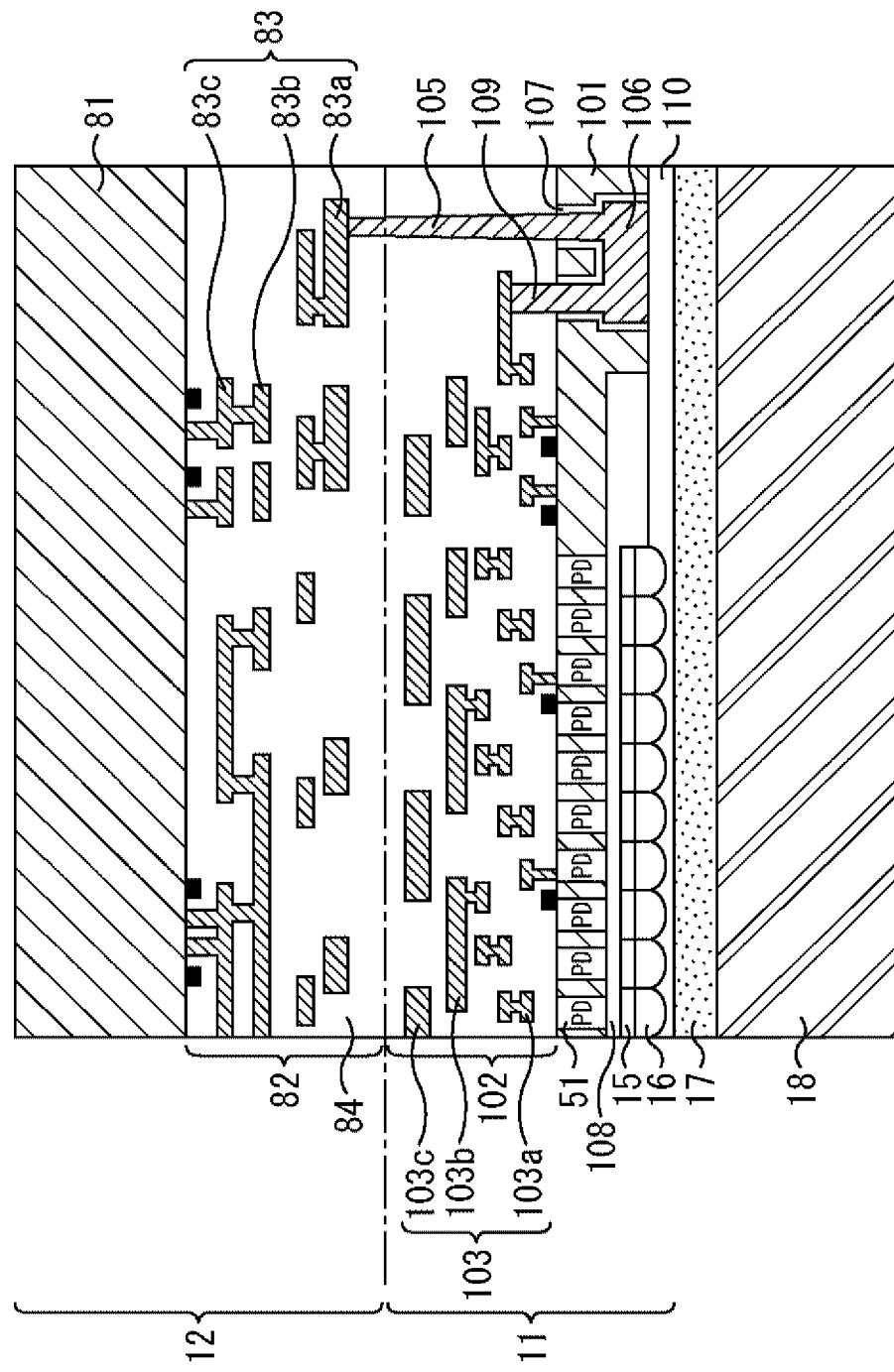
FIG. 30 is a diagram for explaining the method of manufacturing the solid-state image pickup device with the twin contact structure.

Next, as illustrated in FIG. 30, after the entire layered structural body 13 is inverted, the semiconductor substrate 81 of the lower structural body 12 is thinned to have a thickness to the extent that it does not affect device characteristics, for example, about 30 μm to 100 μm.

Figure 31:
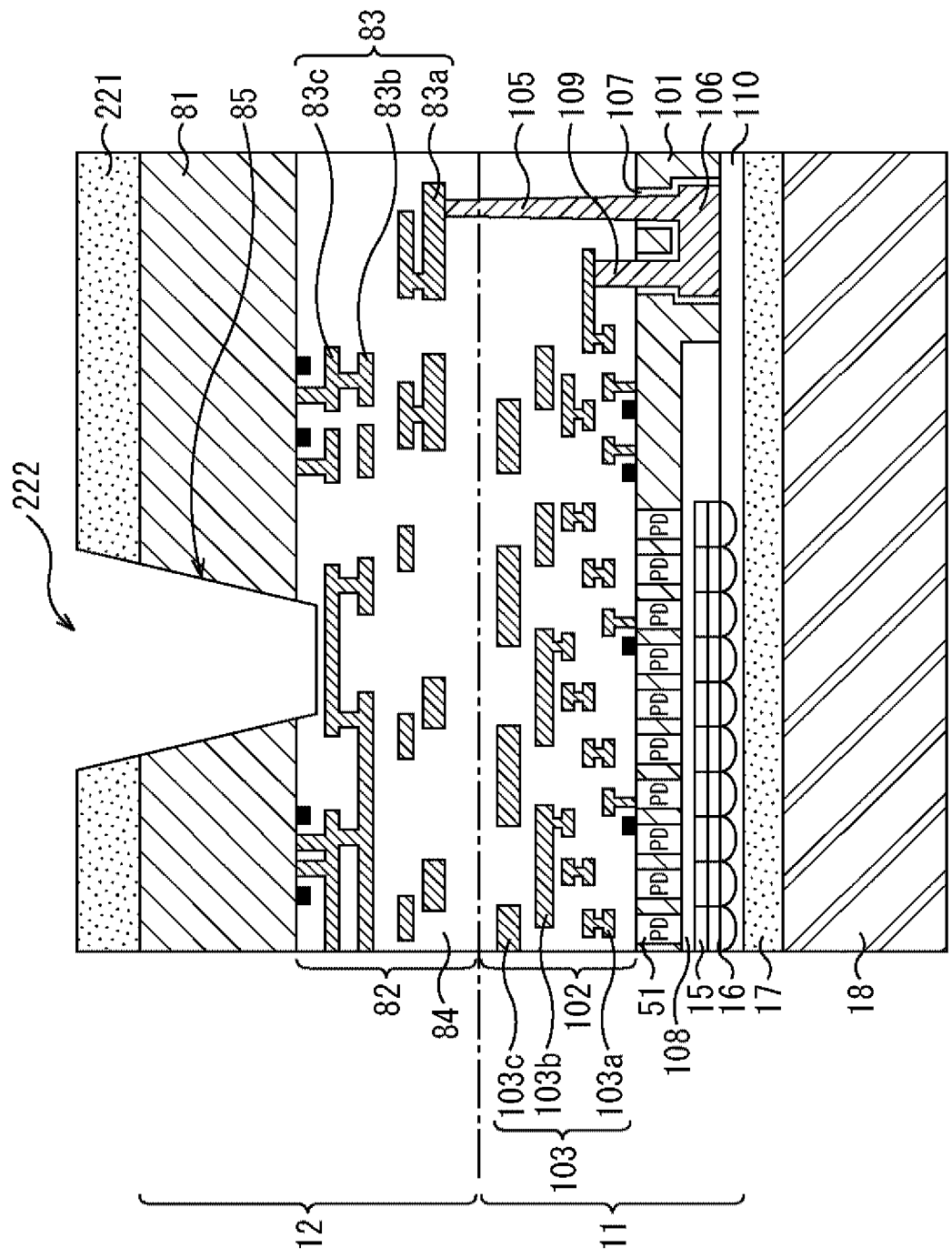
FIG. 31 is a diagram for explaining the method of manufacturing the solid-state image pickup device with the twin contact structure.

Next, as illustrated in FIG. 31, after photoresist 221 is patterned to open a position where the through-via 88 (not illustrated) is arranged on the thinned semiconductor substrate 81, the semiconductor substrate 81 and a part of the interlayer insulating film 84 under the semiconductor substrate 81 are removed by dry etching, and an opening 222 is formed.

Figure 32:
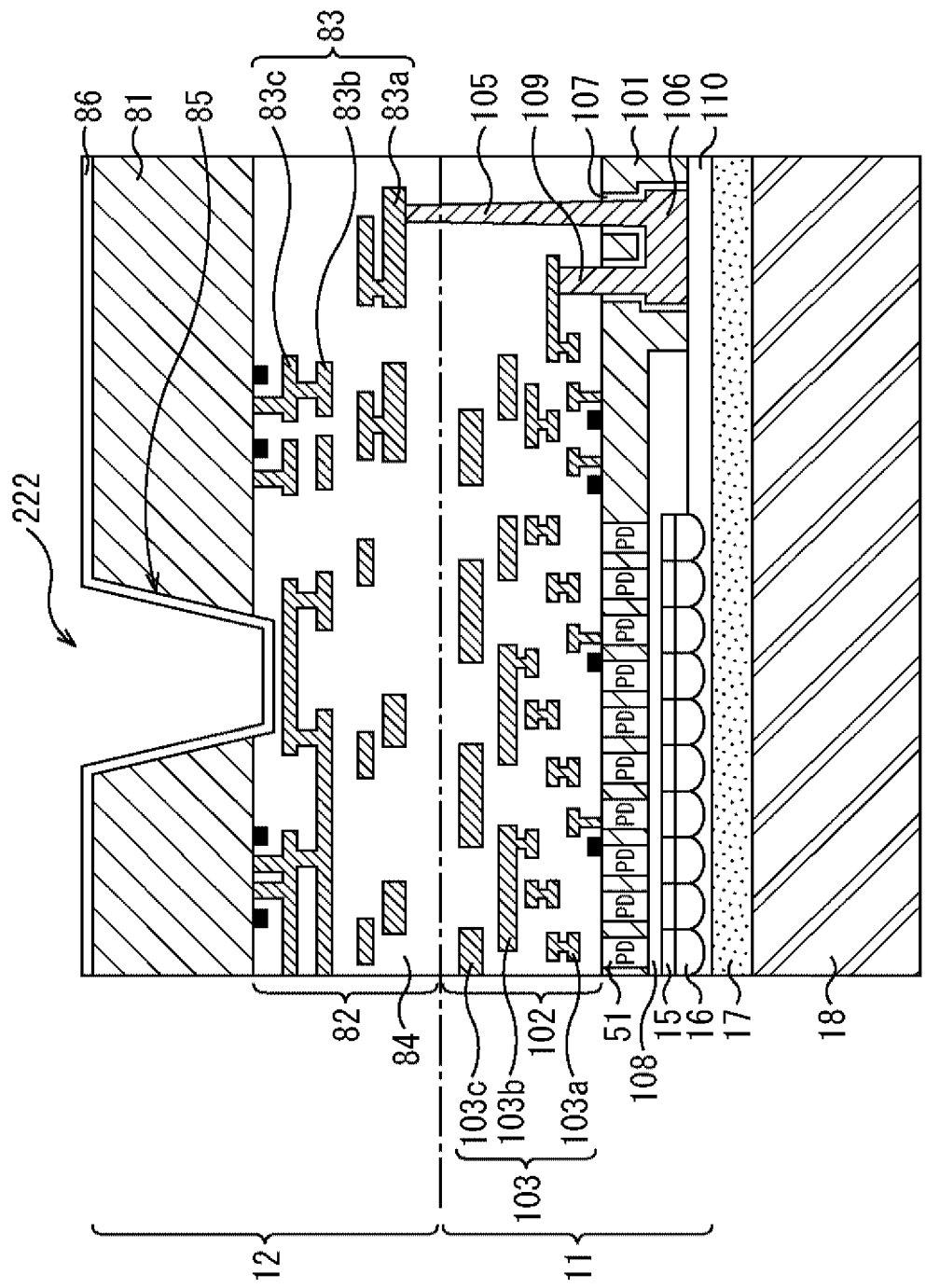
FIG. 32 is a diagram for explaining the method of manufacturing the solid-state image pickup device with the twin contact structure.

Next, as illustrated in FIG. 32, the insulating film (isolation film) 86 is formed over the entire upper surface of the semiconductor substrate 81 including the opening 222 by, for example, a plasma CVD method. As described above, the insulating film 86 can be, for example, SiO2 film, SiN film, or the like.

Figure 33:
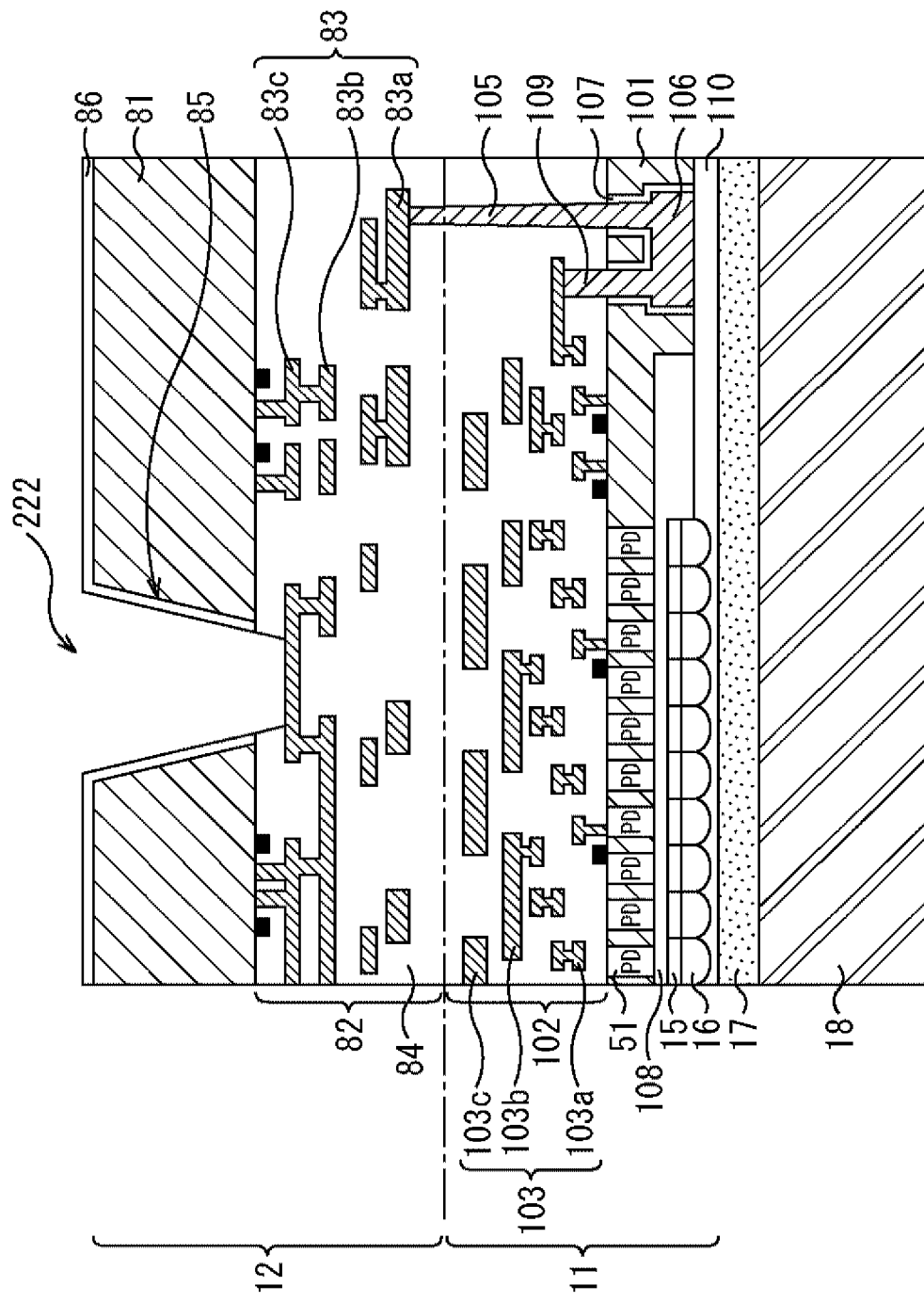
FIG. 33 is a diagram for explaining the method of manufacturing the solid-state image pickup device with the twin contact structure.

Next, as illustrated in FIG. 33, the insulating film 86 on the bottom surface of the opening 222 is removed by an etch-back method, and the wiring layer 83c closest to the semiconductor substrate 81 is exposed.

Figure 34:
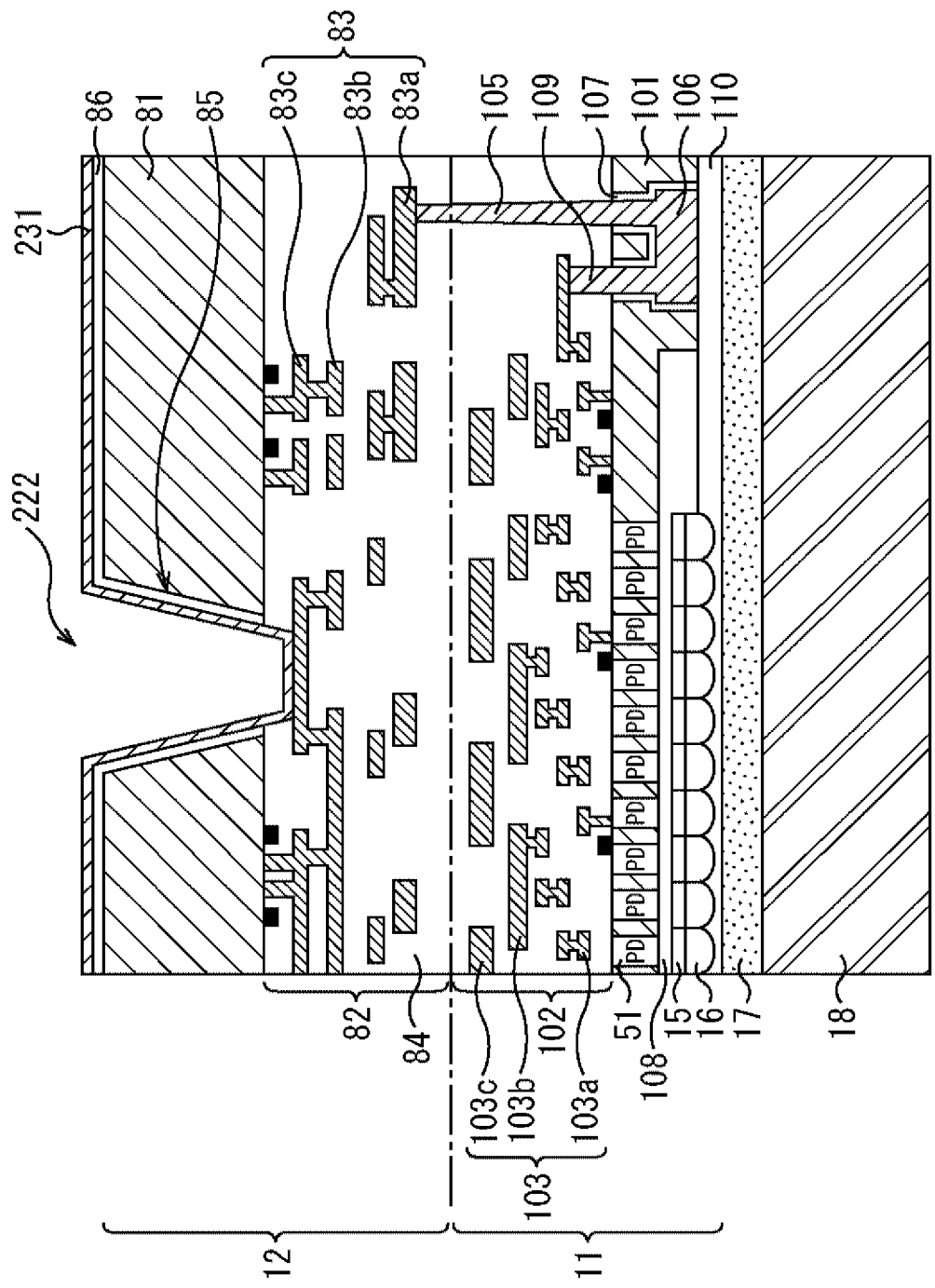
FIG. 34 is a diagram for explaining the method of manufacturing the solid-state image pickup device with the twin contact structure.

Next, as illustrated in FIG. 34, a barrier metal film (not illustrated) and a Cu seed layer 231 are formed by using a sputtering method. The barrier metal film is a film for preventing diffusion of the connection conductor 87 (Cu) illustrated in FIG. 35, and the Cu seed layer 231 serves as an electrode for embedding the connection conductor 87 by an electrolytic plating method. As a material of the barrier metal film, tantalum (Ta), titanium (Ti), tungsten (W), zirconium (Zr), a nitride film thereof, a carbonized film thereof, or the like can be used. In the present embodiment, titanium is used as the barrier metal film.

Figure 35:
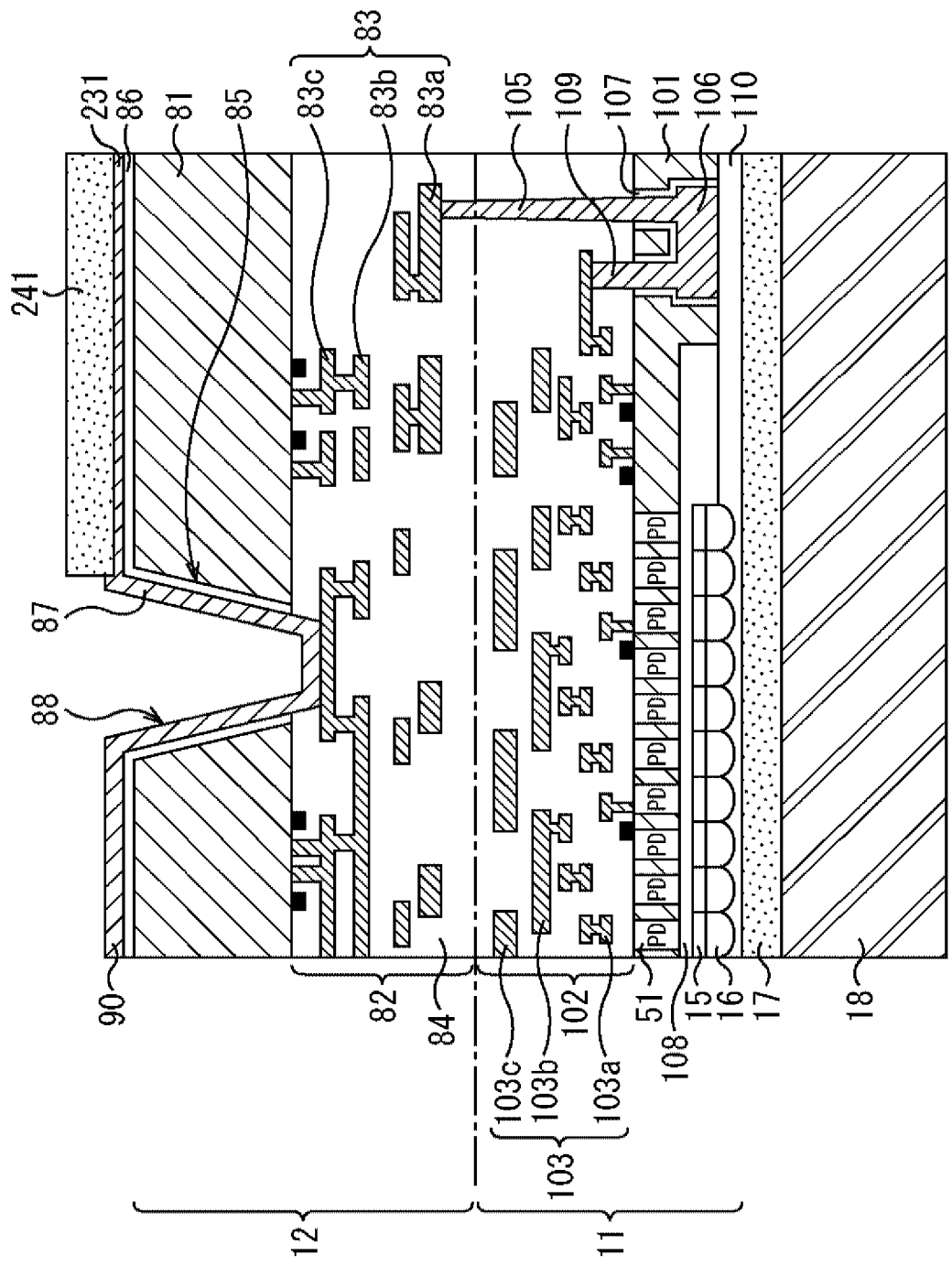
FIG. 35 is a diagram for explaining the method of manufacturing the solid-state image pickup device with the twin contact structure.

Next, as illustrated in FIG. 35, after a resist pattern 241 is formed on a required region on the Cu seed layer 231, copper (Cu) as the connection conductor 87 is plated by the electrolytic plating method. As a result, the through-via 88 is formed, and the rewiring line 90 is also formed on the upper side of the semiconductor substrate 81.

Figure 36:
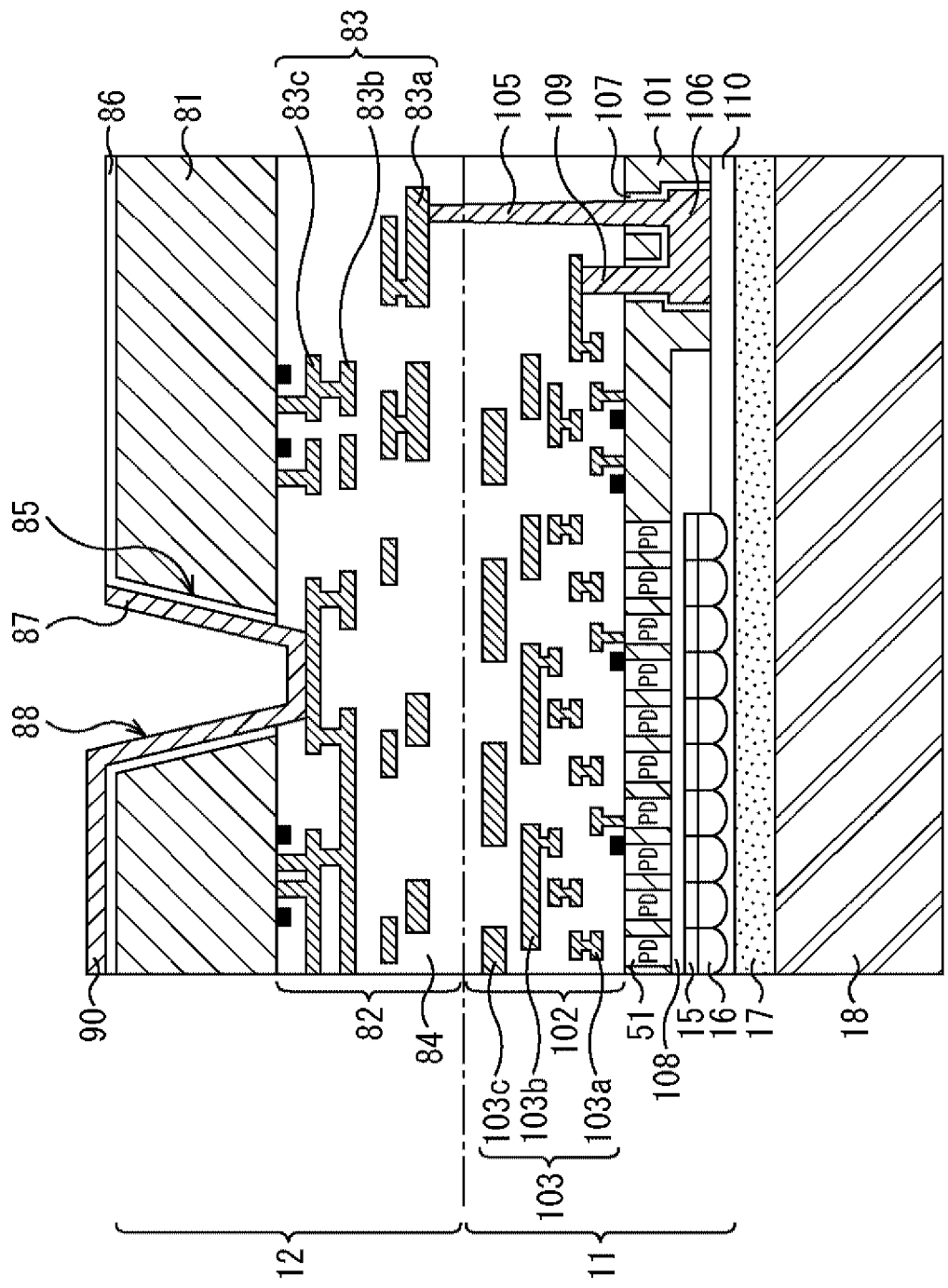
FIG. 36 is a diagram for explaining the method of manufacturing the solid-state image pickup device with the twin contact structure.

Next, as illustrated in FIG. 36, after the resist pattern 241 is removed, the barrier metal film (not illustrated) and the Cu seed layer 231 under the resist pattern 241 are removed by wet etching.

Figure 37:
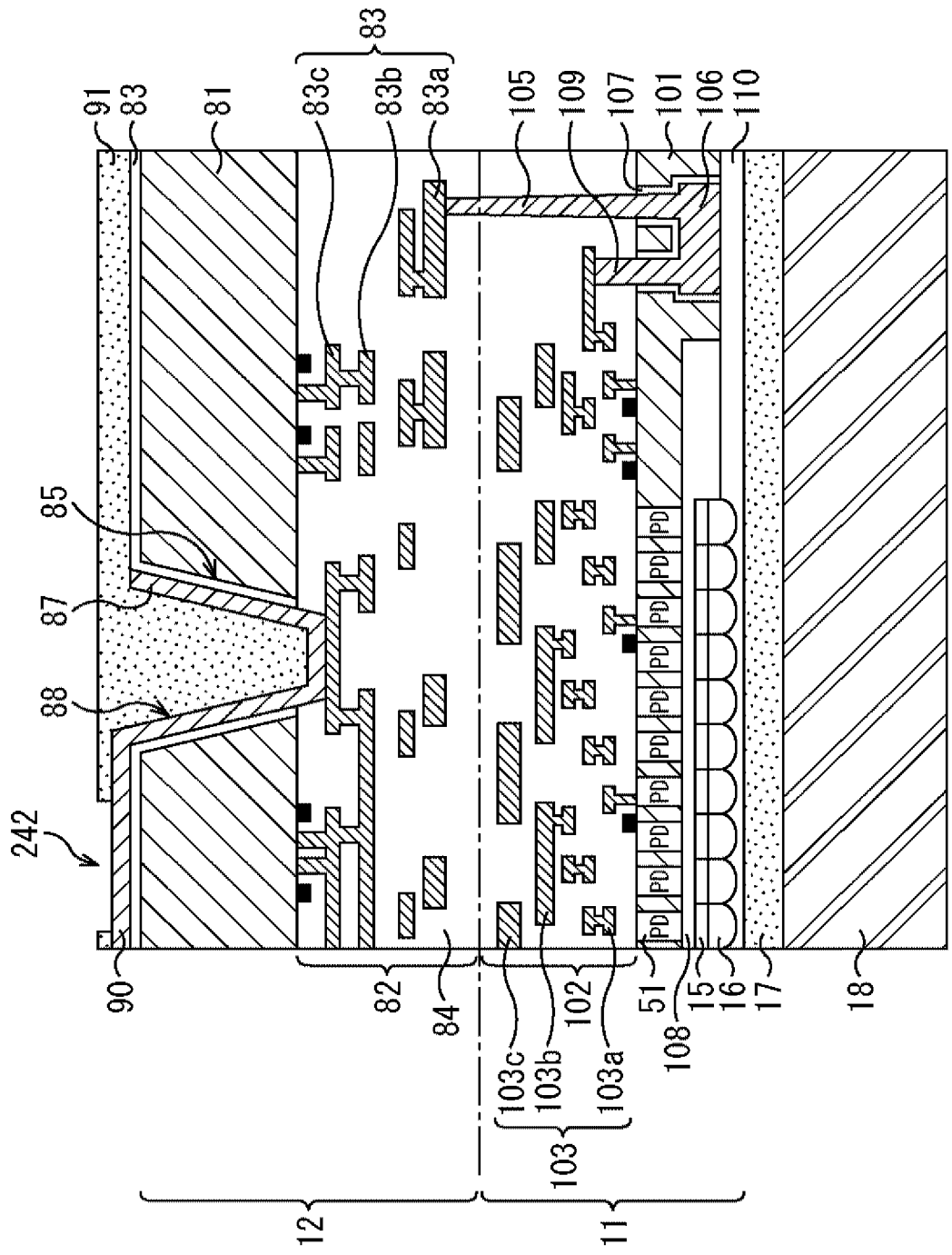
FIG. 37 is a diagram for explaining the method of manufacturing the solid-state image pickup device with the twin contact structure.

Next, as illustrated in FIG. 37, after the solder mask 91 is formed and the rewiring line 90 is protected, the solder mask 91 is removed only in a region where the external terminal 14 is to be mounted, whereby a solder mask opening 242 is formed.

Figure 38:
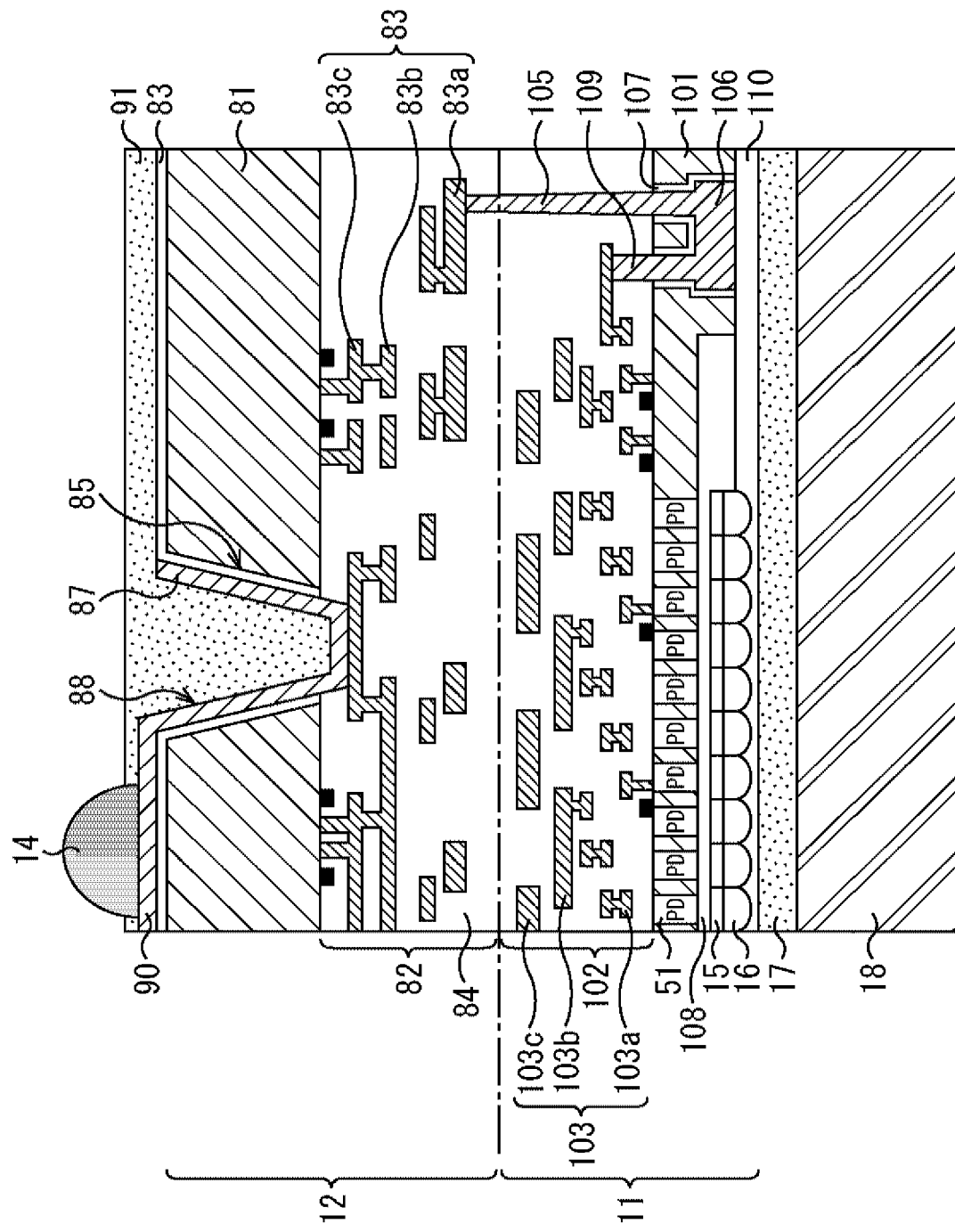
FIG. 38 is a diagram for explaining the method of manufacturing the solid-state image pickup device with the twin contact structure.

Then, as illustrated in FIG. 38, the external terminal 14 is formed in the solder mask opening 242 by a solder ball mounting method or the like.

As described above, according to the manufacturing method of the present disclosure, first, the upper structural body 11 (first semiconductor substrate) on which the photodiode 51 that performs photoelectric conversion, the pixel transistor circuit, and the like are formed, and the lower structural body 12 (second semiconductor substrate) formed such that the input/output circuit unit 49 for outputting the pixel signal output from the pixel 31 to the outside of the solid-state image pickup device 1 is below the pixel array unit 24, are pasted together so that the wiring layers face each other. Then, the through-via 88 penetrating through the lower structural body 12 is formed, and the external terminal 14 is formed that is electrically connected to the outside of the solid-state image pickup device 1 via the input/output circuit unit 49 and the through-via 88. As a result, the solid-state image pickup device 1 illustrated in FIG. 5 can be manufactured.

According to the manufacturing method of the present disclosure, since the through-via 88 is formed by using the glass protective substrate 18 as a support substrate, the through-via 88 has a shape digging from the external terminal 14 side to the wiring layer 83 (circuit) side.

<Manufacturing Method in Case of Cu—Cu Direct Bonding Structure>

Next, with reference to FIGS. 39 to 43, a method will be described of manufacturing the solid-state image pickup device 1 in a case where the lower structural body 12 and the upper structural body 11 are connected together by a Cu—Cu direct bonding structure.

Initially, the lower structural body 12 and the upper structural body 11 each in the wafer state are separately manufactured, similarly to the manufacturing method in a case where the twin contact structure is adopted as the upper and lower wiring lines connection structure.

Figure 39:
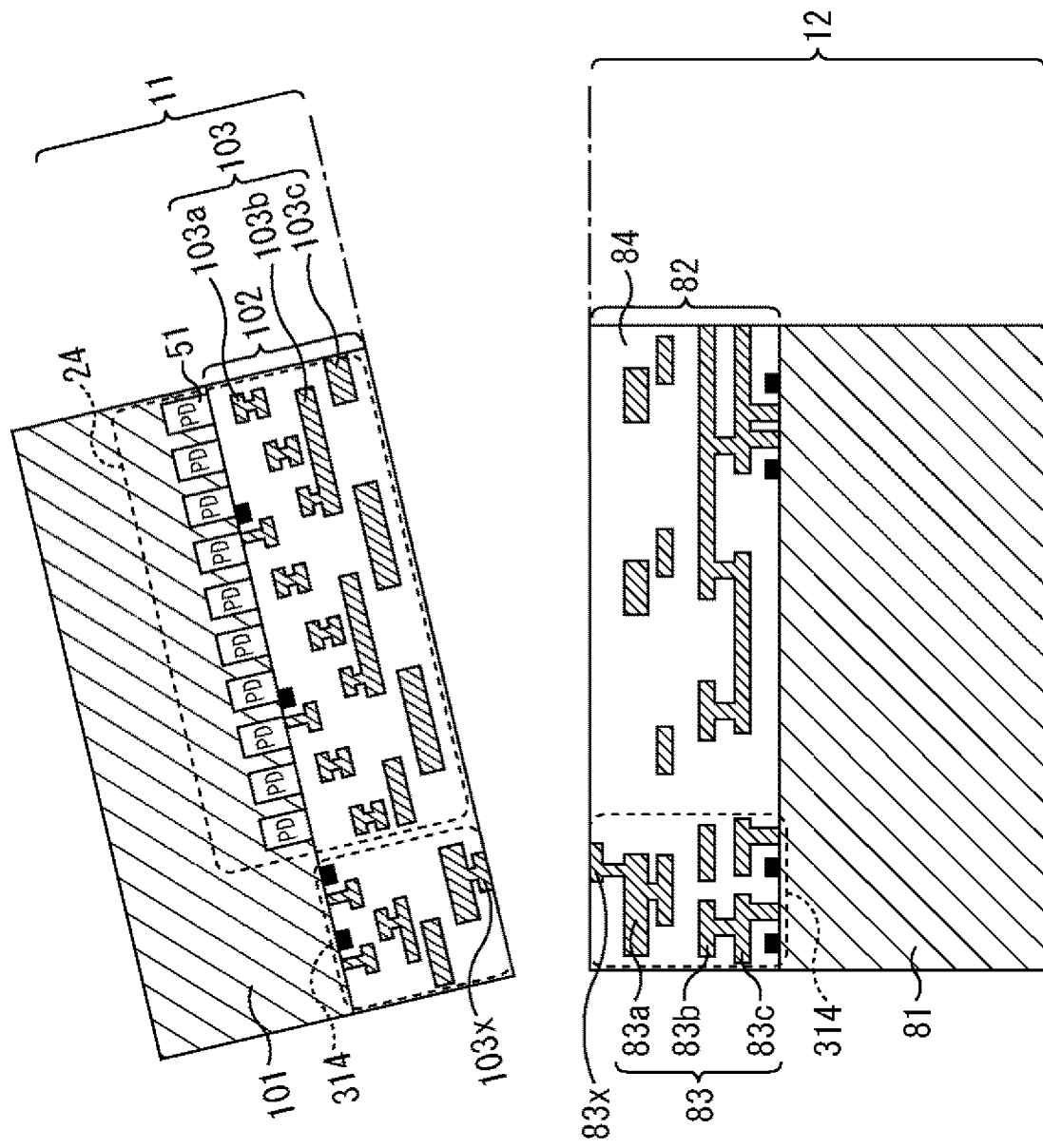
FIG. 39 is a diagram for explaining a method of manufacturing the solid-state image pickup device in FIG. 5 with a Cu—Cu direct bonding structure.

However, as a point different from the twin contact structure, as illustrated in FIG. 39, in the upper and lower wiring lines connection region 314 on the further outside of the pixel array unit 24, in the upper structural body 11, a wiring layer 103x for directly connecting to a wiring layer 83x of the lower structural body 12 is formed on the further lower structural body 12 side from the lowermost wiring layer 103c closest to the lower structural body 12.

Similarly, in the upper and lower wiring lines connection region 314, also in the lower structural body 12, the wiring layer 83x for directly connecting to the wiring layer 103x of the upper structural body 11 is formed on the further upper structural body 11 side from the uppermost wiring layer 83a closest to the upper structural body 11.

Figure 40:
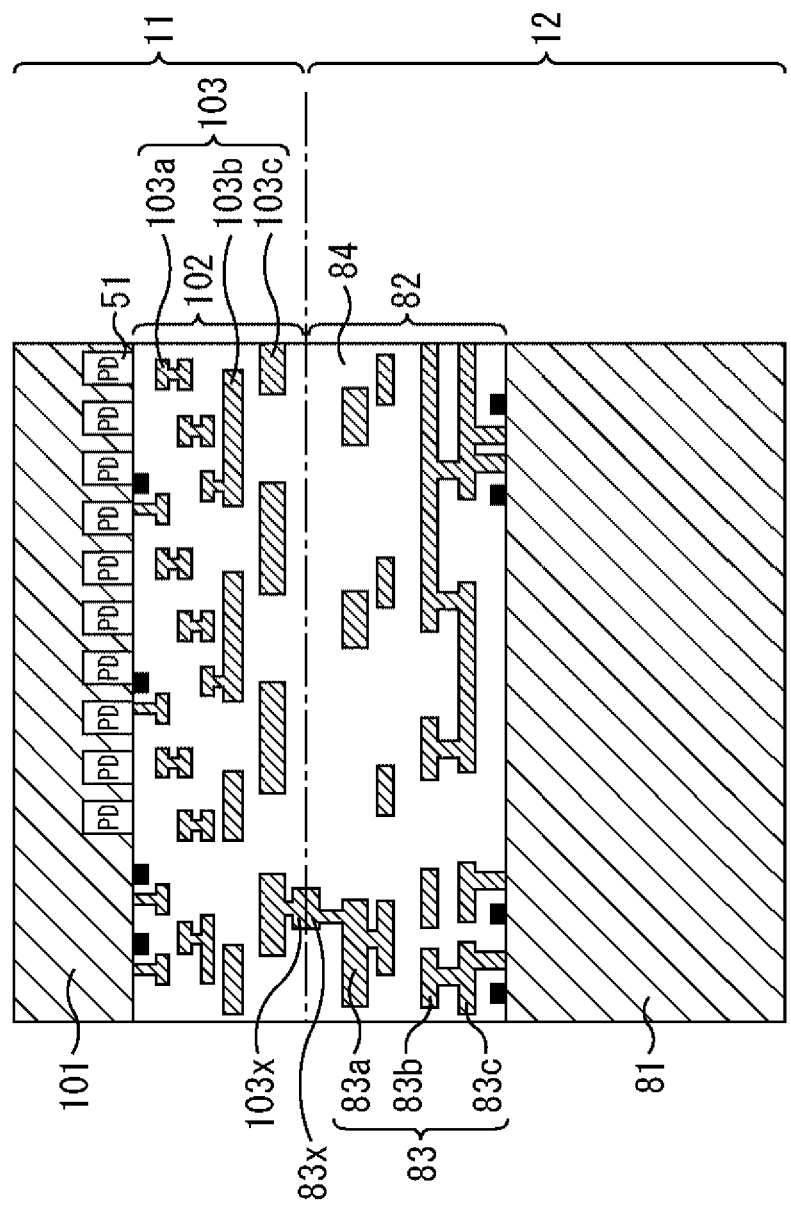
FIG. 40 is a diagram for explaining the method of manufacturing the solid-state image pickup device in FIG. 5 with the Cu—Cu direct bonding structure.

Then, as illustrated in FIG. 40, after the multilayer wiring layer 82 side of the lower structural body 12 and the multilayer wiring layer 102 side of the upper structural body 11 are pasted together to face each other, the semiconductor substrate 101 of the upper structural body 11 is thinned. By this pasting, the wiring layer 83x of the lower structural body 12 and the wiring layer 103x of the upper structural body 11 are connected together by metal bond (Cu—Cu bonding).

Figure 41:
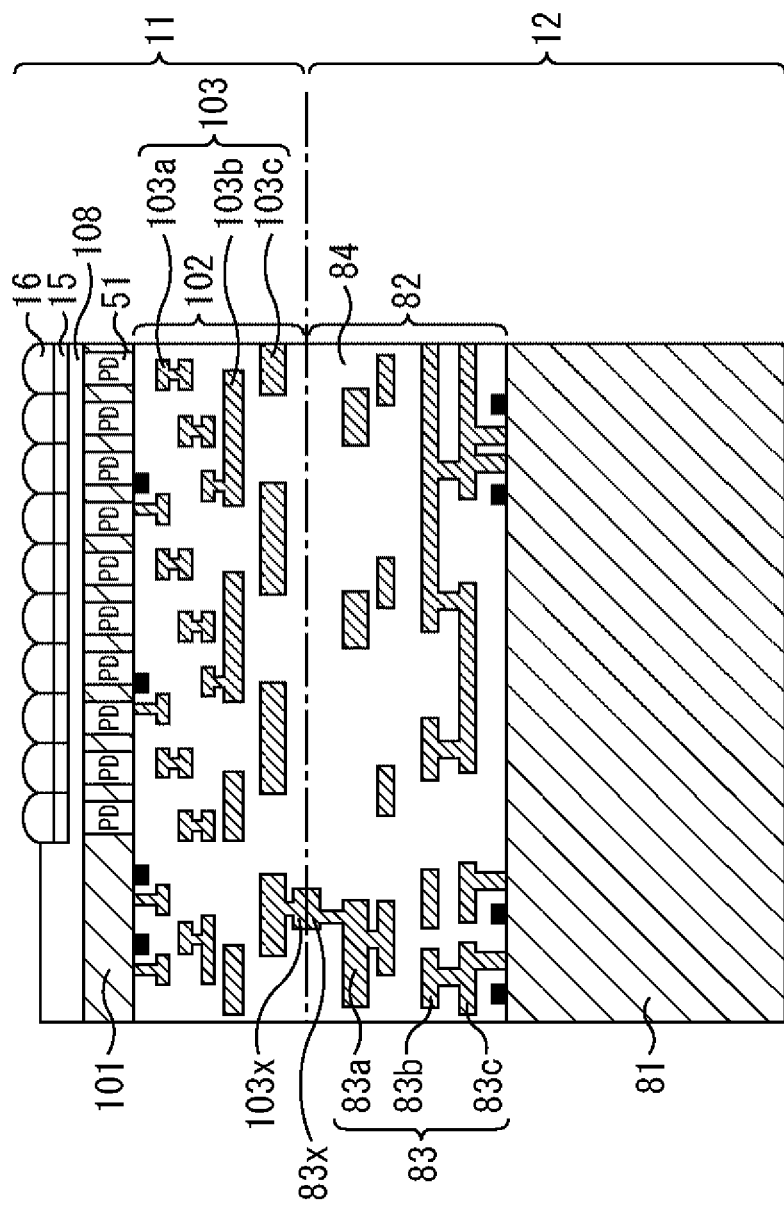
FIG. 41 is a diagram for explaining the method of manufacturing the solid-state image pickup device in FIG. 5 with the Cu—Cu direct bonding structure.

Next, as illustrated in FIG. 41, the color filter 15 and the on-chip lens 16 are formed above the photodiode 51 of each pixel 31 via the flattening film 108.

Figure 42:
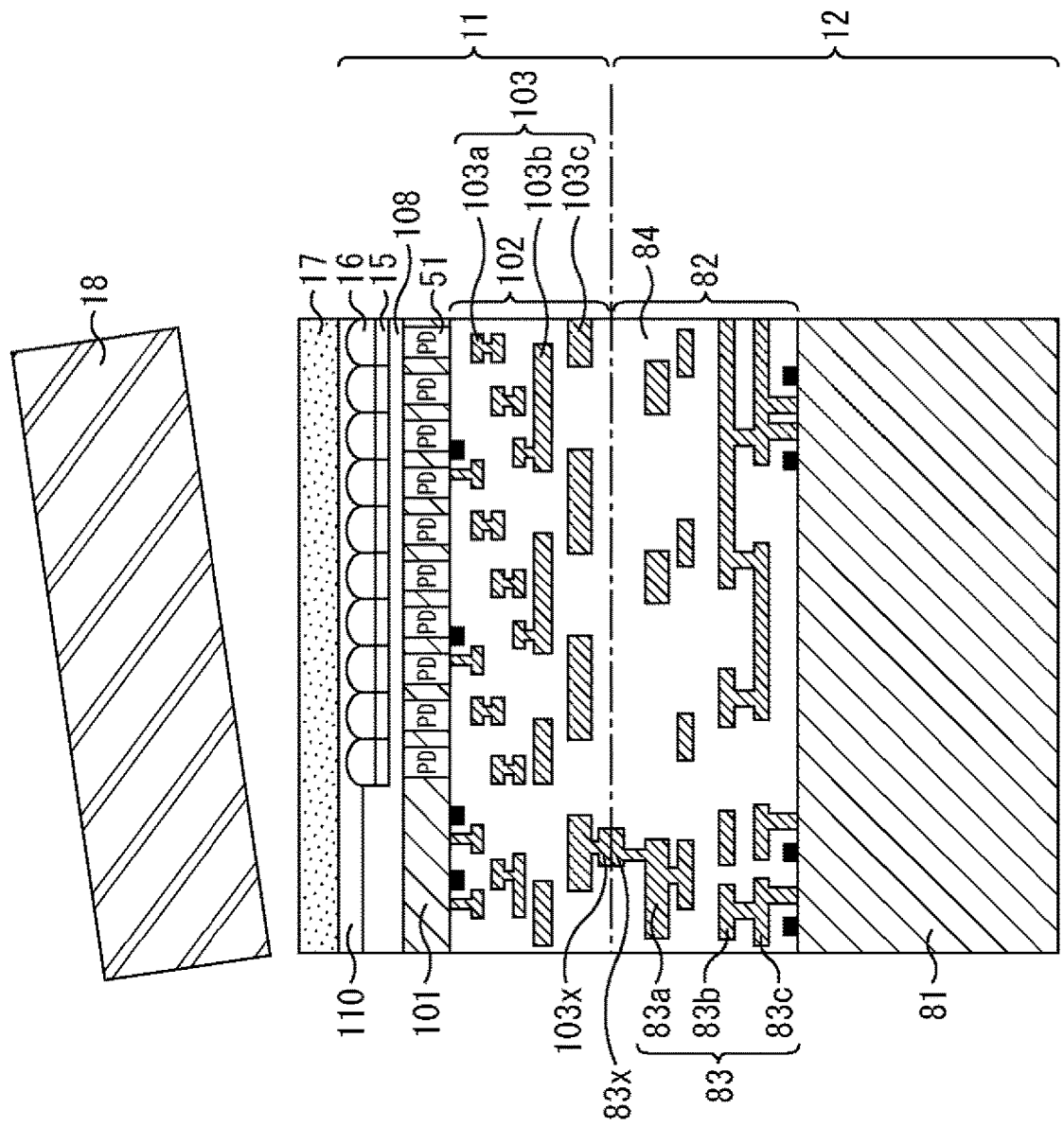
FIG. 42 is a diagram for explaining the method of manufacturing the solid-state image pickup device in FIG. 5 with the Cu—Cu direct bonding structure.

Then, as illustrated in FIG. 42, the glass seal resin 17 is applied via the flattening film 110 to the entire surface on which the on-chip lens 16 includes the lower structural body 12 and the upper structural body 11 pasted together, and the glass protective substrate 18 is connected thereto, with a cavity-less structure.

Note that, in this example, in the lower structural body 12, separately from the wiring layers 83a to 83c to be a part of the input/output circuit unit 49, the row drive unit 22, or the column signal processing unit 25, the wiring layer 83x is formed for directly connecting to the wiring layer 103 of the upper structural body 11, and in the upper structural body 11, separately from the wiring layers 103a to 103c to be a drive wiring line of the pixel transistor, and the like, the wiring layer 103x is formed for directly connecting to the wiring layer 83 of the lower structural body 12; however, of course, the uppermost wiring layer 83a of the lower structural body 12 and the lowermost wiring layer 103c of the upper structural body 11 may be connected together by metal bond (Cu—Cu bonding).

Figure 43:
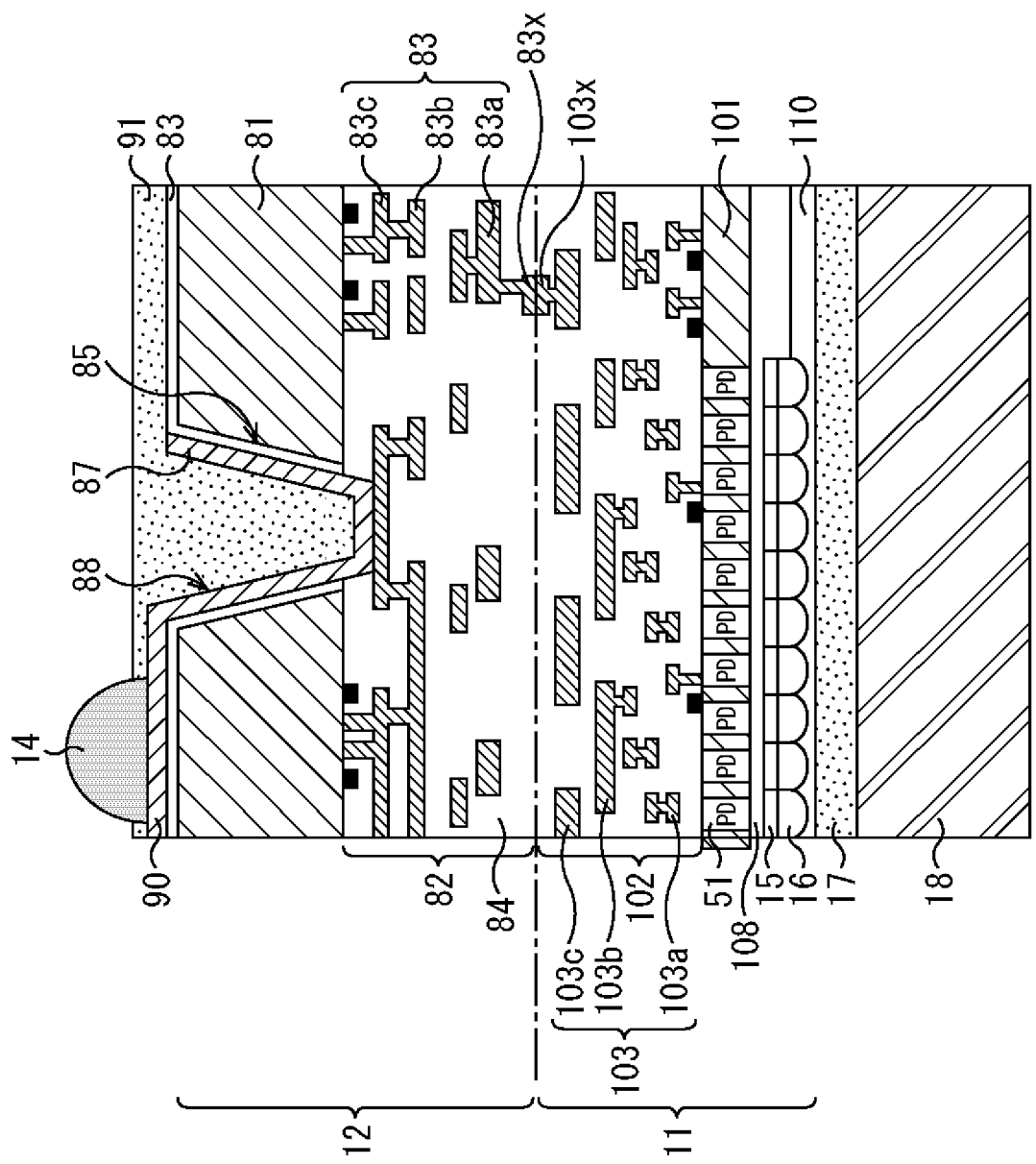
FIG. 43 is a diagram for explaining the method of manufacturing the solid-state image pickup device in FIG. 5 with the Cu—Cu direct bonding structure.

Steps subsequent to the step illustrated in FIG. 42 are similar to the steps given with reference to FIGS. 30 to 38 in the case where the twin contact structure is adopted as the upper and lower wiring lines connection structure. As a final state, a state illustrated in FIG. 43 is obtained.

<12. Further Modifications>
<Further Modification 1>

Next, a further modification of the solid-state image pickup device 1 will be described with reference to FIG. 44.

Figure 44:
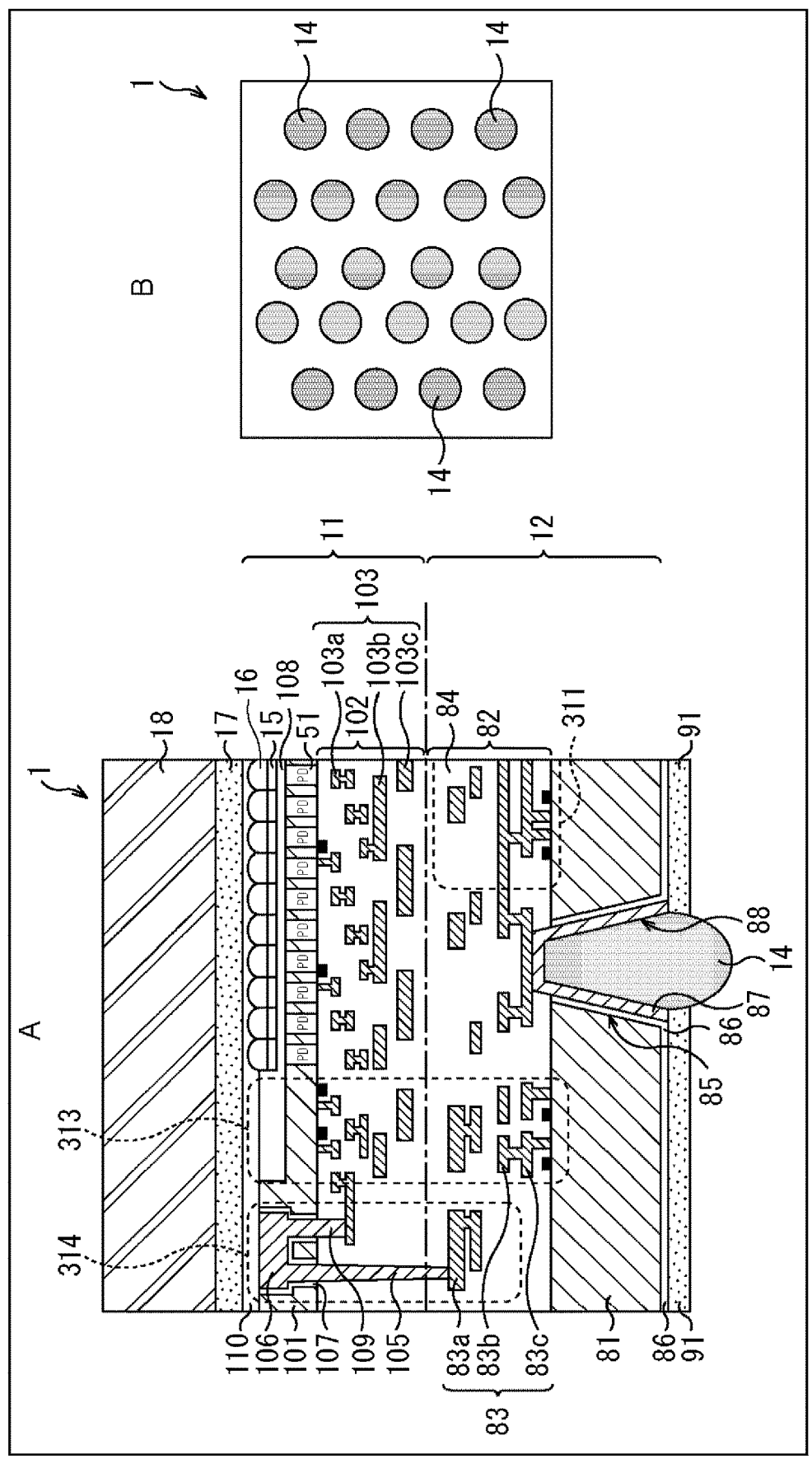
FIG. 44 is a diagram for explaining Further Modification 1 of the solid-state image pickup device.

A of FIG. 44 is a cross-sectional view near the outer periphery of the solid-state image pickup device 1 according to Further Modification 1, and B of FIG. 44 is a plan view of the external terminal 14 side of the solid-state image pickup device 1 according to Further Modification 1.

In Further Modification 1, as illustrated in A of FIG. 44, the external terminal 14 is formed immediately above the through-via 88 to overlap a position of the through-via 88 at a planar position. As a result, as illustrated in B of FIG. 44, since the area for forming the rewiring line 90 is unnecessary on the back surface side of the solid-state image pickup device 1, it is possible to eliminate a shortage of the area forming the input/output unit 21.

<Further Modification 2>

Next, a further modification of the solid-state image pickup device 1 will be described with reference to FIG. 45.

Figure 45:
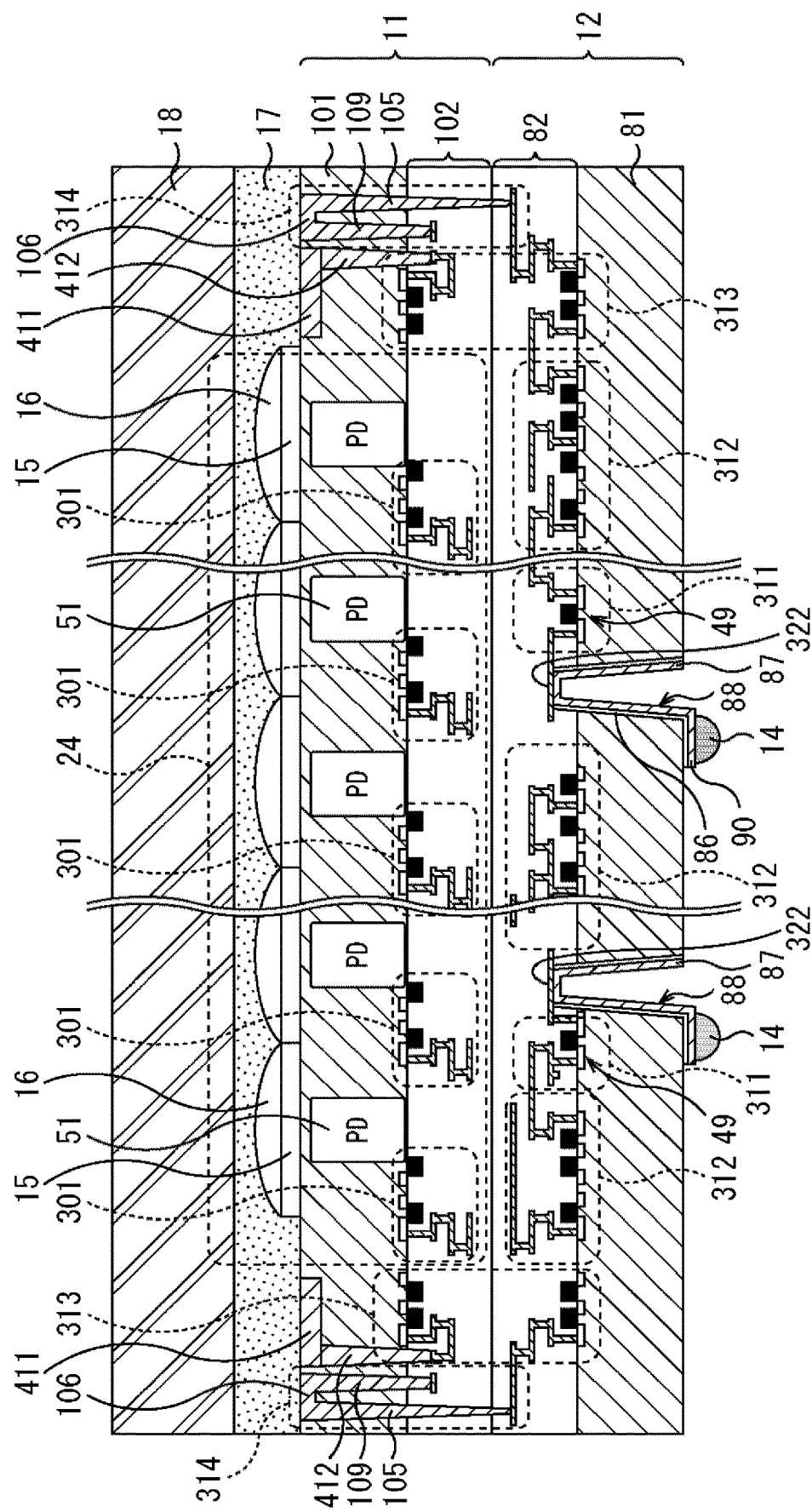
FIG. 45 is a diagram for explaining Further Modification 2 of the solid-state image pickup device.

FIG. 45 is a cross-sectional view of the solid-state image pickup device 1 according to Further Modification 2.

In Further Modification 2, the solid-state image pickup device 1 includes a conductive pad 411 for contact with a measurement probe, for the purpose of measuring operation of the solid-state image pickup device 1 in a state before the solid-state image pickup device 1 is divided into the solid pieces, in other words, in a state in which the plurality of solid-state image pickup devices 1 is mounted on the wafer, by using a general probe type semiconductor device measuring machine, for example.

As illustrated in FIG. 45, the conductive pad 411 for probe measurement is formed in a region outside the pixel array unit 24, for example, on the upper side of the pixel peripheral circuit region 313 where the row drive unit 22, the column signal processing unit 25, and the like are formed. The conductive pad 411 is connected to a predetermined wiring layer 103 of the upper structural body 11 by a through-silicon-electrode 412.

The conductive pad 411 for probe measurement is desirably formed before the protective substrate 18 is arranged on the surface of the solid-state image pickup device 1. As a result, it is possible to measure the operation of the solid-state image pickup device 1 in a state in which the plurality of solid-state image pickup devices 1 is formed on the wafer before the protective substrate 18 is fixed.

The conductive pad 411 for probe measurement may be formed by a part of the multilayer wiring layer 102 included in the upper structural body 11.

Furthermore, the conductive pad 411 for probe measurement may be formed on the upper side of a region for acquiring a reference level signal, in other words, a black level signal, which is included in the solid-state image pickup device 1, the region being generally referred to as an optical black pixel region or simply an optical black region (not illustrated).

By forming the conductive pad 411 for probe measurement on the solid-state image pickup device 1 before fixing the protective substrate 18 of the solid-state image pickup device 1, it is possible to measure the operation of the solid-state image pickup device 1 by using a probe type semiconductor device measuring apparatus, in a state in which the plurality of solid-state image pickup devices 1 is formed on the wafer before the protective substrate 18 is fixed.

<Further Modification 3>

Next, a further modification of the solid-state image pickup device 1 will be described with reference to FIG. 46.

Figure 46:
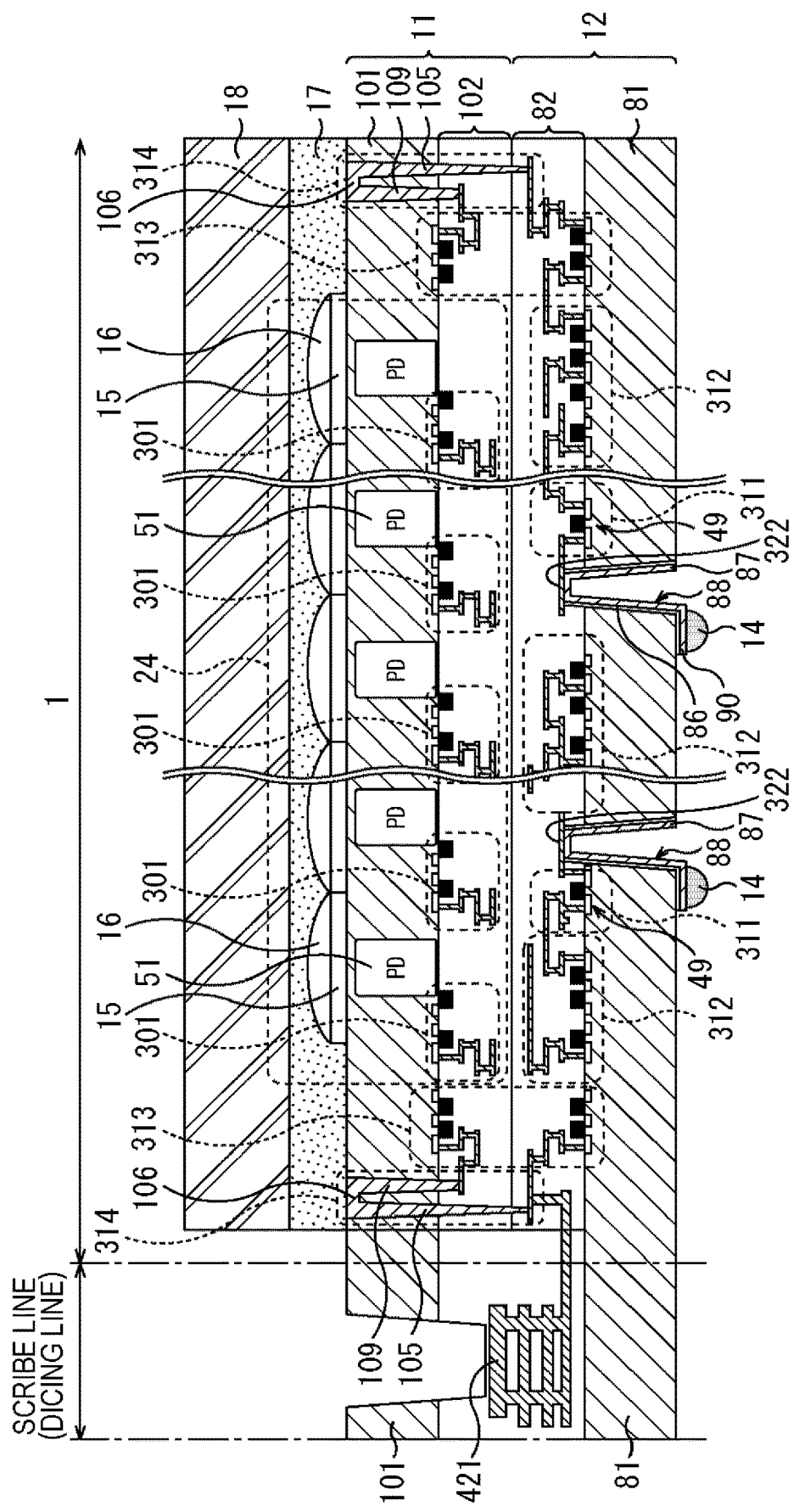
FIG. 46 is a diagram for explaining Further Modification 3 of the solid-state image pickup device.

FIG. 46 is a cross-sectional view of the solid-state image pickup device 1 according to Further Modification 3.

The solid-state image pickup device 1 according to Further Modification 3 also includes a conductive pad 421 for contact with a measurement probe, for the purpose of measuring operation of the solid-state image pickup device 1 in a state before the solid-state image pickup device 1 is divided into the solid pieces, in other words, in a state in which the plurality of solid-state image pickup devices 1 is mounted on the wafer, by using a general probe type semiconductor device measuring machine, for example.

As illustrated in FIG. 46, the conductive pad 421 for probe measurement is formed on a scribe line (dicing line) between the solid-state image pickup devices 1.

The conductive pad 421 for probe measurement is desirably formed before the protective substrate 18 is arranged on the surface of the solid-state image pickup device 1. As a result, it is possible to measure the operation of the solid-state image pickup device 1 in a state in which the plurality of solid-state image pickup devices 1 is formed on the wafer before the protective substrate 18 is fixed.

The conductive pad 421 for probe measurement may be formed by a part of the multilayer wiring layer 102 included in the upper structural body 11, may be formed by a part of the multilayer wiring layer 82 included in the lower structural body 12, or may be formed by the same layer as a part of a conductive layer used in the upper and lower wiring lines connection structure. Then, the conductive pad 421 for probe measurement may be connected to the inside of the solid-state image pickup device 1 via a part of the multilayer wiring layer 102 included in the upper structural body 11, or may be connected to the inside of the solid-state image pickup device 1 via a part of the multilayer wiring layer 82 included in the lower structural body 12.

By forming the conductive pad 421 for probe measurement on the solid-state image pickup device 1 before fixing the protective substrate 18 of the solid-state image pickup device 1, it is possible to measure the operation of the solid-state image pickup device 1 by using a probe type semiconductor device measuring apparatus, in a state in which the plurality of solid-state image pickup devices 1 is formed on the wafer before the protective substrate 18 is fixed.

<Further Modification 4>

Next, a further modification of the solid-state image pickup device 1 will be described with reference to FIG. 47.

Figure 47:
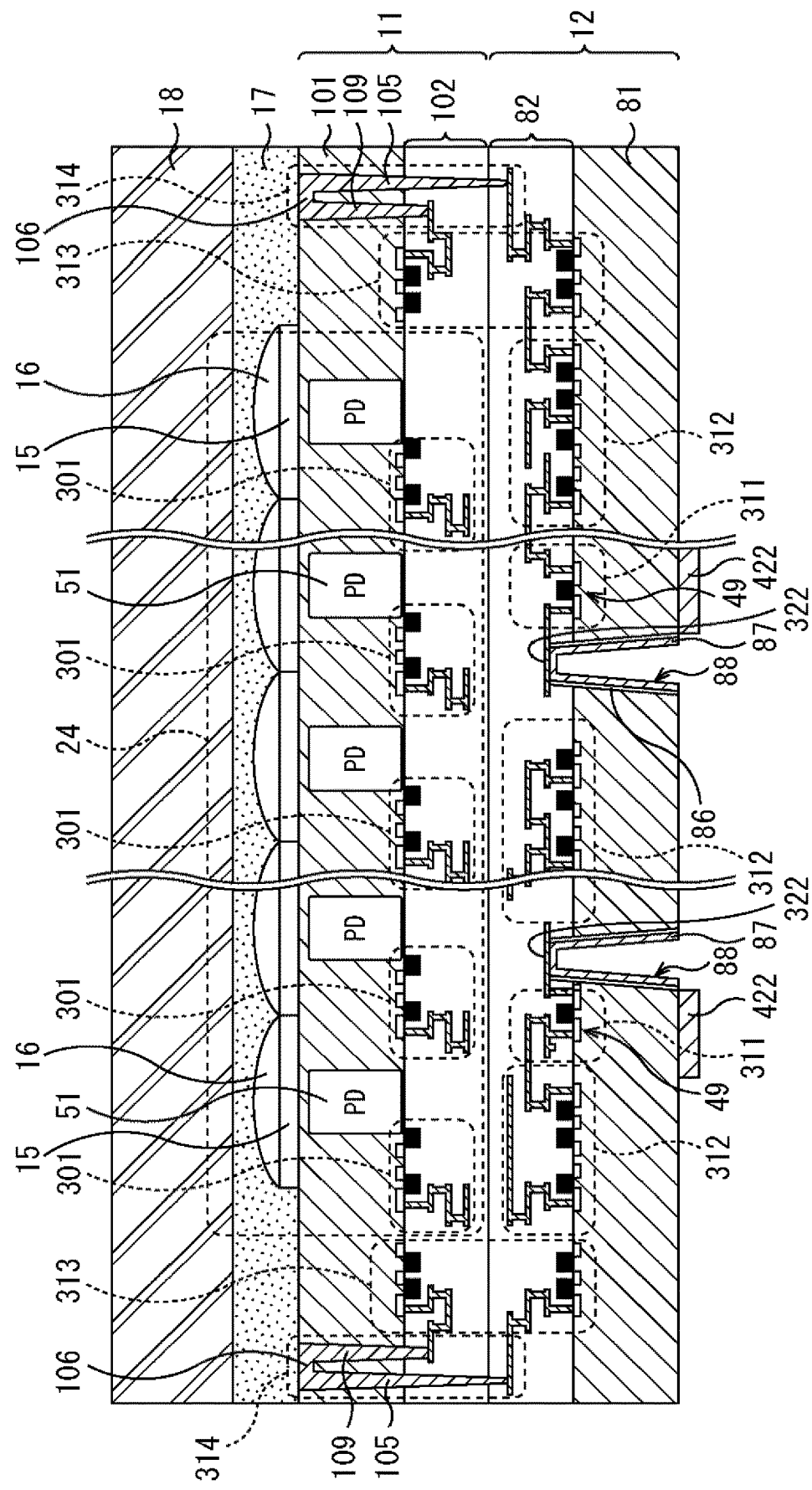
FIG. 47 is a diagram for explaining Further Modification 4 of the solid-state image pickup device.

FIG. 47 is a cross-sectional view of the solid-state image pickup device 1 according to Further Modification 4.

The solid-state image pickup device 1 according to Further Modification 4 also includes a conductive pad 422 for contact with a measurement probe, for the purpose of measuring operation of the solid-state image pickup device 1 in a state in which the plurality of solid-state image pickup devices 1 is mounted on the wafer.

As illustrated in FIG. 47, the conductive pad 422 for probe measurement is formed on the lower side of the lower structural body 12 in a state in which the plurality of solid-state image pickup devices 1 is formed on the wafer. The conductive pad 422 for probe measurement may be formed by the rewiring line 90 included in the lower structural body 12, for example.

After the protective substrate 18 is arranged on the surface of the solid-state image pickup device 1 in a state in which the plurality of solid-state image pickup devices 1 is formed on the wafer, it is possible to measure the operation of the solid-state image pickup device 1 by turning the wafer upside down to arrange the protective substrate 18 on the lower side and to arrange the conductive pad 422 for probe measurement on the upper side. In this case, the operation of the solid-state image pickup device 1 may be measured by using a device that causes light to enter from the lower side of the solid-state image pickup device 1.

<Further Modification 5 Example of Three-Layer Layered Structural Body>

In each of the embodiments described above, the layered structural body 13 of the solid-state image pickup device 1 includes two layers of the lower structural body 12 and the upper structural body 11, but the layered structural body 13 can include three or more layers.

Figure 48:
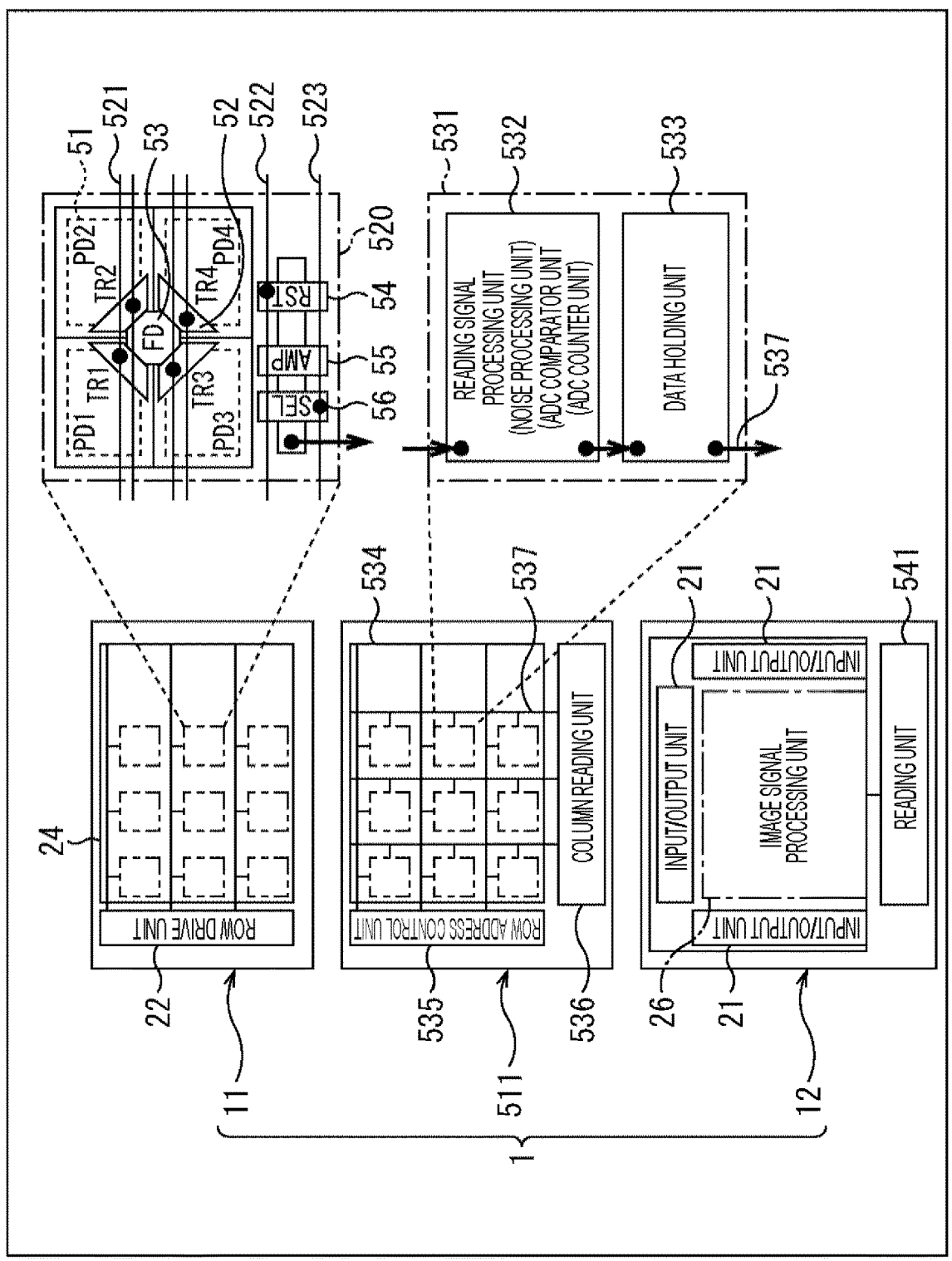
FIG. 48 is a diagram for explaining Further Modification 5 of the solid-state image pickup device.
Figure 49:
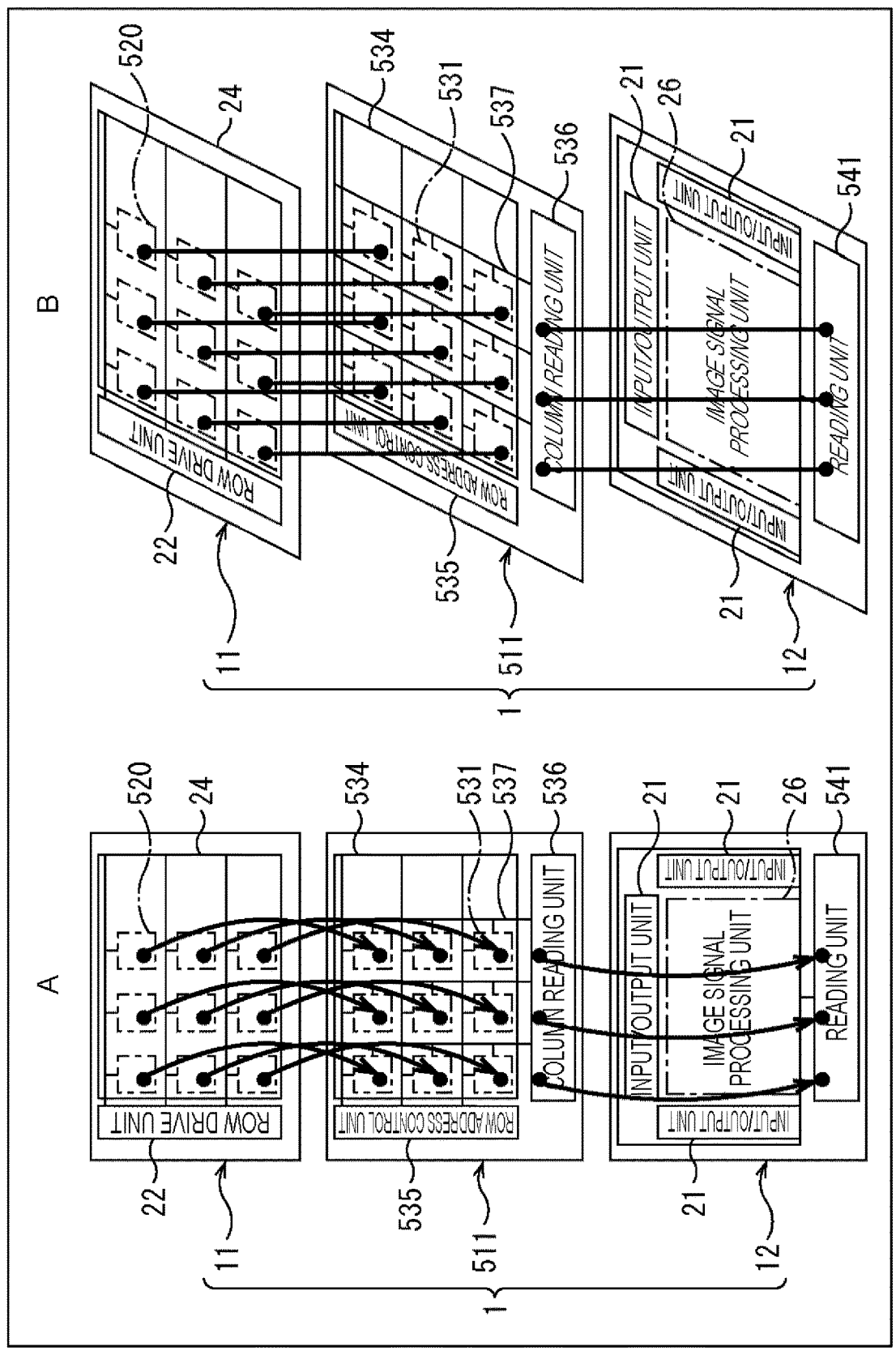
FIG. 49 is a diagram for explaining Further Modification 5 of the solid-state image pickup device.

With reference to FIGS. 48 and 49, an example will be described in which the layered structural body 13 includes three layers by providing a third structural body 511 between the lower structural body 12 and the upper structural body 11.

FIG. 48 illustrates a configuration in a case where the pixel array unit 24 has a pixel sharing structure.

In the pixel sharing structure, the photodiode (PD) 51 and the transfer transistor 52 are included for each pixel 31, but the FD 53, the amplifier transistor 55, the reset transistor 54, and the selection transistor 56 are shared by a plurality of pixels.

FIG. 48 illustrates a structure in which, as a shared unit 520, four pixels of two pixels in the row direction and two pixels in the column direction (2×2) shares the FD 53, the amplifier transistor 55, the reset transistor 54, and the selection transistor 56.

A transfer transistor drive signal line 521 extending in the row direction is connected one by one to each of gate electrodes of the four transfer transistors 52. The four transfer transistor drive signal lines 521 connected to the respective gate electrodes of the four transfer transistors 52 and extending in the row direction are arranged in the column direction in parallel to each other.

The FD 53 is connected to the gate electrode of the amplifier transistor 55 and the diffusion layer of the reset transistor 54 via wiring lines (not illustrated). One reset transistor drive signal line 522 extending in the row direction is connected to the gate electrode of the reset transistor 54.

One select transistor drive signal line 523 extending in the row direction is connected to the gate electrode of the selection transistor 56. The selection transistor 56 may be omitted.

In the example system configuration of the solid-state image pickup device 1 illustrated in FIG. 2, the plurality of pixels 31 is connected to the vertical signal line 33 extending in the column direction for each pixel. Then, each of a plurality of the vertical signal lines 33 is connected to the column signal processing unit 25 arranged subsequent thereto, and noise processing and AD conversion processing are performed in the column signal processing unit 25.

On the other hand, the solid-state image pickup device 1 with the three-layer layered structural body 13 illustrated in FIG. 48 includes an area signal processing unit 531 in the third structural body 511 between the lower structural body 12 and the upper structural body 11.

The area signal processing unit 531 includes a reading signal processing unit 532 including a noise processing unit and the ADC, and a data holding unit 533 that holds digital data after AD conversion.

For example, in a case where each of the pixels 31 of the shared unit 520 outputs data expressed in 16 bits after the AD conversion, the data holding unit 533 includes a data holding means, such as a latch for 64 bits and a shift register, for holding these data.

The area signal processing unit 531 further includes an output signal wiring line 537 for outputting the data held in the data holding unit 533 to the outside of the area signal processing unit 531. The output signal wiring line may be, for example, a 64-bit signal line for outputting 64-bit data held in the data holding unit 533 in parallel, a 16-bit signal line for outputting data of four pixels held in the data holding unit 533 for one pixel at a time, or an 8-bit signal line that is a half of the data for one pixel or 32-bit signal line that is the data for two pixels. Alternatively, the output signal wiring line may be a 1-bit signal line that reads the data held in the data holding unit 533 one bit at a time.

In the solid-state image pickup device 1 illustrated in FIG. 48, one shared unit 520 of the upper structural body 11 is connected to one area signal processing unit 531 of the third structural body 511. In other words, the shared unit 520 and the area signal processing unit 531 correspond one to one. Therefore, as illustrated in FIG. 48, the third structural body 511 includes an area signal processing unit array 534 in which a plurality of the area signal processing units 531 is arrayed in the row direction and the column direction.

Furthermore, the third structural body 511 includes a row address control unit 535 that reads data of the data holding unit 533 included in each of the plurality of area signal processing units 531 respectively arrayed in the row direction and the column direction. The row address control unit 535 determines a reading position in the row direction similarly to a general semiconductor memory device.

The area signal processing unit 531 arranged in the row direction of the area signal processing unit array 534 is connected to a control signal line extending in the row direction from the row address control unit 535, and operation of the area signal processing unit 531 is controlled by control of the row address control unit 535.

The area signal processing unit 531 arranged in the column direction of the area signal processing unit array 534 is connected to the column reading signal line 537 extending in the column direction, and the column reading signal line is connected to a column reading unit 536 arranged subsequent to the area signal processing unit array 534.

For the data held in the data holding unit 533 of each area signal processing unit 531 of the area signal processing unit array 534, the data of the data holding unit 533 of all the area signal processing units 531 arranged in the row direction may be read at the same time to the column reading unit 536, or only the data may be read of the specific area signal processing unit 531 specified by the column reading unit 536.

To the column reading unit 536, a wiring line is connected for outputting the data read from the area signal processing unit 531 to the outside of the third structural body 511.

The lower structural body 12 is connected to a wiring line from the column reading unit 536 of the third structural body 511, and includes a reading unit 541 for receiving the data output from the column reading unit 536.

Furthermore, the lower structural body 12 includes the image signal processing unit 26 for image signal processing of the data received from the third structural body 511.

Moreover, the lower structural body 12 includes the input/output unit 21 for outputting the data received from the third structural body 511 via the image signal processing unit 26 or outputting the data without passing therethrough.

The input/output unit 21 may include not only the output circuit unit 47, but also the input circuit unit 42 for inputting, for example, a timing signal to be used in the pixel array unit 24 and characteristic data to be used in the image signal processing unit 26, from the outside of the solid-state image pickup device 1 into the device.

As illustrated in B of FIG. 49, each shared unit 520 formed in the upper structural body 11 is connected to the area signal processing unit 531 of the third structural body 511 arranged immediately below the shared unit 520. Wiring connection between the upper structural body 11 and the third structural body 511 can be connected by, for example, the Cu—Cu direct bonding structure illustrated in FIG. 8.

Furthermore, as illustrated in B of FIG. 49, the column reading unit 536 on the outside of the area signal processing unit array 534 formed in the third structural body 511 is connected to the reading unit 541 of the lower structural body 12, the reading unit 541 being arranged immediately below the column reading unit 536. Wiring connection between the third structural body 511 and the lower structural body 12 can be connected by, for example, the Cu—Cu direct bonding structure illustrated in FIG. 8, or the twin contact structure illustrated in FIG. 6.

Accordingly, as illustrated in A of FIG. 49, the pixel signal of each shared unit 520 formed in the upper structural body 11 is output to the corresponding area signal processing unit 531 of the third structural body 511. The data held in the data holding unit 533 of the area signal processing unit 531 is output from the column reading unit 536, and supplied to the reading unit 541 of the lower structural body 12. Then, the data is subjected to various types of signal processing (for example, tone curve correction processing) in the image signal processing unit 26, and output from the input/output unit 21 to the outside of the device.

Note that, in the solid-state image pickup device 1 with the three-layer layered structural body 13, the input/output unit 21 formed in the lower structural body 12 may be arranged on the lower side of the row address control unit 535 of the third structural body 511.

Furthermore, in the solid-state image pickup device 1 with the three-layer layered structural body 13, the input/output unit 21 formed in the lower structural body 12 may be arranged on the lower side of the area signal processing unit 531 of the third structural body 511.

Moreover, in the solid-state image pickup device 1 with the three-layer layered structural body 13, the input/output unit 21 formed in the lower structural body 12 may be arranged on the lower side of the pixel array unit 24 of the upper structural body 11.

<Further Modification 6>

In the above, an example has been described in which a solder ball is used as the external terminal 14 for connection with the mounting substrate; however, the structure of the external terminal 14 may be other than the solder ball. Therefore, in the following, an example will be described in which the structure of the external terminal 14 is other than the solder ball.

Figure 50:
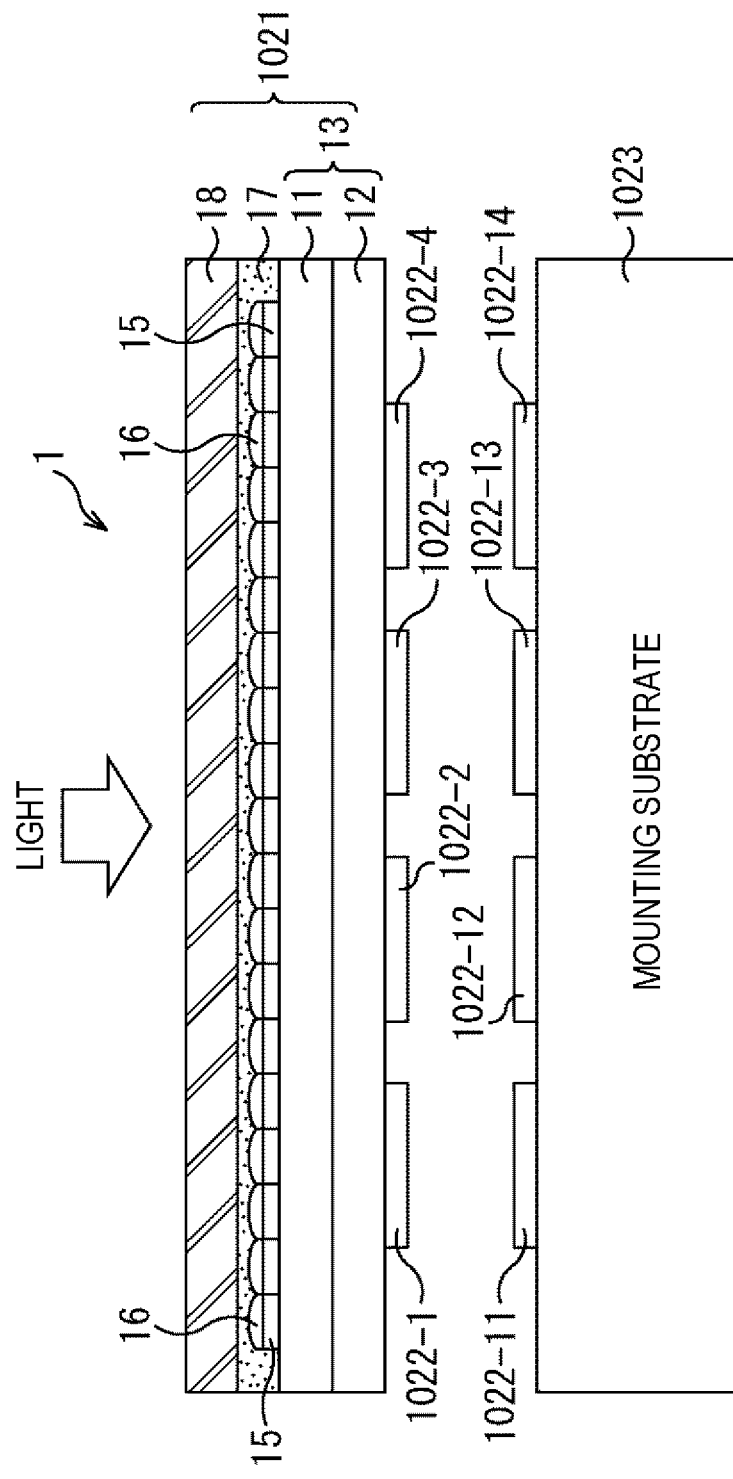
FIG. 50 is a diagram for explaining Further Modification 6 of the solid-state image pickup device.

FIG. 50 illustrates an example configuration of a side cross section of a bonding portion between the mounting substrate and a chip size package (CSP) imager (image sensor) in the solid-state image pickup device 1 using a conductive pad instead of the external terminal 14 including the solder ball included in the solid-state image pickup device 1 illustrated in FIG. 1.

In FIG. 50, on a CSP imager 1021 of the solid-state image pickup device 1, conductive pads 1022-1 to 1022-4 are provided at portions facing a mounting substrate 1023. The conductive pads 1022-1 to 1022-4 are formed on the surface of the rewiring line 90 instead of the external terminals 14 illustrated in FIGS. 23 and 38. Furthermore, on the mounting substrate 1023, conductive pads 1022-11 to 1022-14 are provided at portions facing the CSP imager 1021.

Then, the conductive pads 1022-1 to 1022-4 are bonded to the respectively facing conductive pads 1022-11 to 1022-14 in a state of being in contact with each other, whereby the CSP imager 1021 and the mounting substrate 1023 are bonded together.

Note that, in the following, in a case where it is not necessary to distinguish between the conductive pads 1022-1 to 1022-4, and 1022-11 to 1022-14, it is simply referred to as conductive pads 1022, and also referred to similarly for other configurations.

The CSP imager 1021 is a solid-state image pickup element including, for example, complementary metal oxide semiconductor (CMOS) image sensor, and includes the protective substrate 18, the glass seal resin 17, and the layered structural body 13. The protective substrate 18 protects the surface by preventing dirt on the glass seal resin 17 and interference by a protrusion with respect to the light receiving direction.

On the surface portion of the layered structural body 13 in contact with the glass seal resin 17, the color filter 15 and the on-chip lens 16 are provided. The color filter 15 extracts light having a wavelength corresponding to each color of R, G, and B from light condensed by the on-chip lens 16 on a pixel basis, for example, Bayer arrangement, and transmits the extracted light to the layered structural body 13. In the layered structural body 13, the upper structural body 11 on which a photoelectric conversion element such as a photodiode is formed, and the lower structural body 12 on which a transistor, a wiring line, and the like are formed, are layered.

The conductive pads 1022-1 to 1022-4 are provided on the back surface portion of the CSP imager 1021 when the surface facing the incident direction of light is the front surface.

On the mounting substrate 1023, the conductive pads 1022-11 to 1022-14 are provided at positions facing the conductive pads 1022-1 to 1022-4 of the CSP imager 1021 on the front surface side that is the upper part in the figure.

The conductive pads 1022 include single material films of Sn, Ag, Au, Sb, Cu, Pb, or the like layered over a plurality of layers, or includes an alloy material in which at least two of the Sn, Ag, Au, Sb, Cu, Pb, or the like are used.

The CSP imager 1021 and the mounting substrate 1023 are heated in a state in which the conductive pads 1022-1 to 1022-4 and the conductive pads 1022-11 to 1022-14 are in contact with each other in a state of facing each other, and the conductive pads 1022-1 to 1022-4 and the conductive pads 1022-11 to 1022-14 are melted and caused to adhere, and then cooled, whereby the CSP imager 1021 and the mounting substrate 1023 are soldered together.

With such a configuration, the solid-state image pickup device 1 can be formed without using the solder ball.

Furthermore, contact surfaces (bonding surfaces) of the conductive pads 1022-1 to 1022-4 and the conductive pads 1022-11 to 1022-14 can dissipate an amount of heat respectively corresponding to areas of the contact surfaces (bonding surfaces), and prevent side slip of the bonding surfaces, and improve shear strength.

Note that, in the example of FIG. 50, an example has been described in which the conductive pads 1022 are respectively provided on the back surface portion of the CSP imager 1021 and the front surface portion of the mounting substrate 1023 at positions facing each other; however, the conductive pads 1022 may be provided on only one of the CSP imager 1021 and mounting substrate 1023.

<Method of Forming Conductive Pad>

There are two types of methods of forming the conductive pads 1022. A first forming method is a method in which a layer to be the conductive pads 1022 is formed first by a sputtering method, a vapor deposition method, and a plating method, a resist pattern is formed to leave portions of the conductive pads 1022-1 to 1022-4, or 1022-11 to 1022-14, the conductive pads 1022-1 to 1022-4, or 1022-11 to 1022-14 are formed by etching, and the resist pattern is peeled off.

Furthermore, a second forming method is a method in which a resist pattern is formed before a layer 1022A of the conductive pads 1022 is formed, the layer 1022A of the conductive pads 1022 is formed by the sputtering or vapor deposition method, and the resist pattern is peeled off, whereby the conductive pads 1022-1 to 1022-4, or 22-11 to 1022-14 are formed.

First, details of the first forming method of the conductive pads 1022-1 to 1022-4 will be described with reference to the left part of FIG. 51. Note that, in FIG. 51, an example will be described in which the conductive pads 1022-1 to 1022-4 are formed with the back surface of the CSP imager 1021 as the upper surface; however, in a similar method, the conductive pads 1022-11 to 1022-14 can be formed on the front surface of the mounting substrate 1023.

Figure 51:
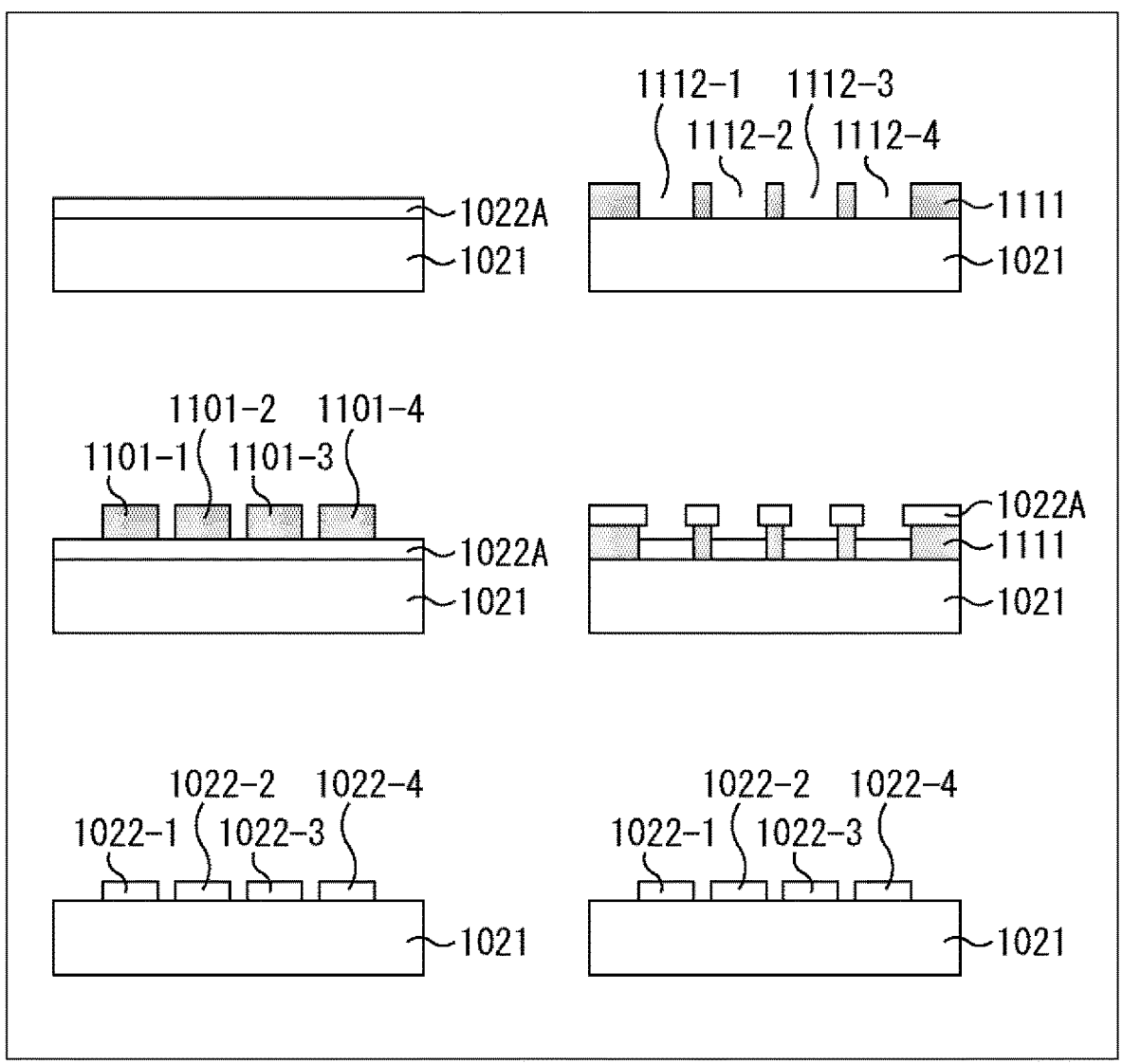
FIG. 51 is a diagram for explaining a method of manufacturing a conductive pad in FIG. 50.

In other words, in the first step, as illustrated in the upper left part of FIG. 51, the layer 1022A including a material constituting the conductive pads 1022 is formed on the back surface of the layered structural body 13 of the CSP imager 1021 by the sputtering method, the vapor deposition method, the plating method, or the like.

In the second step, as illustrated in the left middle part of FIG. 51, resist patterns 1101-1 to 1101-4 are formed on the layer 1022A including the material constituting the conductive pads 1022 so that portions respectively corresponding to the conductive pads 1022-1 to 1022-4 are left.

In the third step, as illustrated in the lower left part of FIG. 51, by etching, the layer 1022A including the material constituting the conductive pads 1022-1 to 1022-4 is eliminated in regions where the resist patterns 1101-1 to 1101-4 are not formed, whereby the conductive pads 1022-1 to 1022-4 are formed. Thereafter, thickening of the conductive pads 1022-1 to 1022-4 may be further achieved by the plating method or the like.

Next, details of the second forming method of the conductive pads 1022-1 to 1022-4 will be described with reference to the right part of FIG. 51.

In other words, in the first step, as illustrated in the upper right part of FIG. 51, a resist pattern 1111 is formed in a region excluding positions 1012-1 to 1012-4 where the conductive pads 1022-1 to 1022-4 are formed on the back surface of the layered structural body 13 of the CSP imager 1021.

In the second step, as illustrated in the right middle part of FIG. 51, the layer 1022A including the material constituting the conductive pads 1022 is formed by the sputtering method, the vapor deposition method, the plating method, or the like. At this time, the layer 1022A including the material constituting the conductive pads 1022 is formed on the positions 1112-1 to 1112-4 and the resist pattern 1111.

In the third step, as illustrated in the lower right part of FIG. 51, the resist pattern 1111 is peeled off, whereby the conductive pads 1022-1 to 1022-4 are formed. Thereafter, thickening of the conductive pads 1022-1 to 1022-4 may be further achieved by the plating method or the like.

With the above configuration, the conductive pads 1022-1 to 1022-4 are formed on the back surface portion of the CSP imager 1021. Furthermore, in a similar method, the conductive pads 1022-11 to 1022-14 are formed on the mounting substrate 1023.

With such a configuration, the CSP imager 1021 and the mounting substrate 1023 can be bonded together without using the solder ball.

As a result, it is possible to reduce restrictions on materials in the configuration of the image pickup device and restrictions in the device configuration.

<Further Modification 7>

In the above, an example has been described in which the conductive pads 1022-1 to 1022-4 of the CSP imager 1021 and the conductive pads 1022-11 to 1022-14 formed on the mounting substrate 1023 are heated in a state of facing each other, whereby the both conductive pads are melted and the CSP imager 1021 and the mounting substrate 1023 are soldered together.

However, crimping may be performed in a state in which a metal bump is sandwiched at a position where the CSP imager 1021 and the mounting substrate 1023 face each other.

Figure 52:
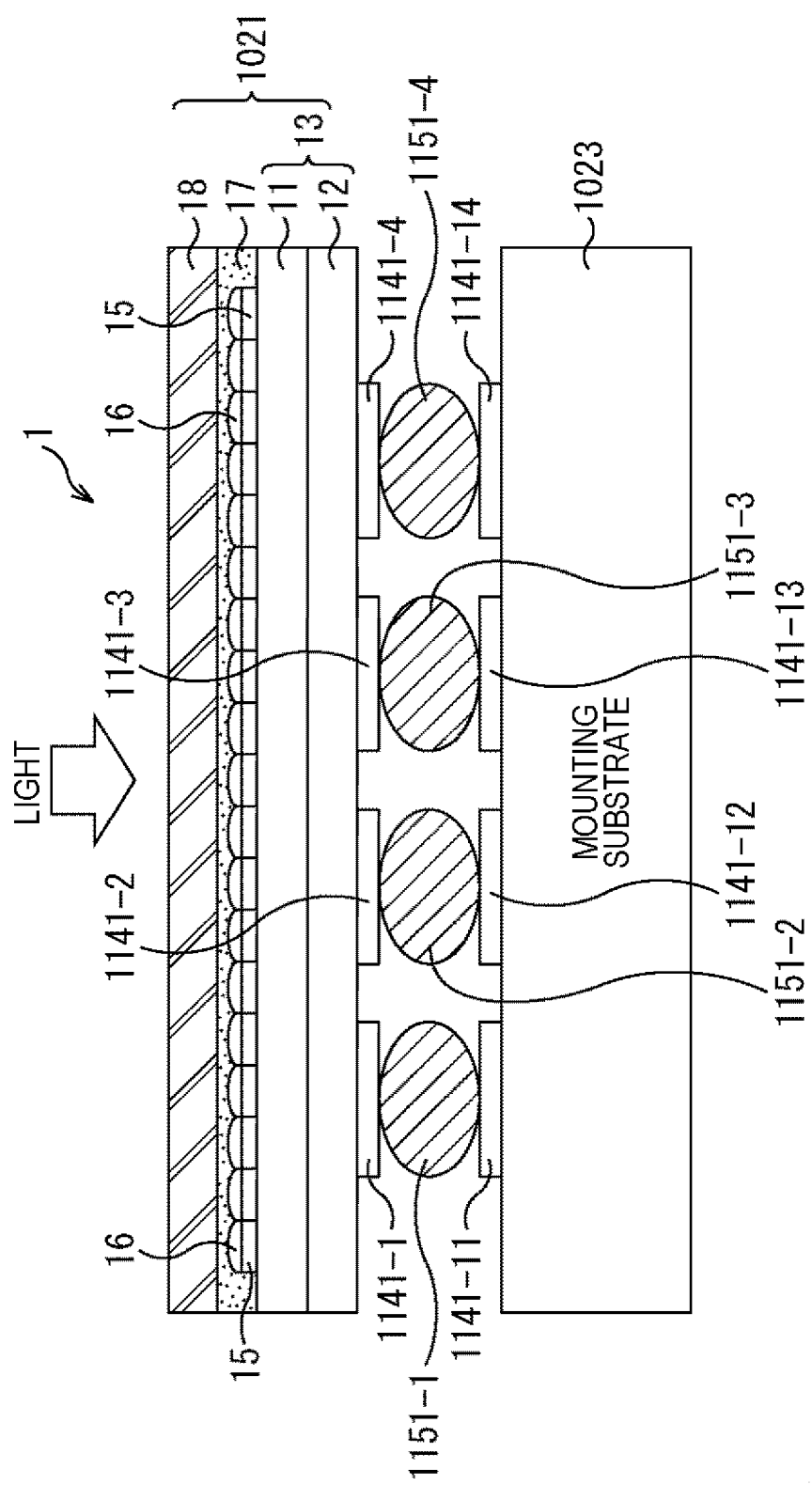
FIG. 52 is a diagram for explaining Further Modification 7 of the solid-state image pickup device.

FIG. 52 illustrates an example configuration of the solid-state image pickup device 1 formed by performing crimping in a state in which metal bumps 1151-1 to 1151-4 are sandwiched at positions where conductive pads 1141-1 to 1141-4 and conductive pads 1141-11 to 1141-14 face each other.

The conductive pads 1141-1 to 1141-4 and the conductive pads 1141-11 to 1141-14 may each have a structure using a single material from metal materials such as Au, Al, Cu, Ag, W, Ti, Ni, Co, Sn, Sb, and Pb, or a layered structure using a plurality of the materials, or an alloy structure using the plurality of materials. Furthermore, the conductive pads 1141-1 to 1141-4 and the conductive pads 1141-11 to 1141-14 each may be a metal material that does not include Pb and Sn, in other words, a metal material that is not solder, or may be a low melting point alloy material including Pb or Sn, in other words, a solder material.

The conductive pads 1141-1 to 1141-4 may be formed on the surface of the rewiring line 90 instead of the external terminals 14 illustrated in FIGS. 23 and 38. Alternatively, the rewiring line 90 itself may be used as the conductive pads 1141-1 to 1141-4.

Note that, in the following, in a case where it is not necessary to distinguish between the conductive pads 1141-1 to 1141-4 and 1141-11 to 1141-14, it is simply referred to as conductive pads 1141, and also referred to similarly for other configurations.

Since the metal bumps 1151-1 to 1151-4 include a single metal material of any of Au, Al, Cu, Ag, and the like, or an alloy material in which at least two of the Au, Al, Cu, Ag, and the like are used.

In FIG. 52, the metal bumps 1151-1 to 1151-4 are provided at the positions where the conductive pads 1141-1 to 1141-4 and the conductive pads 1141-11 to 1141-14 face each other, and moreover, pressure is applied in the vertical direction in the figure for bonding by crimping, whereby the CSP imager 1021 is mounted on the mounting substrate 1023.

Upon crimping, the metal bumps 1151-1 to 1151-4 are pasted to the conductive pads 1141-1 to 1141-4, and then crimped in a state of facing the conductive pads 1141-11 to 1141-14, to be bonded. Conversely, the metal bumps 1151-1 to 1151-4, in a state of being pasted to the conductive pads 1141-11 to 1141-14, are crimped in a state of facing the conductive pads 1141-1 to 1141-4, to be bonded.

With such a configuration, the CSP imager 1021 and the mounting substrate 1023 can be bonded together without using the solder ball.

As a result, it is possible to reduce restrictions on materials in the configuration of the image pickup device and restrictions in the device configuration.

<Further Modification 8>

In Further Modification 7, the configuration has been described of the solid-state image pickup device 1 in which crimping is performed in a state in which the metal bumps 1151-1 to 1151-4 are sandwiched at the position where the CSP imager 1021 and the mounting substrate 1023 face each other.

However, instead of the metal bumps 1151, conductive resin may be used for bonding.

Figure 53:
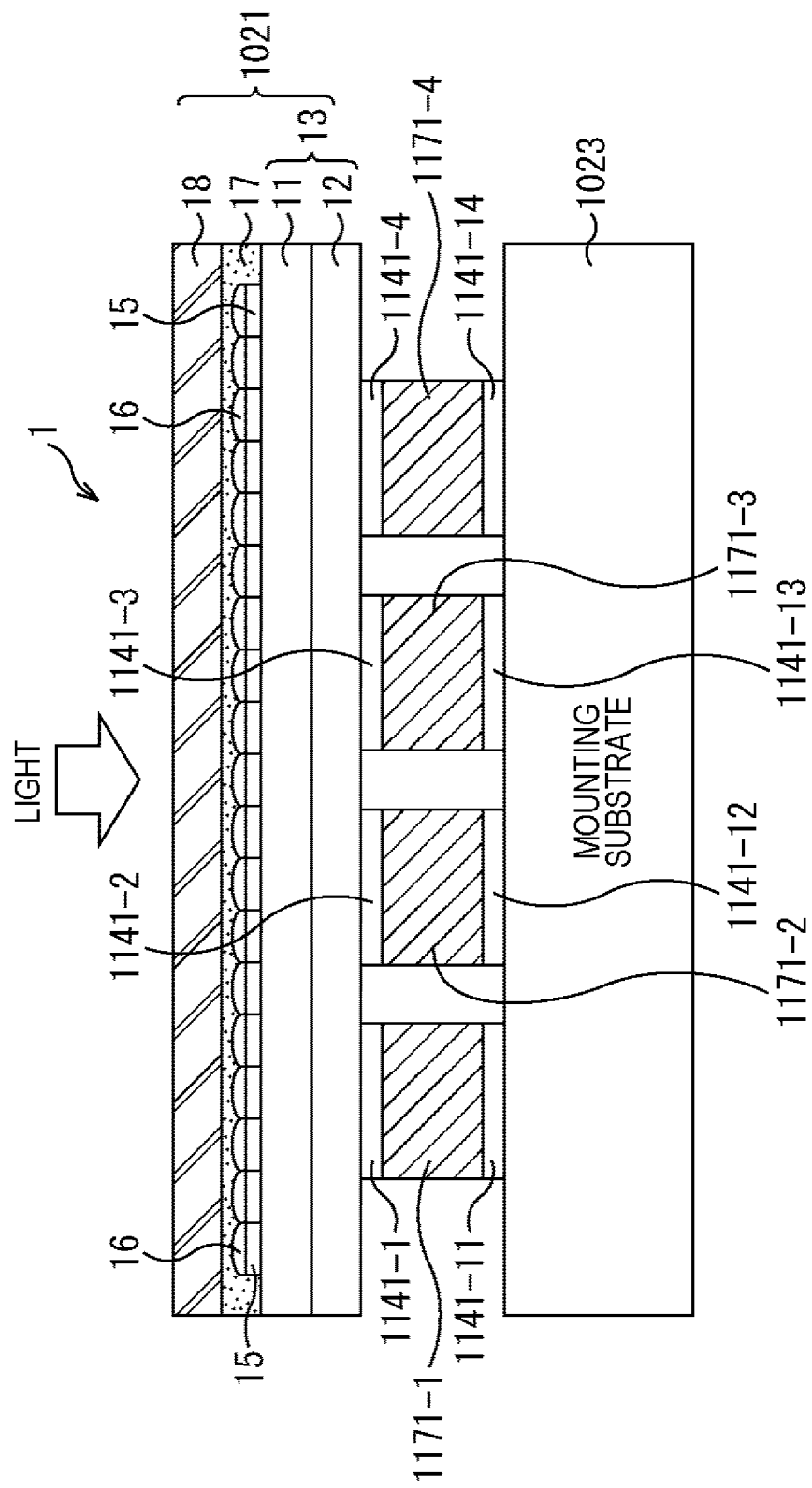
FIG. 53 is a diagram for explaining Further Modification 8 of the solid-state image pickup device.

FIG. 53 illustrates an example configuration of the solid-state image pickup device 1 formed by crimping in a state in which conductive resins 1171-1 to 1171-4 are placed on the positions where the conductive pads 1141-1 to 1141-4 and the conductive pads 1141-11 to 1141-14 face each other.

In other words, the conductive resins 1171-1 to 1171-4 are provided at the positions where the conductive pads 1141-1 to 1141-4 and the conductive pads 1141-11 to 1141-14 face each other, and moreover, pressure is applied in the vertical direction in the figure for crimping, whereby the CSP imager 1021 is mounted on the mounting substrate 1023.

Furthermore, a material of the conductive resins 1171-1 to 1171-4 is a paste-like material including a mixture of a metal responsible for conductivity and a resin responsible for fixing (for example, Ag and an epoxy resin, or the like).

Upon crimping, as illustrated in FIG. 53, the conductive resins 1171-1 to 1171-4 may be crimped in a state of being paste-printed on the conductive pads 1141-11 to 1141-14, and in a state of facing the conductive pads 1141-1 to 1141-4.

Figure 54:
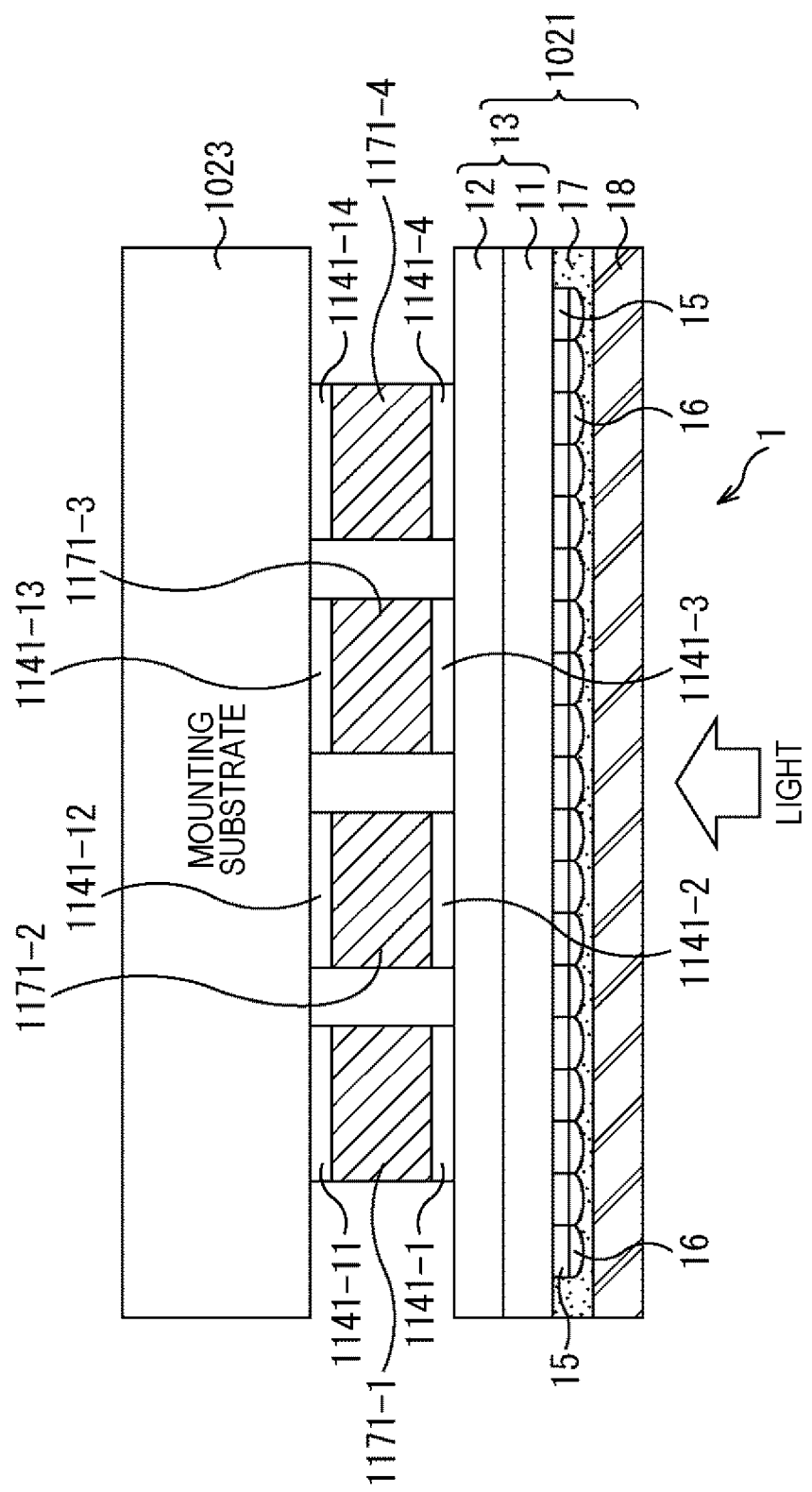
FIG. 54 is a diagram for explaining Further Modification 8 of the solid-state image pickup device.

Furthermore, as illustrated in FIG. 54, the conductive resins 1171-1 to 1171-4 may be crimped in a state of being paste-printed on the conductive pads 1141-1 to 1141-4, and in a state of facing the conductive pads 1141-11 to 1141-14. Note that, in FIG. 54, the arrangement is inverted upside down as compared with the case in FIG. 53.

With such a configuration, the CSP imager 1021 and the mounting substrate 1023 can be bonded together without using the solder ball.

As a result, it is possible to reduce restrictions on materials in the configuration of the image pickup device and restrictions in the device configuration.

<Further Modification 9>

In Further Modification 8, the configuration has been described of the solid-state image pickup device 1 in which crimping is performed in a state in which the conductive resins 1171-1 to 1171-4 are sandwiched at the position where the CSP imager 1021 and the mounting substrate 1023 face each other.

However, an anisotropic conductive member may be filled between the CSP imager 1021 and the mounting substrate 1023, and crimped for bonding.

Figure 55:
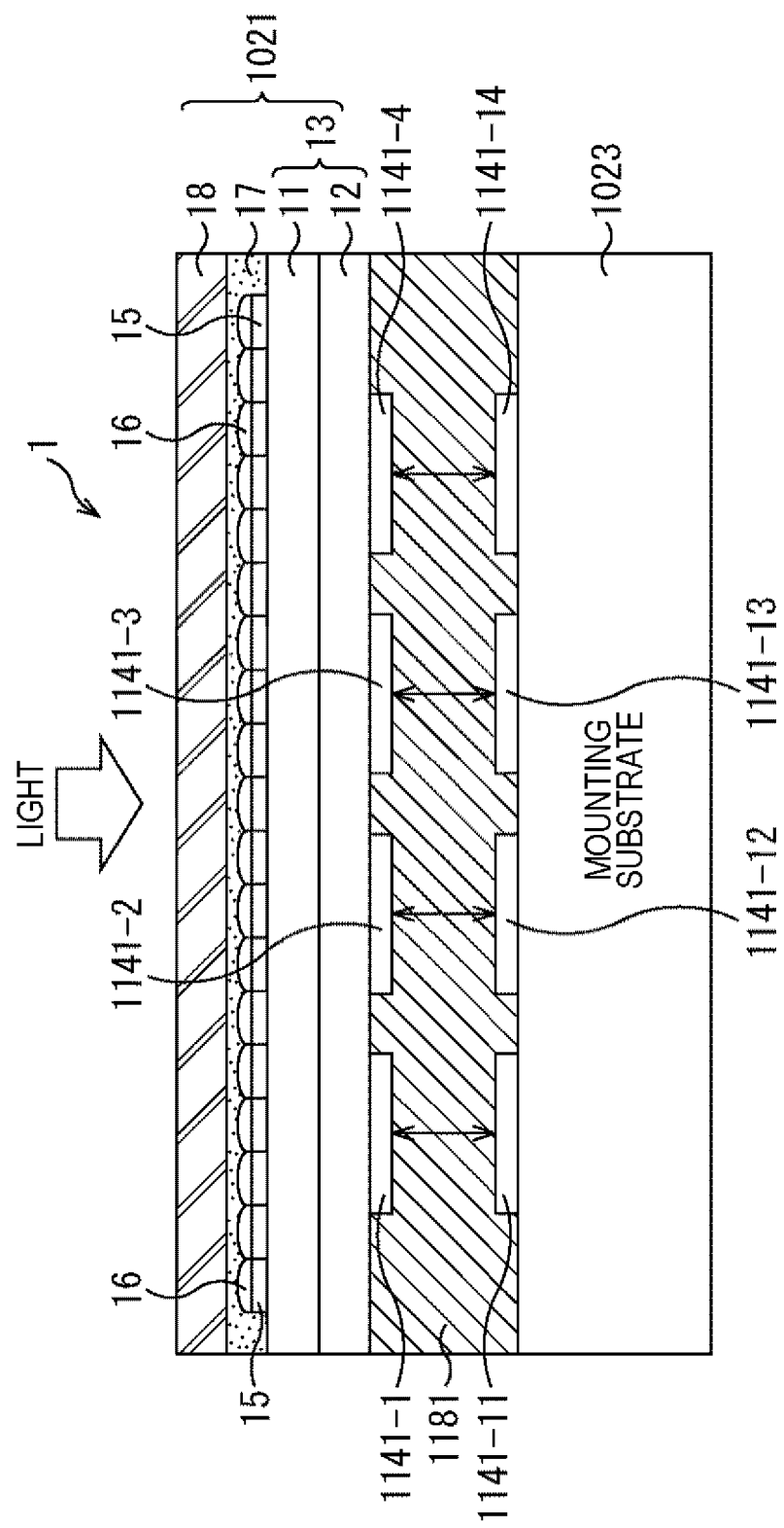
FIG. 55 is a diagram for explaining Further Modification 9 of the solid-state image pickup device.

FIG. 55 illustrates an example configuration of the solid-state image pickup device 1 bonded by filling the entire space in which the conductive pads 1141-1 to 1141-4 of the CSP imager 1021 and the conductive pads 1141-11 to 1141-14 of the mounting substrate 1023 face each other with an anisotropic conductive member 1181, and performing crimping.

In other words, the entire space in which the conductive pads 1141-1 to 1141-4 of the CSP imager 1021 and the conductive pads 1141-11 to 1141-14 of the mounting substrate 1023 face each other is filled with the anisotropic conductive member 1181, and moreover, pressure is applied in the vertical direction in the figure for crimping, whereby the CSP imager 1021 is mounted on the mounting substrate 1023.

Note that, upon crimping, the crimping may be performed such that, in a state in which the anisotropic conductive member 1181 is placed on the front surface of the upper surface of the mounting substrate 1023, the CSP imager 1021 is placed from above, and the anisotropic conductive member 1181 is sandwiched in the space between the CSP imager 1021 and the mounting substrate 1023.

In addition, conversely, by inverting the top and bottom, the crimping may be performed such that, in a state in which the anisotropic conductive member 781 is placed on the back surface of the CSP imager 1021, the mounting substrate 1023 is placed from above with its upper surface faced downward, and the anisotropic conductive member 781 is sandwiched in the space between the CSP imager 1021 and the mounting substrate 1023.

Moreover, the anisotropic conductive member 1181 includes an anisotropic conductive film, or an anisotropic conductive paste.

Furthermore, the anisotropic conductive member 1181 includes a mixed material of a conductive particle responsible for conductivity and an adhesive responsible for fixing. Here, the conductive particle is, for example, a metal core (Ni simple substance, gold plated Ni), or a gold-plated resin core (styrene, acrylic, titanium oxide, or the like). Furthermore, the adhesive is, for example, synthetic rubber, thermoreversible resin, thermosetting resin (epoxy resin), or the like.

The anisotropic conductive member 1181 is crimped by pressure applied in the vertical direction in the figure in a state in which the entire space in which the conductive pads 1141-1 to 1141-4 of the CSP imager 1021 and the conductive pads 1141-11 to 1141-14 of the mounting substrate 1023 face each other is filled with the anisotropic conductive member 1181, as illustrated in FIG. 55.

As a result, in a region where the conductive pads 1141-1 to 1141-4 and the conductive pads 1141-11 to 1141-14 face each other, electrical connection is made since a pressure higher than that in the periphery is applied and conductivity is exhibited. Furthermore, in a region other than the region where the conductive pads 1141-1 to 1141-4 and the conductive pads 1141-11 to 1141-14 face each other, electrical insulation is made since a pressure lower than that in the periphery is applied and insulation is exhibited.

As a result, only in the connection portion where the conductive pads 1141-1 to 1141-4 and the conductive pads 1141-11 to 1141-14 face each other, electrical connection is made.

Furthermore, with such a configuration, the CSP imager 1021 and the mounting substrate 1023 can be bonded together without using the solder ball.

As a result, it is possible to reduce restrictions on materials in the configuration of the image pickup device and restrictions in the device configuration.

Note that, in a case where the anisotropic conductive member 1181 is used, pressure is applied to the anisotropic conductive member 1181 arranged between the conductive pads 1141-1 to 1141-4 and the conductive pads 1141-11 to 1141-14, whereby the anisotropic conductive member 118 exhibits conductivity. Therefore, the conductive pads 1141-1 to 1141-4 preferably protrude from the surface of the CSP imager 1021 and have a greater amount of protrusion, in terms of applying pressure to the anisotropic conductive member 1181. Therefore, for the conductive pads 1141-1 to 1141-4, a structure is more preferable in which the conductive pads 1141-1 to 1141-4 are each formed on the surface of the rewiring line 90 than that the rewiring line 90 itself illustrated in FIGS. 23 and 38 is used as each of the conductive pads 1141-1 to 1141-4.

<Further Modification 10>

Furthermore, the configuration has been described of the solid-state image pickup device 1 in which the CSP imager 1021 and the mounting substrate 1023 are bonded together in a state in which the CSP imager 1021 and the mounting substrate 1023 face each other.

However, the CSP imager 1021 and the mounting substrate 1023 may be bonded together in a state in which the CSP imager 1021 and the mounting substrate 1023 do not face each other.

Figure 56:
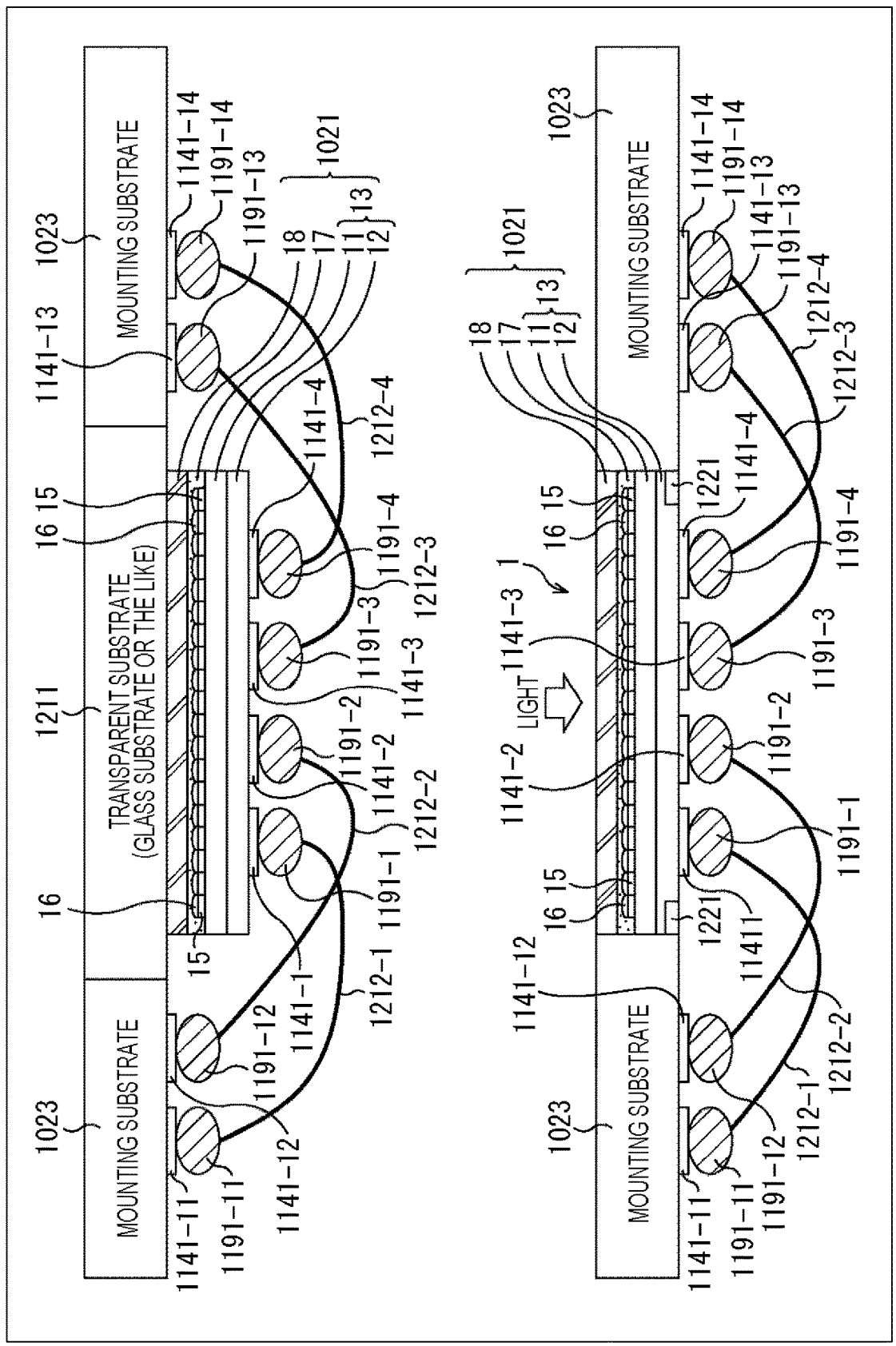
FIG. 56 is a diagram for explaining Further Modification 10 of the solid-state image pickup device.

FIG. 56 illustrates an example configuration of the solid-state image pickup device 1 in which the CSP imager 1021 and the mounting substrate 1023 are bonded together in a state in which the conductive pads 1141-1 to 1141-4 of the CSP imager 1021 and the conductive pads 1141-11 to 1141-14 of the mounting substrate 1023 do not face each other.

In other words, in the upper part of FIG. 56, a transparent substrate 1211 with high transparency including glass and the like is fitted in a part of the mounting substrate 1023, and the CSP imager 1021 is pasted such that the protective substrate 18 is in contact with the transparent substrate 1211.

Furthermore, bumps 1191-1 to 1191-4 are respectively provided on the conductive pads 1141-1 to 1141-4 of the CSP imager 1021, and bumps 1191-11 to 1191-14 of the mounting substrate 1023 are respectively provided on the conductive pads 1141-11 to 1141-14.

Moreover, the bump 1191-1 and the bump 1191-11 are connected together by wire bonding 1212-1, the bump 1191-2 and the bump 1191-12 are connected together by wire bonding 1212-2, the bump 1191-3 and the bump 1191-13 are connected together by wire bonding 1212-3, and the bump 1191-4 and the bump 1191-14 are connected together by wire bonding 1212-4.

A material of the wire bonding 1212 and the bumps 1191 is a single metal material such as Au, Al, Cu, and Ag, or an alloy material of at least two of the Au, Al, Cu, Ag, and the like.

With such a configuration, electrical connection is made in a state in which the conductive pads 1141-1 to 1141-4 and the conductive pads 1141-11 to 1141-14 do not face each other.

Note that, by having a configuration in which the CSP imager 1021 is provided, instead of the transparent substrate 1211 of the mounting substrate 1023, such that upper surfaces of the protective substrate 18 and the mounting substrate 1023 coincide with each other, as illustrated in the lower part of FIG. 56, the mounting substrate 1023 and the CSP imager 1021 can be downsized as a flat module. At this time, in a case where the thicknesses of the mounting substrate 1023 and the CSP imager 1021 do not coincide with each other, a spacer 1221 may be embedded in a space that is a gap as illustrated in the lower part of FIG. 56.

With such a configuration, the CSP imager 1021 and the mounting substrate 1023 can be bonded together without using the solder ball.

As a result, it is possible to reduce restrictions on materials in the configuration of the image pickup device and restrictions in the device configuration.

In the above, examples have been described in which the CSP imager 1021 and the mounting substrate 1023 are connected together by using the conductive pads 1141; however, a similar effect is obtained even in a configuration in which a semiconductor device other than the CSP imager 1021, and a mounting device 23 are bonded together by using the conductive pads 1141.

<13. Application Example to Electronic Apparatus>

The present technology is not limited to application to solid-state image pickup devices. In other words, the present disclosure is applicable to all electronic apparatuses using a solid-state image pickup device for an image capturing unit (photoelectric conversion unit), such as an image pickup device such as a digital still camera or a video camera, a mobile terminal device having an image pickup function, and a copying machine using a solid-state image pickup device for an image reading unit. The solid-state image pickup device may be in a form formed as a one-chip or in a modular form having an image pickup function in which an image pickup unit and a signal processing unit or an optical system are packaged together.

Figure 57:
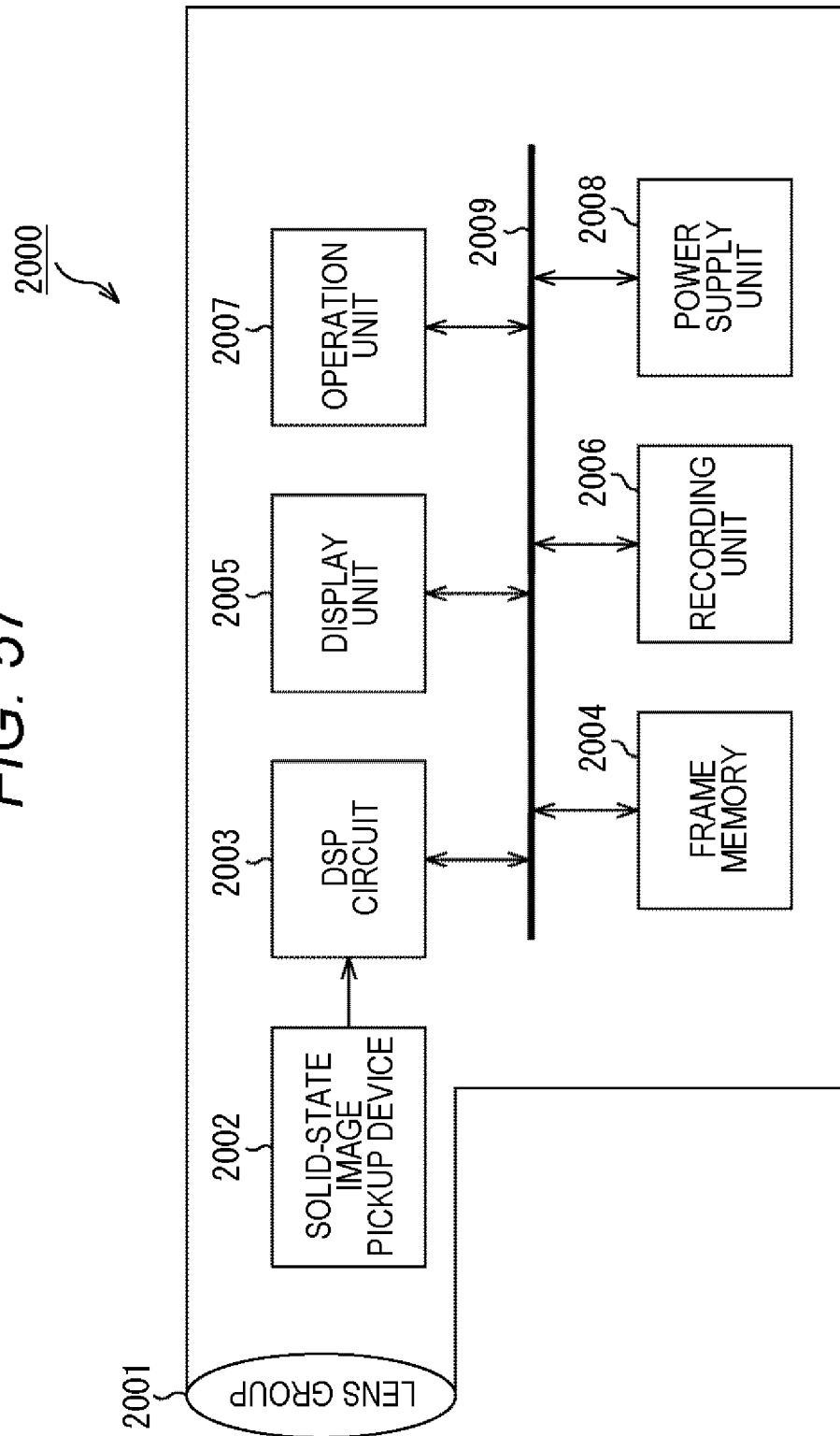
FIG. 57 is a block diagram illustrating an example configuration of the image pickup device as an electronic apparatus to which the present technology is applied.

FIG. 57 is a block diagram illustrating an example configuration of the image pickup device as an electronic apparatus to which the present technology is applied.

An image pickup device 2000 of FIG. 57 includes: an optical unit 2001 including a lens group and the like; a solid-state image pickup device 2002 in which the configuration of the solid-state image pickup device 1 of FIG. 1 is adopted; and a digital signal processor (DSP) circuit 2003 that is a camera signal processing circuit. Furthermore, the image pickup device 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are connected to each other via a bus line 2009.

The optical unit 2001 takes in incident light (image light) from a subject and forms an image on an image pickup surface of the solid-state image pickup device 2002. The solid-state image pickup device 2002 converts the amount of light of the incident light formed on the image pickup surface by the optical unit 2001 into an electrical signal for each pixel, and outputs the electrical signal as the pixel signal. As the solid-state image pickup device 2002, a solid-state image pickup device can be used that is downsized by that, a conductive pad for contact with a measurement probe is not provided on the outer peripheral portion, for the purpose of measuring the operation of the solid-state image pickup device 1 of FIG. 1, in other words, the layered structural body 13, but instead, the input/output circuit unit 49 is arranged in a region below the region of the pixel array unit 24 of the upper structural body 11, or in a region below the pixel peripheral circuit region 313 of the upper structural body 11.

The display unit 2005 includes, for example, a panel type display device such as a liquid crystal panel or an organic electro-luminescence (EL) panel, and displays a moving image or a still image captured by the solid-state image pickup device 2002. The recording unit 2006 records the moving image or the still image captured by the solid-state image pickup device 2002 on a recording medium such as a hard disk or a semiconductor memory.

The operation unit 2007, under operation by a user, issues an operation command for various functions included in the image pickup device 2000. The power supply unit 2008 supplies various power supplies that are operation power supplies for the DSP circuit 2003, the frame memory 2004, the display unit 2005, the recording unit 2006, and the operation unit 2007, to these supply targets as appropriate.

As described above, the package size of a semiconductor package can be downsized by using the solid-state image pickup device 1 according to the above-described embodiments as the solid-state image pickup device 2002. Accordingly, also in the image pickup device 2000 such as a video camera or a digital still camera, or further a camera module for a mobile device such as a cellular phone, the apparatus can be downsized.

<14. Usage Examples of Image Sensor>

Figure 58:
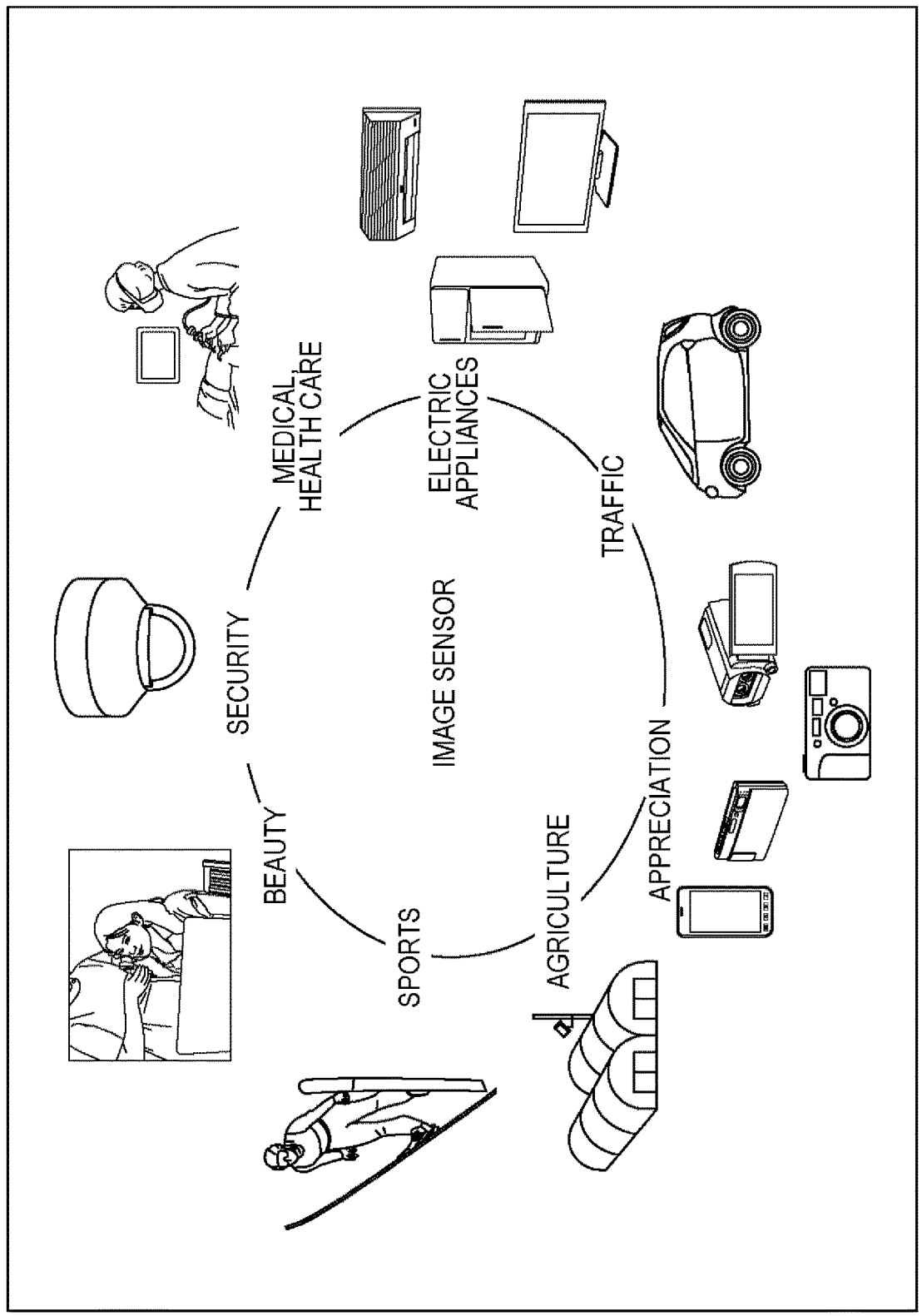
FIG. 58 is a diagram for explaining a usage example of the solid-state image pickup device in FIG. 1.

FIG. 58 is a diagram illustrating a usage example of a camera module using the CSP imager 1021.

The camera module can be used, for example, for various cases for sensing light, such as visible light, infrared light, ultraviolet light, or X rays, as described below.

- An apparatus that photographs an image to be used for appreciation, such as a digital camera or a portable device with a camera function
- An apparatus to be used for traffic, such as an automotive sensor for photographing ahead of, behind, around, inside a car, and the like, a monitoring camera for monitoring traveling vehicles and roads, and a distance sensor for measuring a distance between vehicles and the like, for safe driving such as automatic stop, recognition of driver's condition, and the like
- An apparatus to be used for electric appliances, such as a TV, a refrigerator, and an air conditioner to photograph user's gesture and operate the appliances according to the gesture
- An apparatus to be used for medical care and healthcare, such as an endoscope or an apparatus for angiography by receiving infrared light
- An apparatus to be used for security, such as a monitoring camera for crime prevention applications, or a camera for person authentication applications
- An apparatus to be used for beauty, such as a skin measuring instrument for photographing skin, and a microscope for photographing a scalp
- An apparatus to be used for sports, such as a wearable camera or an action camera for sports applications, or the like
- An apparatus to be used for agriculture, such as a camera for monitoring conditions of fields and crops Note that, the present disclosure can also be configured as described below.

<1>

An image pickup device including:

a solid-state image pickup element that captures an image; and a mounting substrate on which the solid-state image pickup element is mounted, in which the solid-state image pickup element is mounted on the mounting substrate with a connection portion having a configuration that does not use a solder ball.

<2>

The image pickup device according to <1>, in which the connection portion is a conductive pad, and the conductive pad is provided on one or both of a bonding surface of the solid-state image pickup element to be bonded with the mounting substrate and a bonding surface of the mounting substrate to be bonded with the solid-state image pickup element.

<3>

The image pickup device according to <1> or <2>, in which the conductive pad is heated and melted in a state of being provided on one or both of a bonding surface of the solid-state image pickup element to be bonded with the mounting substrate and a bonding surface of the mounting substrate to be bonded with the solid-state image pickup element, and then cooled to bond the solid-state image pickup element and the mounting substrate together.

<4>

The image pickup device according to <3>, in which the conductive pad is one in which a single material film of any of Sn, Ag, Au, Sb, Cu, and Pb is formed in a plurality of layers, or one in which an alloy of at least two of the Sn, Ag, Au, Sb, Cu, and Pb is used.

<5>

The image pickup device according to <4>, in which the conductive pad is formed by a sputtering method, a vapor deposition method, or a plating method.

<6>

The image pickup device according to <4>, in which the conductive pad dissipates heat generated from the solid-state image pickup element and the mounting substrate depending on a bonding area of the bonding surfaces.

<7>

The image pickup device according to any of <1> to <6>, in which the connection portion is a junction of a metal bump, and the metal bump is provided on one or both of a bonding surface of the solid-state image pickup element to be bonded with the mounting substrate and a bonding surface of the mounting substrate to be bonded with the solid-state image pickup element.

<8>

The image pickup device according to <7>, in which the metal bump is crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

<9>

The image pickup device according to <7>, in which the metal bump is a single metal material of any of Au, Al, Cu, and Ag, or an alloy of at least two of the Au, Al, Cu, and Ag.

<10>

The image pickup device according to any of <1> to <9>, in which the connection portion is a junction of a conductive resin, and the conductive resin is provided on one or both of a bonding surface of the solid-state image pickup element to be bonded with the mounting substrate and a bonding surface of the mounting substrate to be bonded with the solid-state image pickup element.

<11>

The image pickup device according to <10>, in which the conductive resin is crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

<12>

The image pickup device according to <11>, in which the conductive resin is a mixture of a metal responsible for conductivity and a resin responsible for fixing.

<13>

The image pickup device according to <12>, in which the metal responsible for conductivity is Ag, and the resin responsible for fixing is an epoxy resin.

<14>

The image pickup device according to any of <1> to <13>, in which the connection portion is a junction of an anisotropic conductive member, and the anisotropic conductive member is provided on one or both of a bonding surface of the solid-state image pickup element to be bonded with the mounting substrate and a bonding surface of the mounting substrate to be bonded with the solid-state image pickup element.

<15>

The image pickup device according to <14>, in which the anisotropic conductive member is crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

<16>

The image pickup device according to <14>, in which the anisotropic conductive member is an anisotropic conductive film, or an anisotropic conductive paste.

<17>

The image pickup device according to <14>, in which the anisotropic conductive member includes a mixture of a conductive particle responsible for conductivity and an adhesive responsible for fixing.

<18>

The image pickup device according to <17>, in which the conductive particle is a metal core including Ni simple substance and gold-plated Ni, or a gold-plated resin core including styrene, acrylic, and titanium oxide, and the adhesive is a synthetic rubber, a thermoreversible resin, or a thermosetting resin including an epoxy resin.

<19>

The image pickup device according to any of <1> to <18>, in which the connection portion is a wire bonding junction.

<20>

The image pickup device according to <19>, in which a wire bonding material in the wire bonding junction is a single metal material of any of Au, Al, Cu, and Ag, or an alloy of the Au, Al, Cu, or Ag.

<21>

The image pickup device according to <19>, in which a part of the mounting substrate is a transparent substrate, and in a state in which a light receiving surface of the solid-state image pickup element is in contact with the transparent substrate, the solid-state image pickup element is mounted on the mounting substrate with the connection portion including the wire bonding junction.

<22>

The image pickup device according to <19>, in which
a surface facing a light receiving direction of the mounting substrate and a light receiving surface of the solid-state image pickup element are flat, and
the solid-state image pickup element is mounted on the mounting substrate with the connection portion including the wire bonding junction.

<23>

The image pickup device according to any of <1> to <22>, in which
the solid-state image pickup element is a CSP imager.

<24>

A solid-state image pickup element
that is mounted on a mounting substrate with a connection portion having a configuration that does not use a solder ball.

<25>

A semiconductor device
that is mounted on a mounting substrate with a connection portion having a configuration that does not use a solder ball.

<26>

An electronic apparatus including:
a solid-state image pickup element that captures an image; and
a mounting substrate on which the solid-state image pickup element is mounted, in which
the solid-state image pickup element is mounted on the mounting substrate with a connection portion having a configuration that does not use a solder ball.

REFERENCE SIGNS LIST

1 Solid-state image pickup device
11 First structural body (upper structural body)
12 Lower structure (lower structural body)
13 Layered structural body
14 External terminal (signal input/output terminal)
15 Color filter
16 On-chip lens
17 Glass seal resin
18 Protective substrate
21 Input/output unit
22 Row drive unit
24 Pixel array unit
25 Column signal processing unit
26 Image signal processing unit
31 Pixel
41 Input terminal
42 Input circuit unit
47 Output circuit unit
48 Output terminal
49 Input/output circuit unit
51 Photodiode
81 Semiconductor substrate
88 Through-electrode via
90 Rewiring line
101 Semiconductor substrate
105 Through-chip-electrode
106 Connection wiring line
109 Through-silicon-electrode
311 Input/output circuit region
312 Signal processing circuit region
313 Pixel peripheral circuit region
314 Upper and lower substrates connection region
321 I/O circuit
511 Third structural body
351 Memory substrate
352 Memory circuit
400 Image pickup device
402 Solid-state image pickup device
531 Area signal processing unit
533 Data holding unit
1021 CSP imager
1022, 1022-1 to 1022-4, 1022-11 to 1022-14, 1023 Mounting substrate
1141, 1141-1 to 1141-4, 1141-11 to 1141-14 Conductive pad
1151 Metal bump
1171 Conductive resin
1181 Anisotropic conductive member
1191, 1191-1 to 1191-4, 1191-11 to 1191-14 Metal bump
1231 Transparent substrate
1232, 1232-1 to 1232-4, 1232-11 to 1232-14 Wire bonding

The invention claimed is:

1. An image pickup device, comprising:
a solid-state image pickup element that captures an image; and
a mounting substrate on which the solid-state image pickup element is mounted,
wherein the solid-state image pickup element is mounted on the mounting substrate with a connection portion having a configuration that does not use a solder ball,
wherein part of the mounting substrate is a transparent substrate,
wherein in a light receiving direction of the image pickup device, a bottom surface of the transparent substrate is adhered to an entire top light receiving surface of the solid-state image pickup element and
wherein the connection portion is provided outside a region where the bottom surface of the transparent substrate adheres to the entire top light receiving surface of the solid-state image pickup element.

2. The image pickup device according to claim 1, wherein the connection portion is a wire bonding junction.

3. The image pickup device according to claim 2, wherein the solid-state image pickup element is mounted on the mounting substrate with the connection portion including the wire bonding junction.

4. The image pickup device according to claim 2, wherein a wire bonding material in the wire bonding junction is a single metal material of any of Au, Al, Cu, and Ag, or an alloy of the Au, Al, Cu, or Ag.

5. The image pickup device according to claim 1, wherein the solid-state image pickup element is a CSP imager.

6. The image pickup device according to claim 1, wherein the connection portion includes a first plurality of conductive pads on a bonding surface of the image pick-up element and a second plurality of conductive pads on a bonding surface of the mounting substrate.

7. The image pickup device according to claim 6, wherein an electrical connection is made between the first plurality of conductive pads and the second plurality of conductive pads without the first plurality of conductive pads and the second plurality of conductive pads facing each other.

8. The image pickup device according to claim 6, wherein the first and second plurality of conductive pads include a single material film of any of Sn, Ag, Au, Sb, Cu, and Pb formed in a plurality of layers, or one in which an alloy of at least two of the Sn, Ag, Au, Sb, Cu, and Pb is used.

9. The image pickup device according to claim 6, wherein each conductive pad in the first plurality of conductive pads is bonded to a corresponding conductive pad in the second plurality of conductive pads via a wiring bonding junction.

10. An image pickup device, comprising:
a solid-state image pickup element that captures an image;
a mounting substrate on which the solid-state image pickup element is mounted;
a conductive pad mounted on the solid-state image pickup element; and
a conductive pad mounted on the mounting substrate,
wherein the conductive pad mounted on the solid-state image pickup element and the conductive pad mounted on the mounting substrate face each other,
wherein the solid-state image pickup element is mounted on the mounting substrate with a connection portion having a configuration that does not use a solder ball,
wherein the connection portion is a junction of an anisotropic conductive member including a conductive particle and an adhesive, and
wherein the conductive particle is a metal core including Ni simple substance and gold-plated Ni, or a gold-plated resin core including styrene, acrylic, and titanium oxide, and the adhesive is a thermoreversible resin.

11. The image pickup device according to claim 10, wherein the anisotropic conductive member is crimped in a state of being provided on one or both of a bonding surface of the solid-state image pickup element to be bonded with the mounting substrate and a bonding surface of the mounting substrate to be bonded with the solid-state image pickup element, to bond the solid-state image pickup element and the mounting substrate together.

12. The image pickup device according to claim 10, wherein the anisotropic conductive member is an anisotropic conductive film, or an anisotropic conductive paste.

13. The image pickup device according to claim 10, wherein a mixture of the conductive particle and the adhesive is responsible for conductivity and fixing.

14. The image pickup device according to claim 10, wherein the anisotropic conductive member is provided on one or both of a bonding surface of the solid-state image pickup element to be bonded with the mounting substrate and a bonding surface of the mounting substrate to be bonded with the solid-state image pickup element.

15. An image pickup device, comprising:
a solid-state image pickup element that captures an image; and
a mounting substrate on which the solid-state image pickup element is mounted,
wherein the solid-state image pickup element is mounted between first and second portions of the mounting substrate in a horizontal direction, with a connection portion having a configuration that does not use a solder ball,
wherein the connection portion is a wire bonding junction, and
wherein surfaces facing a light receiving direction of the first and second portions of the mounting substrate and a light receiving surface of the solid-state image pickup element are provided flush with each other, and the solid-state image pickup element is mounted on the mounting substrate with the connection portion including the wire bonding junction.

16. The image pickup device according to claim 15, wherein a wire bonding material in the wire bonding junction is a single metal material of any of Au, Al, Cu, and Ag, or an alloy of the Au, Al, Cu, or Ag.

17. The image pickup device according to claim 15, wherein the solid-state image pickup element is a CSP imager.

18. The image pickup device according to claim 15, further comprising a first plurality of conductive pads on a bonding surface of the image pickup element and a second plurality of conductive pads on a bonding surface of the mounting substrate, wherein each conductive pad in the first plurality of conductive pads is bonded to a corresponding conductive pad in the second plurality of conductive pads via the wiring bonding junction.

19. The image pickup device according to claim 18, wherein an electrical connection is made between the first plurality of conductive pads and the second plurality of conductive pads without the first plurality of conductive pads and the second plurality of conductive pads facing each other.

20. The image pickup device according to claim 18, wherein the first and second plurality of conductive pads include a single material film of any of Sn, Ag, Au, Sb, Cu, and Pb formed in a plurality of layers, or one in which an alloy of at least two of the Sn, Ag, Au, Sb, Cu, and Pb is used.

* * * * *